US008254155B1

(12) United States Patent
Crisp et al.

(10) Patent No.: US 8,254,155 B1
(45) Date of Patent: Aug. 28, 2012

(54) STUB MINIMIZATION FOR MULTI-DIE WIREBOND ASSEMBLIES WITH ORTHOGONAL WINDOWS

(75) Inventors: Richard Dewitt Crisp, Hornitos, CA (US); Wael Zohni, San Jose, CA (US); Belgacem Haba, Saratoga, CA (US); Frank Lambrecht, Mountainview, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 13/354,747

(22) Filed: Jan. 20, 2012

Related U.S. Application Data

(60) Provisional application No. 61/542,488, filed on Oct. 3, 2011, provisional application No. 61/542,495, filed on Oct. 3, 2011, provisional application No. 61/542,553, filed on Oct. 3, 2011.

(51) Int. Cl.
*G11C 5/06* (2006.01)
*H01L 23/02* (2006.01)
(52) U.S. Cl. ............ 365/63; 365/51; 365/198; 365/191; 257/686; 257/713; 257/690
(58) Field of Classification Search .................. 365/51, 365/63, 198, 193, 191; 257/686, 685, 680, 257/713, 690
See application file for complete search history.

(56) References Cited

U.S. PATENT DOCUMENTS

| | | | |
|---|---|---|---|
| 3,670,208 | A | 6/1972 | Hovnanian et al. |
| 5,480,840 | A | 1/1996 | Barnes et al. |
| 5,929,517 | A | 7/1999 | Distefano et al. |
| 6,086,386 | A | 7/2000 | Fjelstad et al. |
| 6,130,116 | A | 10/2000 | Smith et al. |
| 6,197,665 | B1 | 3/2001 | DiStefano et al. |
| 6,255,899 | B1 | 7/2001 | Bertin et al. |
| 6,261,867 | B1 | 7/2001 | Robichaud et al. |
| 6,297,960 | B1 | 10/2001 | Moden et al. |
| 6,343,019 | B1 | 1/2002 | Jiang et al. |

(Continued)

FOREIGN PATENT DOCUMENTS

JP 2002-076252 A 3/2002

(Continued)

OTHER PUBLICATIONS

Kang, et al., 8Gb 3D DDR3 DRAM Using Through-Silicon-Via Technology, IEEE, International Solid-State Circuits Conference, 2009, Samsung Electronics, Hwasung, Korea.

(Continued)

*Primary Examiner* — Andrew Q Tran
(74) *Attorney, Agent, or Firm* — Lerner, David, Littenberg, Krumholz & Mentlik, LLP

(57) ABSTRACT

A microelectronic assembly can include first and second microelectronic packages mounted to opposed surfaces of a circuit panel. Each package can include a substrate having first, second, and third apertures extending therethrough, first, second, and third microelectronic elements each having a surface facing the first surface of the substrate and a plurality of contacts aligned with at least one of the apertures, a plurality of terminals exposed at the second surface in a central region thereof, and leads connected between the contacts of each microelectronic element and the terminals. The apertures of each substrate can have first, second, and third axes extending in directions of their lengths. The first and second axes can be parallel to one another. The third axis can be transverse to the first and second axes. The terminals of each package can be configured to carry all of the address signals transferred to the respective package.

30 Claims, 34 Drawing Sheets

U.S. PATENT DOCUMENTS

| | | |
|---|---|---|
| 6,376,769 B1 | 4/2002 | Chung |
| 6,384,473 B1 | 5/2002 | Peterson et al. |
| 6,462,423 B1 | 10/2002 | Akram et al. |
| 6,720,666 B2 | 4/2004 | Lim et al. |
| 6,742,098 B1 | 5/2004 | Halbert et al. |
| 6,765,288 B2 | 7/2004 | Damberg |
| 6,821,815 B2 | 11/2004 | Smith et al. |
| 6,943,057 B1 | 9/2005 | Shim et al. |
| 7,061,105 B2 | 6/2006 | Masuda et al. |
| 7,061,121 B2 | 6/2006 | Haba |
| 7,091,064 B2 | 8/2006 | Jiang |
| 7,138,709 B2 | 11/2006 | Kumamoto |
| 7,145,226 B2 | 12/2006 | Kumamoto |
| 7,272,888 B2 | 9/2007 | DiStefano |
| 7,368,319 B2 | 5/2008 | Ha et al. |
| 7,389,937 B2 | 6/2008 | Ito |
| 7,414,312 B2 * | 8/2008 | Nguyen et al. ................ 257/724 |
| 7,589,409 B2 | 9/2009 | Gibson et al. |
| 7,633,146 B2 | 12/2009 | Masuda et al. |
| 7,692,931 B2 | 4/2010 | Chong et al. |
| 7,989,940 B2 | 8/2011 | Haba et al. |
| RE42,972 E | 11/2011 | Nakamura et al. |
| 2002/0053727 A1 | 5/2002 | Kimura |
| 2003/0064547 A1 | 4/2003 | Akram et al. |
| 2004/0016999 A1 | 1/2004 | Misumi |
| 2004/0061577 A1 | 4/2004 | Breisch et al. |
| 2004/0184240 A1 | 9/2004 | Su |
| 2005/0116358 A1 | 6/2005 | Haba |
| 2006/0081983 A1 | 4/2006 | Humpston et al. |
| 2006/0290005 A1 | 12/2006 | Thomas et al. |
| 2007/0025131 A1 * | 2/2007 | Ruckerbauer et al. .......... 365/63 |
| 2007/0108592 A1 | 5/2007 | Lai et al. |
| 2007/0241441 A1 | 10/2007 | Choi et al. |
| 2008/0012110 A1 | 1/2008 | Chong et al. |
| 2008/0088033 A1 | 4/2008 | Humpston et al. |
| 2008/0185705 A1 | 8/2008 | Osborn et al. |
| 2009/0200680 A1 | 8/2009 | Shinohara et al. |
| 2009/0314538 A1 | 12/2009 | Jomaa et al. |
| 2010/0244272 A1 | 9/2010 | Lee et al. |
| 2010/0244278 A1 | 9/2010 | Shen |
| 2011/0193226 A1 | 8/2011 | Kirby et al. |
| 2012/0018863 A1 | 1/2012 | Oganesian et al. |
| 2012/0020026 A1 | 1/2012 | Oganesian et al. |

FOREIGN PATENT DOCUMENTS

| | | |
|---|---|---|
| JP | 2004-063767 A | 2/2004 |
| JP | 2008-198841 A | 8/2008 |
| JP | 3143893 U | 8/2008 |
| JP | 2010-098098 A | 4/2010 |
| KR | 2001-0002214 A | 1/2001 |
| KR | 2005-0119414 A | 12/2005 |
| KR | 2006-0120365 A | 11/2006 |
| KR | 2007-0088177 A | 8/2007 |
| KR | 2009-0008341 A | 1/2009 |
| KR | 2009-0086314 A | 8/2009 |
| TW | M338433 U | 8/2008 |

OTHER PUBLICATIONS

U.S. Appl. No. 13/306,300, filed Nov. 29, 2011.
U.S. Appl. No. 13/346,201, filed Jan. 9, 2012.
U.S. Appl. No. 13/080,876, filed Apr. 6, 2011.
U.S. Appl. No. 13/306,068, filed Nov. 29, 2011.
U.S. Appl. No. 13/346,185, filed Jan. 9, 2012.
U.S. Appl. No. 13/337,565, filed Dec. 27, 2011.
U.S. Appl. No. 13/440,313, filed Apr. 5, 2012.
U.S. Appl. No. 13/439,317, filed Apr. 5, 2012.
U.S. Appl. No. 13/440,212, filed Apr. 5, 2012.
U.S. Appl. No. 13/439,286, filed Apr. 5, 2012.
U.S. Appl. No. 13/354,772, filed Jan. 20, 2012.
Kang, et al., 8Gb 3D DDR3 DRAM Using Through-Silicon-Via Technology, IEEE, International Solid-State Circuits Conference, 2009, pp. 130-132.

* cited by examiner

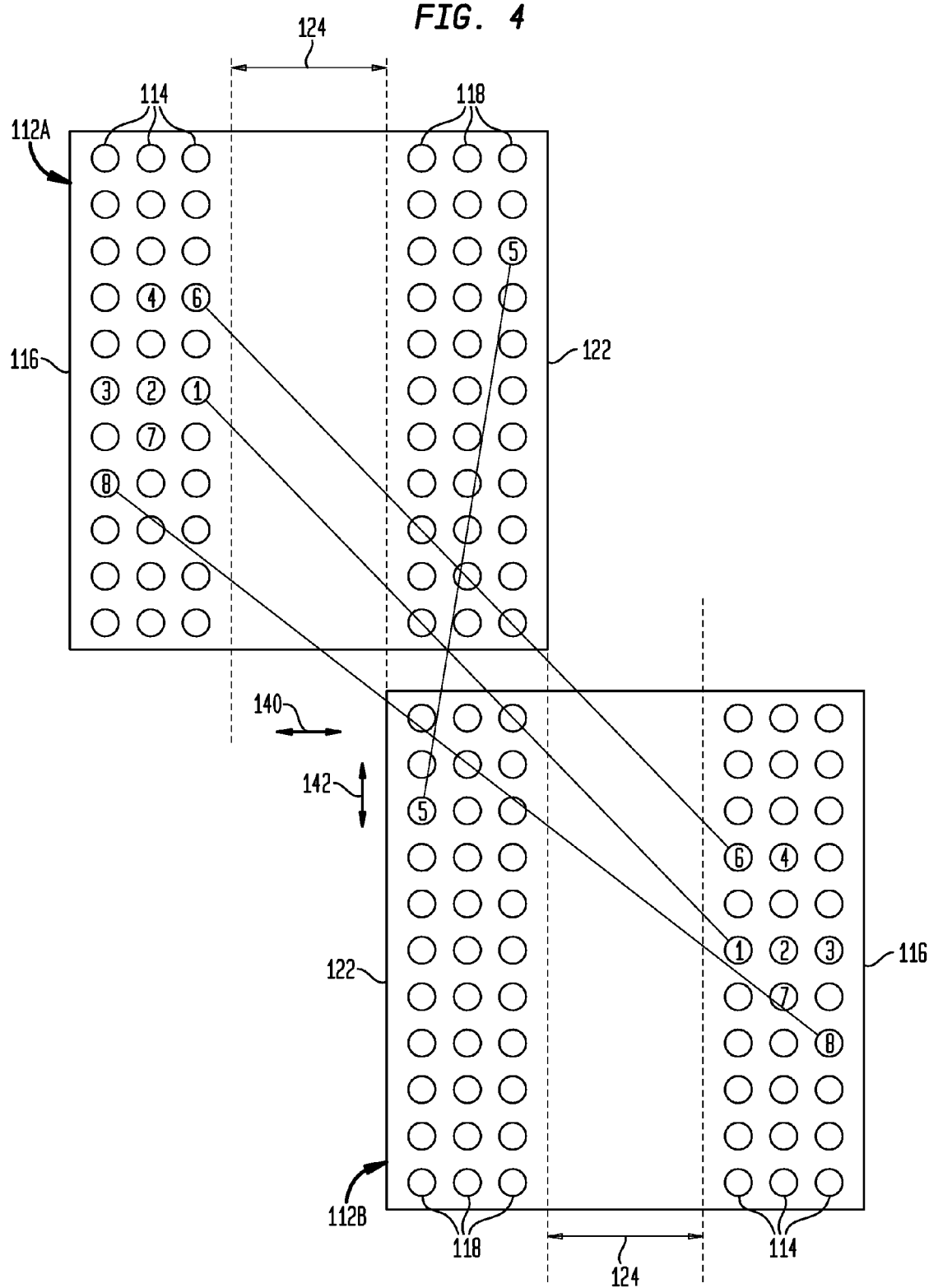

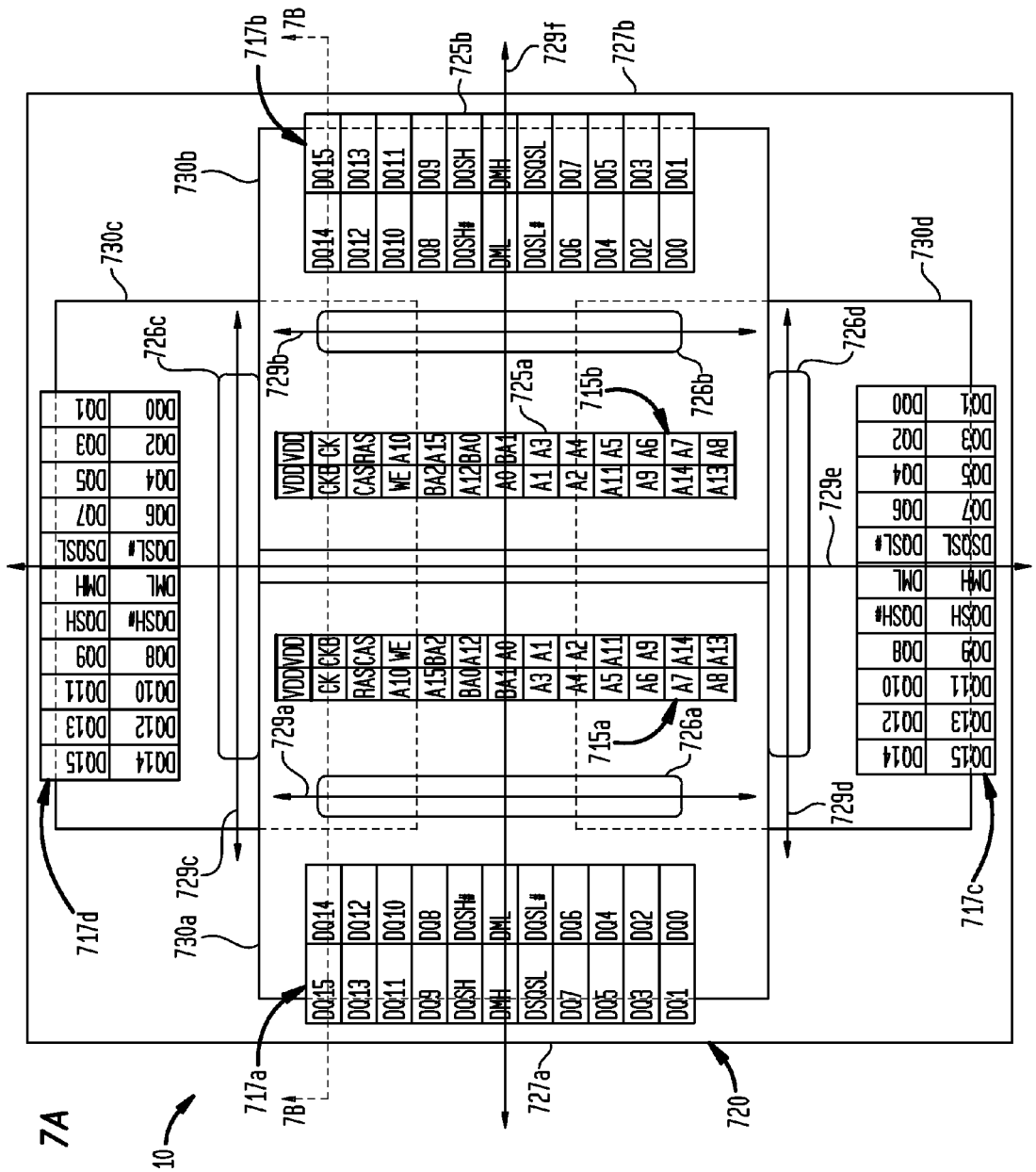

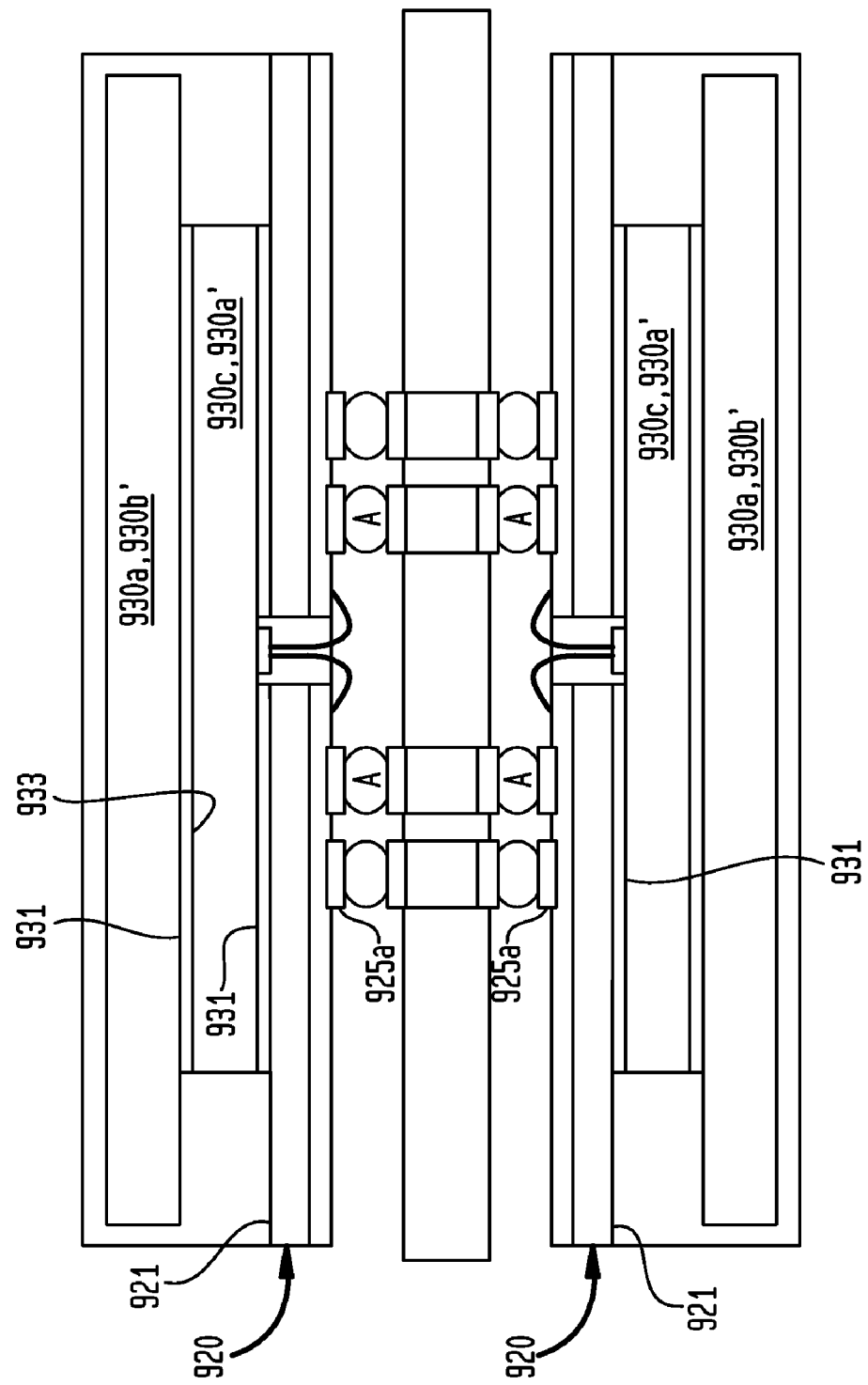

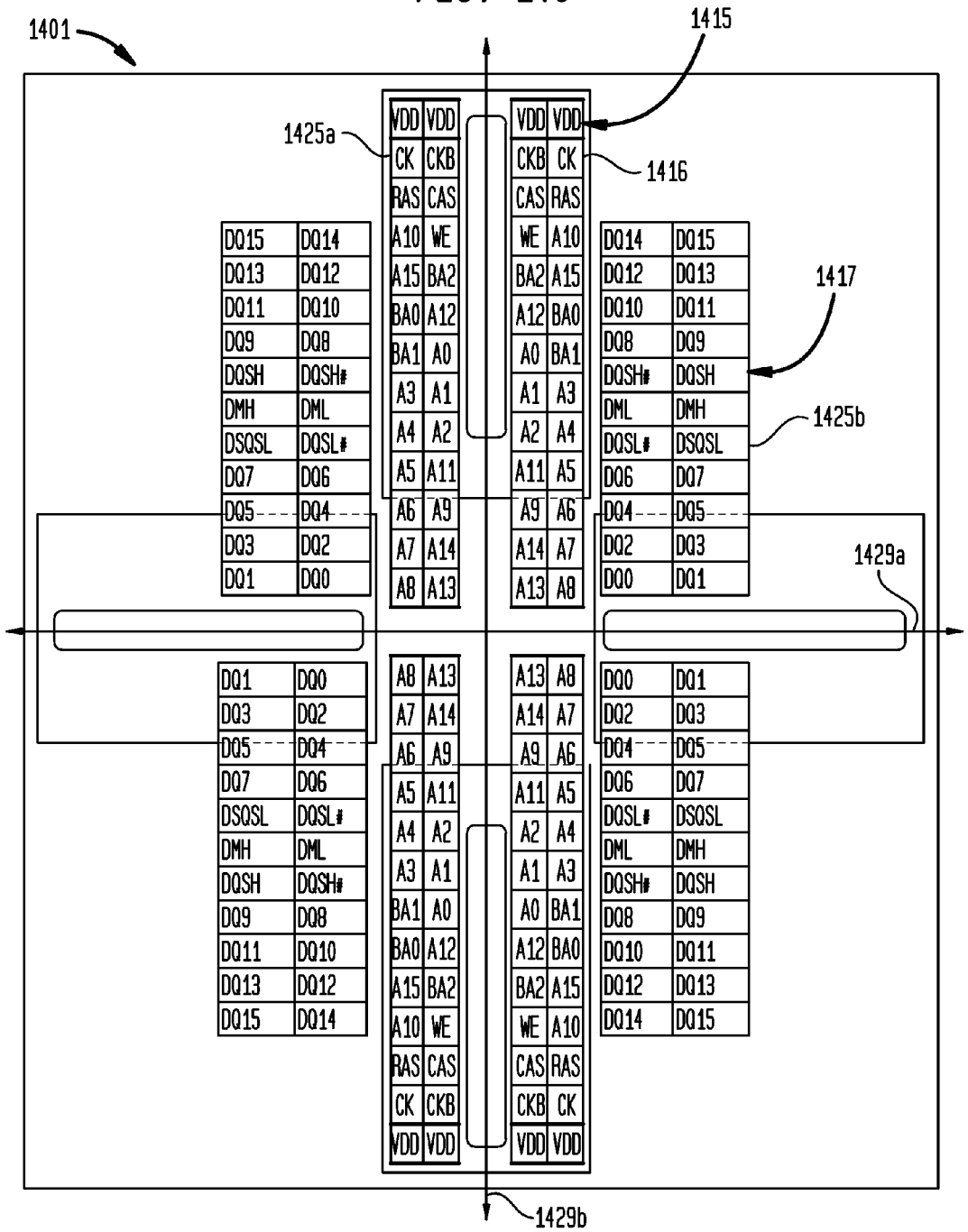

STUB MINIMIZATION FOR MULTI-DIE WIREBOND ASSEMBLIES WITH ORTHOGONAL WINDOWS

CROSS-REFERENCE TO RELATED APPLICATIONS

The present application claims the benefit of the filing date of U.S. Provisional Patent Application Nos. 61/542,488, 61/542,495, and 61/542,553, all filed Oct. 3, 2011, the disclosures of which are hereby incorporated herein by reference.

BACKGROUND OF THE INVENTION

The subject matter of the present application relates to microelectronic packages and assemblies incorporating microelectronic packages.

Semiconductor chips are commonly provided as individual, prepackaged units. A standard chip has a flat, rectangular body with a large front face having contacts connected to the internal circuitry of the chip. Each individual chip typically is contained in a package having external terminals connected to the contacts of the chip. In turn, the terminals, i.e., the external connection points of the package, are configured to electrically connect to a circuit panel, such as a printed circuit board. In many conventional designs, the chip package occupies an area of the circuit panel considerably larger than the area of the chip itself. As used in this disclosure with reference to a flat chip having a front face, the "area of the chip" should be understood as referring to the area of the front face.

In "flip chip" designs, the front face of the chip confronts the face of a package dielectric element, i.e., substrate of the package, and the contacts on the chip are bonded directly to contacts on the face of the substrate by solder bumps or other connecting elements. In turn, the substrate can be bonded to a circuit panel through the external terminals that overlie the substrate. The "flip chip" design provides a relatively compact arrangement; each package occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference. Certain innovative mounting techniques offer compactness approaching or equal to that of conventional flip-chip bonding. Packages that can accommodate a single chip in an area of the circuit panel equal to or slightly larger than the area of the chip itself are commonly referred to as "chip-scale packages."

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components that form the interconnections should not greatly increase the size of the assembly. Similar needs arise in other applications as, for example, in data servers such as those used in internet search engines where increased performance and size reduction are needed.

Semiconductor chips containing memory storage arrays, particularly dynamic random access memory chips (DRAMs) and flash memory chips, are commonly packaged in single-chip or multiple-chip packages and assemblies. Each package has many electrical connections for carrying signals, power, and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds that extend in both horizontal and vertical directions relative to the surface of the chip.

The transmission of signals within packages to chips of multi-chip packages poses particular challenges, especially for signals common to two or more chips in the package such as clock signals, and address and strobe signals for memory chips. Within such multi-chip packages, the lengths of the connection paths between the terminals of the package and the chips can vary. The different path lengths can cause the signals to take longer or shorter times to travel between the terminals and each chip. Travel time of a signal from one point to another is called "propagation delay" and is a function of the conductor length, the conductor's structure, and other dielectric or conductive structure in close proximity therewith.

Differences in the times at which two different signals reach a particular location can also be called "skew". The skew in the arrival times of a particular signal at two or more locations is a result of both propagation delay and the times at which the particular signal starts to travel towards the locations. Skew may or may not impact circuit performance. Skew often has little impact on performance when all signals in a synchronous group of signals are skewed together, in which case all signals needed for operation arrive together when needed. However, this is not the case when different signals of a group of synchronous signals needed for operation arrive at different times. In this case the skew impacts performance because the operation cannot be performed unless all needed signals have arrived. The embodiments described herein can include features that minimize skew that are disclosed in the copending U.S. Provisional Patent Application No. 61/506,889, the disclosure of which is incorporated by reference herein.

Conventional microelectronic packages can incorporate a microelectronic element that is configured to predominantly provide memory storage array function, i.e., a microelectronic element that embodies a greater number of active devices to provide memory storage array function than any other function. The microelectronic element may be or include a DRAM chip, or a stacked electrically interconnected assembly of such semiconductor chips. Typically, all of the terminals of such package are placed in sets of columns adjacent to one or more peripheral edges of a package substrate to which the microelectronic element is mounted.

For example, in one conventional microelectronic package 112 seen in FIG. 1, three columns 114 of terminals can be disposed adjacent a first peripheral edge 116 of the package substrate 120 and three other columns 118 of terminals can be disposed adjacent a second peripheral edge 122 of the package substrate 120. A central region 124 of the package substrate 120 in the conventional package does not have any columns of terminals. FIG. 1 further shows a semiconductor chip 111 within the package having element contacts 126 on a face 128 thereof that are electrically interconnected with the columns 114, 118 of terminals of the package 112 with wire bonds 130 extending through an aperture, e.g., bond window, in the central region 124 of the package substrate 120. In some cases, an adhesive layer 132 may be disposed between the face 128 of the microelectronic element 111 and the substrate 120 to reinforce the mechanical connection between the microelectronic element and the substrate, with the wire bonds 130 extending through an opening in the adhesive layer.

In light of the foregoing, certain improvements in the positioning of terminals on microelectronic packages can be made in order to improve electrical performance, particularly in assemblies that include such packages and a circuit panel to which such packages can be mounted and electrically interconnected with one another.

BRIEF SUMMARY OF THE INVENTION

In accordance with an aspect of the invention, a microelectronic assembly can include first and second microelectronic packages and a circuit panel having first and second opposed surfaces and panel contacts exposed at each of the first and second opposed surfaces. Each of the first and second microelectronic packages can include a substrate having first and second opposed surfaces and first, second, and third apertures extending between the first and second surfaces, first, second, and third microelectronic elements each having a surface facing the first surface of the substrate and a plurality of contacts at the surface of the respective microelectronic element aligned with at least one of the apertures, a plurality of terminals exposed at the second surface in a central region thereof, and leads electrically connected between the contacts of each microelectronic element and the terminals.

The apertures can have first, second, and third axes extending in directions of the lengths of the respective apertures. The first and second axes can be parallel to one another. The third axis can be transverse to the first and second axes. The central region of the second surface of each substrate can be disposed between the first and second axes of the respective substrate. Each microelectronic element can embody a greater number of active devices to provide memory storage array function than any other function. The terminals can be configured for connecting the microelectronic package to at least one component external to the microelectronic package. Each lead can have a portion aligned with at least one of the apertures. The terminals can be configured to carry sufficient address information usable by circuitry within the microelectronic package to determine an addressable memory location from among all the available addressable memory locations of a memory storage array within at least one of the first, second or third microelectronic elements. At least some of the terminals of the first and second microelectronic packages can be mounted to the panel contacts of the respective first and second surfaces and can be electrically connected therethrough.

In one example, the terminals of each microelectronic package can be configured to carry all of the address information usable by the circuitry within the respective microelectronic package to determine the addressable memory location. In a particular embodiment, the terminals of each microelectronic package can be configured to carry all of the command signals transferred to the respective microelectronic package, the command signals being write enable, row address strobe, and column address strobe signals. In one embodiment, the terminals of each microelectronic package can be configured to carry all of the clock signals transferred to the respective microelectronic package, the clock signals being sampling clocks used for sampling the address signals. In an exemplary embodiment, the terminals of each microelectronic package can be configured to carry all of the bank address signals transferred to the respective microelectronic package. In a particular example, the circuit panel can include a bus having a plurality of parallel conductors configured to carry all of the address signals transferred to each of the microelectronic packages. The parallel conductors can extend in a first direction parallel to the first and second surfaces.

In one example, the terminals of each microelectronic package can be first terminals and the second surface of each microelectronic package can have peripheral regions between the central region and first and second opposed edges extending between the first and second surfaces of the respective substrate. Each microelectronic package can also include a plurality of second terminals exposed at the second surface thereof in at least one of the peripheral regions. The second terminals can be configured for connecting the respective microelectronic package to at least one external component. At least some of the second terminals can be configured to carry signals other than the address signals. In a particular example, at least some of the leads can include wire bonds extending through at least one of the apertures. In one embodiment, all of the leads can be wire bonds extending through at least one of the apertures. In an exemplary embodiment, at least some of the leads can include lead bonds.

In a particular embodiment, the surfaces of the first and second microelectronic elements of each microelectronic package can be arranged in a single plane parallel to the first surface of the respective substrate, and the surface of the third microelectronic element of each microelectronic package at least partially overlies a rear surface of at least one of the first and second microelectronic elements of the respective microelectronic package. In one example, the surfaces of all of the microelectronic elements of each microelectronic package can be arranged in a single plane parallel to the first surface of the respective substrate. In an exemplary embodiment, each of the microelectronic elements can include a dynamic random access memory ("DRAM") integrated circuit chip. In a particular example, each of the microelectronic elements can be functionally and mechanically equivalent to the other ones of the microelectronic elements.

In an exemplary embodiment, the substrate of each microelectronic package can have a fourth aperture having a fourth axis transverse to the first and second axes of the respective microelectronic package and extending in a direction of the length of the fourth aperture. Each microelectronic package can also include a fourth microelectronic element having a surface facing the first surface of the respective substrate. The fourth microelectronic element can embody a greater number of active devices to provide memory storage array function than any other function. The fourth microelectronic element can have a plurality of contacts at the surface thereof aligned with at least one of the apertures of the respective substrate. Each microelectronic package can also include second leads electrically connected between the contacts of the respective fourth microelectronic element and the respective terminals. Each of the second leads can have a portion aligned with at least one of the apertures.

In one embodiment, the terminals of the first and second microelectronic packages can be arranged at positions of first and second grids. The first and second grids can be aligned with one another in x and y orthogonal directions parallel to the first and second circuit panel surfaces. The alignment can be within a distance equal to a minimum pitch between adjacent terminals of the grids. In a particular example, the grids can be aligned with one another in the x and y orthogonal directions such that the terminals of the grids are coincident with one another in the x and y directions. In one example, the terminals of each grid may be arranged in no more than four columns. In one embodiment, the terminals of each grid may be arranged in no more than two columns. In an exemplary embodiment, the grids of the first and second packages can be functionally and mechanically matched. In a particular example, the grids of the first and second packages can overlie at least 90% of one another.

In a particular example, the terminals of each of the first and second microelectronic packages can be arranged at positions of first and second grids. The first grid of the first package and the second grid of the second package can be aligned with one another. The second grid of the first package and the first grid of the second package can be aligned with one another. The alignments can be in x and y orthogonal directions parallel to the first and second circuit panel surfaces. The alignments can be within a distance equal to a minimum pitch between adjacent terminals of the grids. In one embodiment, stub lengths of the electrical connections through the circuit panel between one of the terminals of the first microelectronic package and a corresponding one of the terminals of the second microelectronic package connected thereto can be less than seven times a minimum pitch of the terminals of the first microelectronic package. In an exemplary embodiment, at least some of the electrical connections through the circuit panel between the terminals of the first and second microelectronic packages can have an electrical length of approximately a thickness of the circuit panel.

In a particular example, the panel contacts can include first panel contacts arranged in first and second linearly extending columns exposed at a first surface of the circuit panel. The first panel contacts can be joined to the terminals of the first microelectronic package. The panel contacts can also include second panel contacts arranged in first and second linearly extending columns exposed at a second surface of the circuit panel. The second panel contacts can be joined to the terminals of the second microelectronic package. The first column of the first panel contacts can be aligned with the second column of the second panel contacts in x and y orthogonal directions parallel to the first and second circuit panel surfaces. The second column of the first panel contacts can be aligned with the first column of the second panel contacts in the x and y orthogonal directions. Each contact in the first column of the first panel contacts can be coupled to a corresponding contact of the first column of the second panel contacts. Each contact in the second column of the first panel contacts can be coupled to a corresponding contact in the second column of the second panel contacts.

In one embodiment, the terminals of each microelectronic package can be arranged in a single column, and the circuit panel may include no more than one routing layer for global routing of all of the address signals. In a particular example, the terminals of each microelectronic package can be arranged in two parallel columns, and the circuit panel may include no more than two routing layers for global routing of all of the address signals. In an exemplary embodiment, each microelectronic package can include a buffer element electrically connected to at least some of the respective terminals and one or more of the microelectronic elements in the respective microelectronic package. Each buffer element can be configured to regenerate at least one signal received at one or more of the terminals of the respective microelectronic package. In one example, a module can include a plurality of microelectronic assemblies as described above. Each microelectronic assembly can be electrically coupled to a second circuit panel for transport of signals to and from each of the microelectronic assemblies.

Further aspects of the invention can provide systems that incorporate microelectronic assemblies according to the foregoing aspects of the invention, composite chips according to the foregoing aspects of the invention, or both in conjunction with other electronic components electrically connected thereto. For example, the system can be disposed in and/or mounted to a single housing, which can be a portable housing. Systems according to preferred embodiments in this aspect of the invention can be more compact than comparable conventional systems.

In accordance with another aspect of the invention, a microelectronic assembly can include first and second microelectronic packages and a circuit panel having first and second opposed surfaces and panel contacts exposed at each of the first and second opposed surfaces. Each of the first and second microelectronic packages can include a substrate having first and second opposed surfaces and first, second, and third apertures extending between the first and second surfaces, first, second, and third microelectronic elements each having a surface facing the first surface of the substrate and a plurality of contacts at the surface of the respective microelectronic element aligned with at least one of the apertures, a plurality of terminals exposed at the second surface in a central region thereof, and leads electrically connected between the contacts of each microelectronic element and the terminals.

The apertures can have first, second, and third axes extending in directions of the lengths of the respective apertures. The first and second axes can be parallel to one another. The third axis can be transverse to the first and second axes. The central region of the second surface of each substrate can be disposed between the first and second axes of the respective substrate. Each microelectronic element can embody a greater number of active devices to provide memory storage array function than any other function. The terminals can be configured for connecting the microelectronic package to at least one component external to the microelectronic package. Each lead can have a portion aligned with at least one of the apertures. The terminals can be configured to carry a majority of the address information usable by circuitry within the microelectronic package to determine an addressable memory location from among all the available addressable memory locations of a memory storage array within at least one of the first, second or third microelectronic elements. At least some of the terminals of the first and second microelectronic packages can be mounted to the panel contacts of the respective first and second surfaces and can be electrically connected therethrough. In one example, the terminals of each microelectronic package can be configured to carry at least three-quarters of the address information usable by the circuitry within the respective microelectronic package to determine the addressable memory location.

In accordance with another aspect of the invention, a microelectronic assembly can include first and second microelectronic packages and a circuit panel having first and second opposed surfaces and panel contacts exposed at each of the first and second opposed surfaces. Each of the first and second microelectronic packages can include a substrate having first and second opposed surfaces and first, second, and third apertures extending between the first and second surfaces, first, second, and third microelectronic elements each having a surface facing the first surface of the substrate and a plurality of contacts at the surface of the respective microelectronic element aligned with at least one of the apertures, a plurality of terminals exposed at the second surface in a central region thereof, and leads electrically connected between the contacts of each microelectronic element and the terminals.

Each substrate can define a first axis extending in a direction of the lengths of the first and second apertures of the respective substrate. The third aperture of each substrate can have a second axis transverse to the respective first axis and extending in a direction of the length of the third aperture. The central region of the second surface of each substrate can be disposed between first and second parallel lines disposed at adjacent ends of the respective first and second apertures. Each microelectronic element can embody a greater number of active devices to provide memory storage array function than any other function. The terminals of each microelectronic package can be configured for connecting the respective microelectronic package to at least one component external to the microelectronic package. Each lead can have a portion aligned with at least one of the apertures of the respective substrate. The terminals can be configured to carry sufficient address information usable by circuitry within the microelectronic package to determine an addressable memory location from among all the available addressable memory locations of a memory storage array within at least one of the first, second or third microelectronic elements. At least some of the terminals of the first and second microelectronic packages can be mounted to the panel contacts of the respective first and second surfaces and can be electrically connected therethrough.

In accordance with yet another aspect of the invention, a microelectronic assembly can include first and second microelectronic packages and a circuit panel having first and second opposed surfaces and panel contacts exposed at each of the first and second opposed surfaces. Each of the first and second microelectronic packages can include a substrate having first and second opposed surfaces and first and second apertures extending between the first and second surfaces, first and second microelectronic elements each having a surface facing the first surface of the substrate and a plurality of contacts at the surface of the respective microelectronic element aligned with at least one of the apertures, a plurality of terminals exposed at the second surface in a central region thereof, and leads electrically connected between the contacts of each microelectronic element and the terminals.

The apertures of each substrate can have first and second respective transverse axes extending in directions of the lengths of the respective apertures. The central region of the second surface of each substrate can be disposed adjacent the first aperture of the respective substrate. Each microelectronic element can embody a greater number of active devices to provide memory storage array function than any other function. The terminals of each microelectronic package can be configured for connecting the respective microelectronic package to at least one component external to the microelectronic package. The terminals of each microelectronic package can be arranged in first and second parallel grids each configured to carry all of the same signals. The positions of corresponding ones of the terminals in the first and second grids of each microelectronic package can be mirrored about an intermediate axis located between the first and second grids. The first aperture of the substrate of each microelectronic package can be at least partially disposed between the first and second grids of the respective microelectronic package. Each lead can have a portion aligned with at least one of the apertures of the substrate of the respective microelectronic package. The terminals of each microelectronic package can be configured to carry all of the address signals transferred to the respective microelectronic package. At least some of the terminals of the first and second microelectronic packages can be mounted to the panel contacts of the respective first and second surfaces and can be electrically connected therethrough.

In accordance with still another aspect of the invention, a microelectronic assembly can include first and second microelectronic packages and a circuit panel having first and second opposed surfaces and panel contacts exposed at each of the first and second opposed surfaces. Each of the first and second microelectronic packages can include a substrate having first and second opposed surfaces and first and second apertures extending between the first and second surfaces, first and second microelectronic elements each having a surface facing the first surface of the substrate and a plurality of contacts at the surface of the respective microelectronic element aligned with at least one of the apertures, a plurality of terminals exposed at the second surface in a central region thereof, and leads electrically connected between the contacts of each microelectronic element and the terminals.

The first aperture of the substrate of each microelectronic package can have an axis extending in a first direction of a length of the first aperture. The second aperture of the substrate of each microelectronic package can have a length extending in a second direction transverse to the first direction, the second aperture having an end adjacent to the first aperture of the respective substrate. The central region of the second surface of each substrate can be disposed between the axis of the respective substrate and a line parallel to the axis which is tangent to the end of the second aperture. Each microelectronic element can embody a greater number of active devices to provide memory storage array function than any other function. The terminals of each microelectronic package can be configured for connecting the respective microelectronic package to at least one component external to the microelectronic package. Each lead can have a portion aligned with at least one of the apertures of the respective substrate. The terminals of each microelectronic package can be configured to carry all of the address signals transferred to the respective microelectronic package. At least some of the terminals of the first and second microelectronic packages can be mounted to the panel contacts of the respective first and second surfaces and can be electrically connected therethrough.

BRIEF DESCRIPTION OF THE DRAWINGS

FIG. 4 diagrammatic bottom plan view of the electrical connections between terminals of the microelectronic packages of FIG. 3.

FIG. 7A is a diagrammatic bottom plan view of a microelectronic package according to yet another embodiment having two grids of first terminals, each grid arranged in two columns.

FIG. 9C is a possible side sectional view of a microelectronic assembly as shown in FIG. 9A or 9B, taken along the line 9C-9C of FIG. 9A or 9B.

FIG. 14C is a variation of the microelectronic package of FIG. 14B having four grids of first terminals, each grid arranged in two columns.

DETAILED DESCRIPTION

Figure 1:
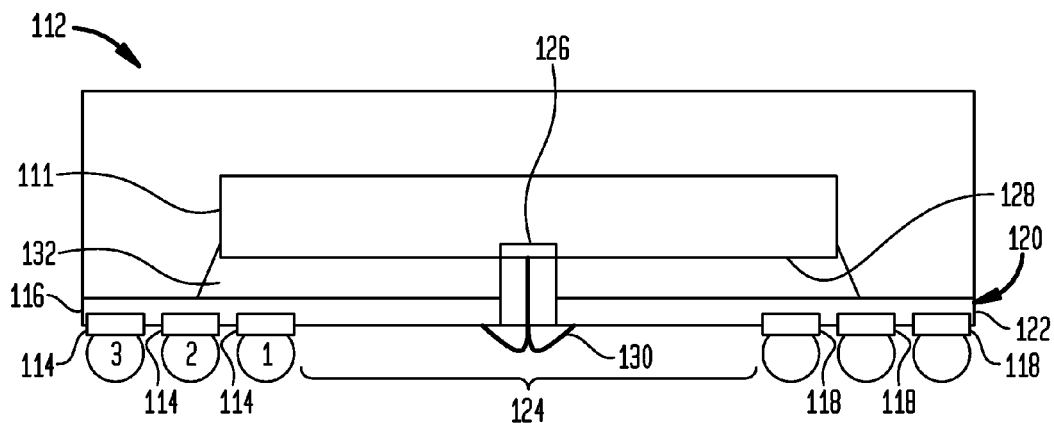
FIG. 1 is a side sectional view of a prior art microelectronic package.

In view of the illustrative conventional microelectronic package 112 described relative to FIG. 1, the inventors have recognized improvements which can be made that may help improve the electrical performance of a microelectronic package incorporating a memory storage array chip, and a microelectronic assembly that incorporates such microelectronic package.

Figure 2:
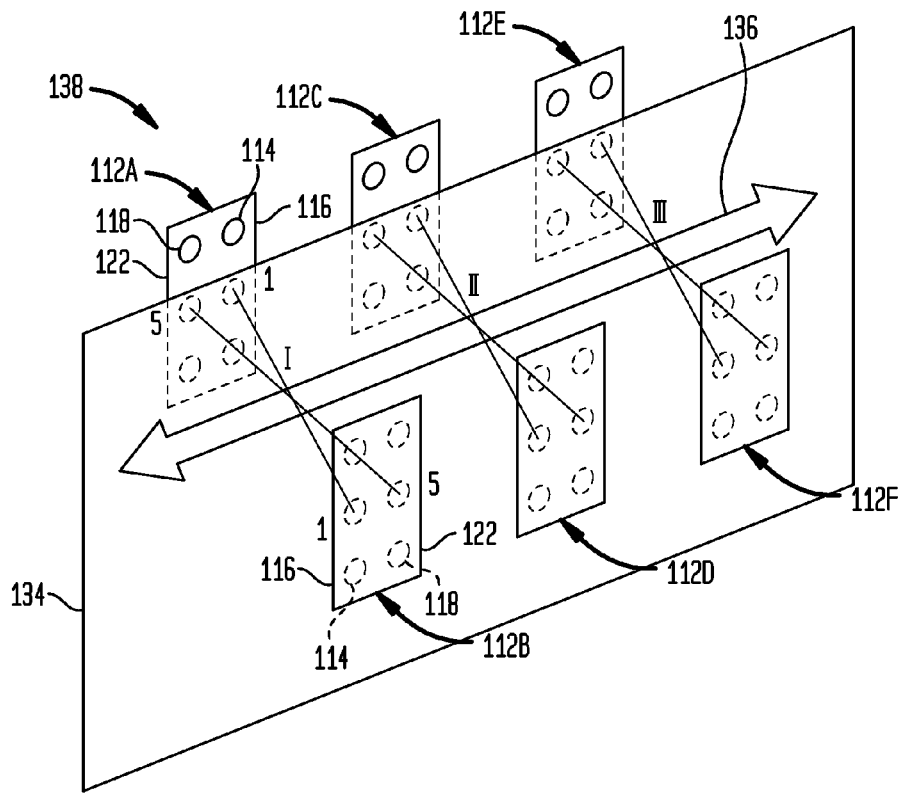
FIG. 2 is a diagrammatic perspective view of a microelectronic assembly showing electrical connections between terminals of the microelectronic packages.
Figure 3:
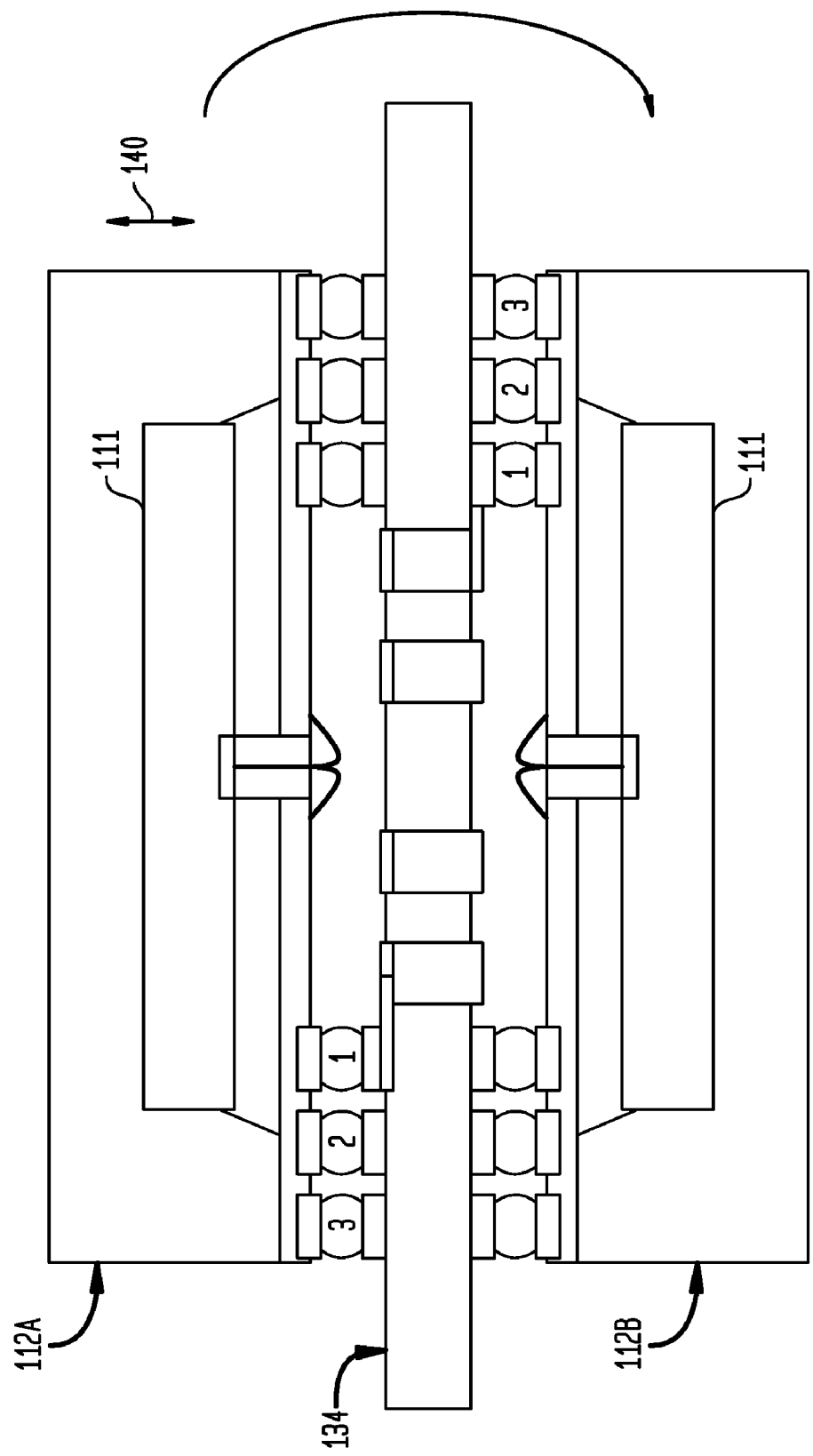
FIG. 3 is a side sectional view of the microelectronic assembly of FIG. 2.

Improvements can be made particularly for use of a microelectronic package when provided in an assembly such as shown in FIGS. 2-4, in which a package 112A is mounted to a surface of a circuit panel with another like package 112B mounted opposite thereto on an opposite surface of the circuit panel. The packages 112A, 112B typically are functionally and mechanically equivalent to one another. Other pairs 112C and 112D; and 112E and 112F, of functionally and mechanically equivalent packages typically are also mounted to the same circuit panel 134. The circuit panel and the packages assembled thereto may form a portion of an assembly commonly referred to as a dual in-line memory module ("DIMM"). The packages in each oppositely mounted pair of packages, e.g., packages 112A, 112B, connect to contacts on opposite surfaces of the circuit panel so that the packages in each pair overlie one another typically by more than 90% of their respective areas. Local wiring within the circuit panel 134 connects terminals, e.g., the terminals labeled "1" and "5" on each package to global wiring on the circuit panel. The global wiring includes the signal conductors of a bus 136 used to conduct some signals to connection sites on the circuit panel 134 such as sites I, II and III. For example, the packages 112A, 112B are electrically connected to the bus 136 by local wiring coupled to a connection site I, the packages 112C, 112D are electrically connected to the bus by local wiring coupled to connection site II, and the packages 112E, 112F are electrically connected to the bus by local wiring coupled to connection site III.

The circuit panel 134 electrically interconnects the terminals of the respective packages 112A, 112B using local interconnect wiring that appears similar to a crisscross or "shoelace" pattern in which a terminal labeled "1" near one edge 116 of package 112A connects through the circuit panel 134 to a terminal labeled "1" of package 112B near the same edge 116 of package 112B. However, the edge 116 of the package 112B as assembled to the circuit panel 134 is far from the edge 116 of the package 112A. FIGS. 2-4 further show that a terminal labeled "5" near an edge 122 of the package 112A is connected through the circuit panel 134 to a terminal labeled "5" of the package 112B near the same edge 122 of the package 112B. In the assembly 138, the edge 122 of the package 112A is far from the edge 122 of the package 112B.

Connections through the circuit panel between terminals on each package, e.g., the package 112A, to the corresponding terminals on the package mounted opposite thereto, i.e., the package 112B, are fairly long. As further seen in FIG. 3, in such assembly of like microelectronic packages 112A, 121B, the circuit panel 134 may electrically interconnect a signal conductor of the bus 136 with the terminal of the package 112A marked "1" and the corresponding terminal of the package 112B marked "1", when the same signal from the bus is to be transmitted to each package. Similarly, the circuit panel 134 may electrically interconnect another signal conductor of the bus 136 with the terminal of the package 112A marked "2" and the corresponding terminal of the package 112B marked "2". The same connection arrangement may also apply to other signal conductors of the bus and corresponding terminals of each package.

Local wiring between the bus 136 on the circuit panel 134 and each package of the respective pair of packages, e.g., the packages 112A, 112B (FIG. 2) at a connection site I of the board can be in form of unterminated stubs. Such local wiring, when relatively long, may in some cases impact the performance of the assembly 138 as discussed below. Moreover, the circuit panel 134 also requires local wiring to electrically interconnect certain terminals of other packages: the pair of packages 112C and 112D and the pair of packages 112E and 112F to the global wiring of the bus 136, and such wiring can also impact the performance of the assembly in the same way.

FIG. 4 further illustrates the interconnection between the microelectronic packages 112A, 112B of respective pairs of terminals assigned to carry signals "1", "2", "3", "4", "5", "6", "7", and "8". As seen in FIG. 4, because the columns 114, 118 of terminals are near the edges 116, 122, respectively, of each package 112A, 121B, the wiring needed to traverse the circuit panel 134 in a direction 140 transverse to the direction 142 in which the columns 114, 118 of terminals extend can be quite long. In recognition that the length of a DRAM chip can be in the range of ten millimeters on each side, the length of the local wiring in a circuit panel 134 in an assembly 138 seen in FIGS. 2-4 required to route the same signal to the corresponding terminals of two oppositely mounted packages 112A, 112B can range between five and ten millimeters and may typically be about seven millimeters.

In some cases, relatively long unterminated wiring on a circuit panel that connects the terminals of a package may not severely impact the electrical performance of the assembly 138. However, when a signal is transferred from a bus 136 of the circuit panel to each of multiple pairs of packages connected to the circuit panel as shown in FIG. 2, the inventors recognize that the electrical lengths of the stubs, i.e., the local wiring, that extend from the bus 136 to the terminal connected thereto on each package potentially impacts the performance of the assembly 138. Signal reflections on the unterminated stubs can travel in the reverse direction from the connected terminals of each package back onto the bus 136, and thus degrade the signals being transferred from the bus to the packages. The impacts may be tolerable for some packages containing microelectronic elements of current manufacture. However, in present or future assemblies that operate with increased signal switching frequencies, low voltage swing signals, or both, the inventors recognize that the impacts can become severe. For these assemblies, settling time, ringing, jitter, or intersymbol interference of a transmitted signal may increase to an unacceptable degree.

The inventors further recognize that the electrical lengths of the unterminated stubs are usually longer than the local wiring that connects the bus 136 on the circuit panel with the terminals of the packages mounted thereto. Unterminated wiring within each package from the package terminals to the semiconductor chip therein adds to the lengths of the stubs.

In a specific example, the bus 136 is a command-address bus of an assembly having a predominant memory storage array function such as a DIMM. The command-address bus 136 carries a set of command signals, address signals, bank address signals, and clock signals on the circuit panel to connection sites, e.g., sites I, II, and III shown in FIG. 2. These command-address bus signals can then be distributed by local wiring to respective sets of panel contacts on opposite surfaces of the circuit panel, to which packages 112A, 112B, 112C, 112D, 112E, and 112F are connected. The clock signals are sampling clock signals used for sampling the address signals. In a particular example, when the microelectronic element is or includes a DRAM chip, the command signals are write enable, row address strobe, and column address strobe.

Accordingly, certain embodiments of the invention described herein provide a microelectronic package configured so as to permit the lengths of stubs to be reduced when first and second such packages are mounted opposite one another on opposite surfaces of a circuit panel, e.g., a circuit board, module board or card, or flexible circuit panel. Assemblies that incorporate first and second microelectronic packages mounted opposite one another on a circuit panel can have significantly reduced stub lengths between the respective packages. Reducing the stub lengths within such assemblies can improve electrical performance, such as by reducing one or more of settling time, ringing, jitter, or intersymbol interference, among others. Moreover, it may be possible to obtain other benefits as well, such as simplifying the structure of the circuit panel or reducing the complexity and cost of designing or manufacturing the circuit panel, or for both designing and manufacturing the circuit panel.

Certain embodiments of the invention provide a package or microelectronic assembly in which a microelectronic element, e.g., a semiconductor chip, or stacked arrangement of semiconductor chips, is configured to predominantly provide a memory storage array function. In such microelectronic element, the number of active devices, e.g., transistors, therein that are configured, i.e., constructed and interconnected with other devices, to provide memory storage array function, is greater than the number of active devices that are configured to provide any other function. Thus, in one example, a microelectronic element such as a DRAM chip may have memory storage array function as its primary or sole function. Alternatively, in another example, such microelectronic element may have mixed use and may incorporate active devices configured to provide memory storage array function, and may also incorporate other active devices configured to provide another function such as processor function, or signal processor or graphics processor function, among others. In this case, the microelectronic element may still have a greater number of active devices configured to provide the memory storage array function than any other function of the microelectronic element.

In one embodiment, terminals of the package can include first terminals that are disposed at a central region of the second surface of a substrate or dielectric layer that faces away from the microelectronic assembly, the central region being disposed between peripheral regions adjacent to first and second peripheral edges of the substrate or dielectric layer. The central region may be such that it is not wider than three and one-half times a minimum pitch between adjacent ones of parallel columns of the terminals.

In certain embodiments of the invention, these first terminals in the central region are configured to carry all of a group of command-address bus signals. For example, when the microelectronic element includes or is a DRAM chip, the terminals in the central region are configured to carry all of a group of command signals, address signals, bank address signals, and clock signals that are transferred to the microelectronic package, wherein the command signals are write enable, row address strobe, and column address strobe, and the clock signals are sampling clocks used for sampling the address signals. While the clock signals can be of various types, in one embodiment, the clock signals carried by these terminals can be one or more pairs of differential clock signals transmitted as differential or true and complement clock signals.

The signals of the command-address bus can be bussed on a circuit panel such as a printed circuit board or module card to multiple microelectronic packages in parallel, particularly to first and second microelectronic packages mounted to opposite surfaces of the circuit panel. For certain embodiments herein, by placing terminals that carry command-address bus signals in the central region of the package surface, rather than in peripheral regions near the edges of the microelectronic package, it is possible to reduce the lengths of stubs used to carry signals from the command-address bus 136 (FIG. 2) on the circuit panel to the individual connection sites on the surfaces of the circuit panel where the microelectronic packages are electrically connected. Reducing the lengths of stubs can improve electrical performance in such assembly by reducing one or more of settling time, ringing, jitter, and intersymbol interference, among others, of the signals conducted on the stubs to the packages.

In some embodiments, the microelectronic package may have no more than four columns of terminals in the central region configured to carry all of the command signals, address signals, bank address signals, and clock signals as described above. In certain embodiments, there may be only two columns of such terminals. In other embodiments there may only be one column of such terminals.

The microelectronic package may have second terminals other than the above-described command-address bus signal terminals, such second terminals being disposed in one or more of the peripheral regions and being configured to carry data signals. For example, the second terminals can include terminals used for carrying uni-directional or bi-directional data signals to and/or from the microelectronic element, and data strobe signals, as well as data masks and ODT or "on die termination" signals used to turn on or off parallel terminations to termination resistors. It is possible in some embodiments for some or all terminals that are configured to carry signals other than the command-address bus signals to also be disposed in the central region of the package surface. Signals or reference potentials such as chip select, reset, power supply voltages, e.g., Vdd, Vddq, or ground, e.g., Vss and Vssq, can be carried by the second terminals, or may in some cases be carried by the first terminals.

Embodiments of the invention herein provide packages that have more than one semiconductor chip, i.e., a microelectronic element therein. A multiple chip package can reduce the amount of area or space required to connect the chips therein to a circuit panel, e.g., printed wiring board to which the package may be electrically and mechanically connected through an array of terminals, such as a ball grid array, land grid array or pin grid array, among others. Such connection space is particularly limited in small or portable computing devices, e.g., handheld devices such as "smartphones" or tablets that typically combine the function of personal computers with wireless connectivity to the broader world. Multichip packages can be particularly useful for making large amounts of relatively inexpensive memory available to a system, such as advanced high performance dynamic random access memory ("DRAM") chips, e.g., in DDR3 type DRAM chips and its follow-ons.

The amount of area of the circuit panel needed to connect the multi-chip package thereto can be reduced by providing common terminals on the package through which at least some signals travel on their way to or from two or more chips within the package. However, doing so in a way that supports high performance operation presents challenges. To avoid undesirable effects such as undesirable reflections of the signal due to unterminated stubs, the traces, vias, and other conductors on a circuit panel that electrically connect the terminals at the exterior of the package with the global wiring on the circuit panel such as the bus 136 (FIG. 2) must not be too long. Heat dissipation also presents a challenge for advanced chips, such that it is desirable for at least one of the large flat surfaces of each chip to be coupled to a heat spreader or be exposed to or in thermal communication with a flow or air within an installed system. The packages described below can help to further these goals.

Embodiments of the invention herein can provide ways of reducing stub lengths of signals on the assemblies. Thus, corresponding contacts of multiple chips within the package can be electrically connected with a single common terminal of the package that is configured for connection with a component external to the package, e.g., a circuit panel such as printed circuit board, external microelectronic element, or other component, and a plurality of such microelectronic packages can be mounted to opposite surfaces of a circuit panel.

For example, the electrical lengths of stubs on a circuit panel 60 (FIG. 5E) that electrically connect a first terminal 25a of the first column of a first microelectronic package 10a with the corresponding first terminal of the first column of a second microelectronic package 10b can be less than seven times a minimum pitch of the first terminals on each package: for example, less than seven times the pitch between adjacent columns of first terminals. Stated another way, the total combined length of the conductive elements connecting a pair of electrically coupled first and second panel contacts 65a, 65b exposed at the first and second surfaces of the circuit panel 60 to the corresponding signal conductor of the command-address bus on the circuit panel can be less than seven times a smallest pitch of the panel contacts. In yet another example, the electrical length of the connection between a first terminal 25a of the first microelectronic package 10a with the corresponding first terminal on the second microelectronic package 10b may be approximately the same as a thickness of the circuit panel 60 between first and second surfaces 61, 62.

Figure 5A:
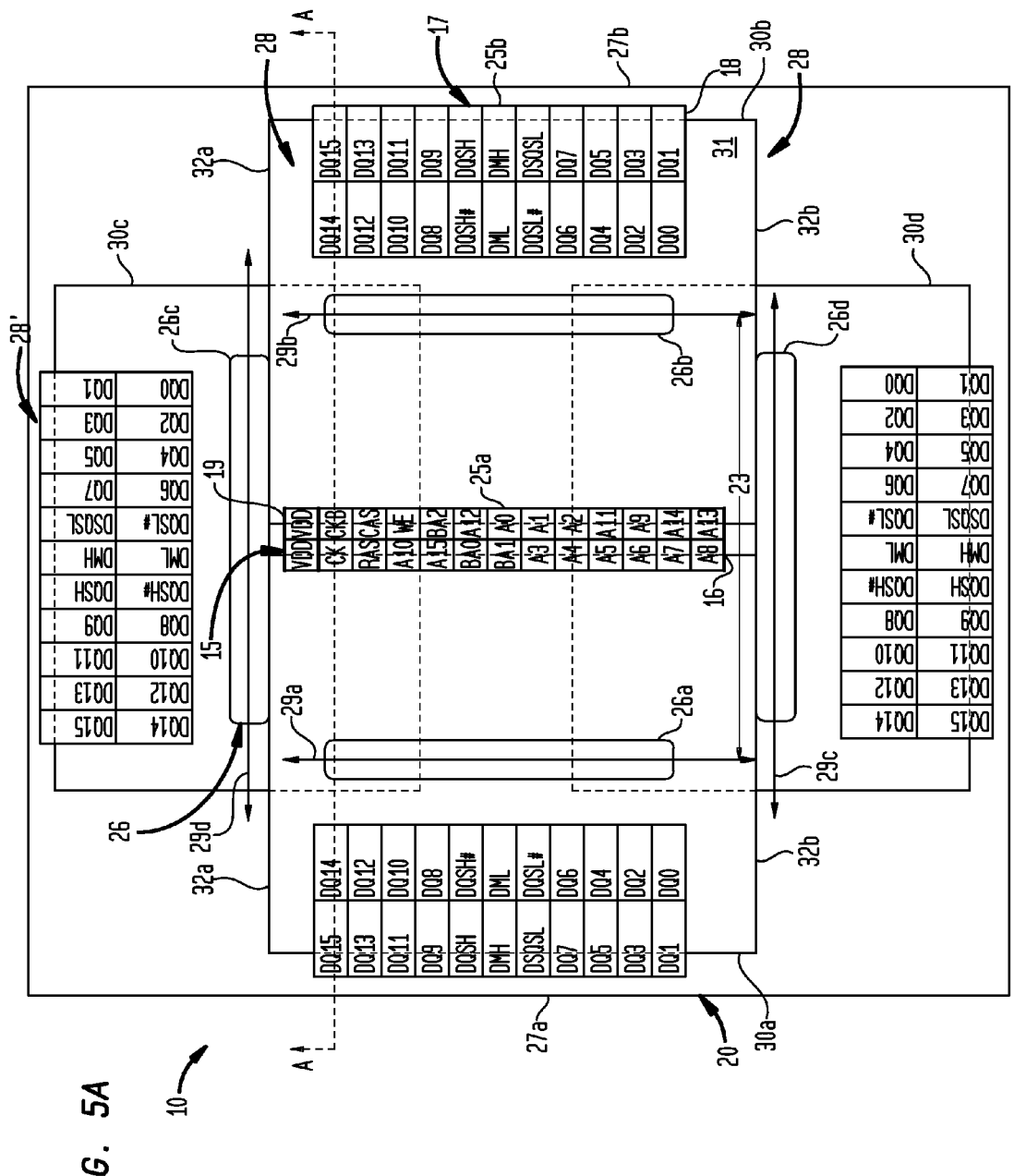
FIG. 5A is a diagrammatic bottom plan view of a microelectronic package according to an embodiment of the present invention.
Figure 5B:
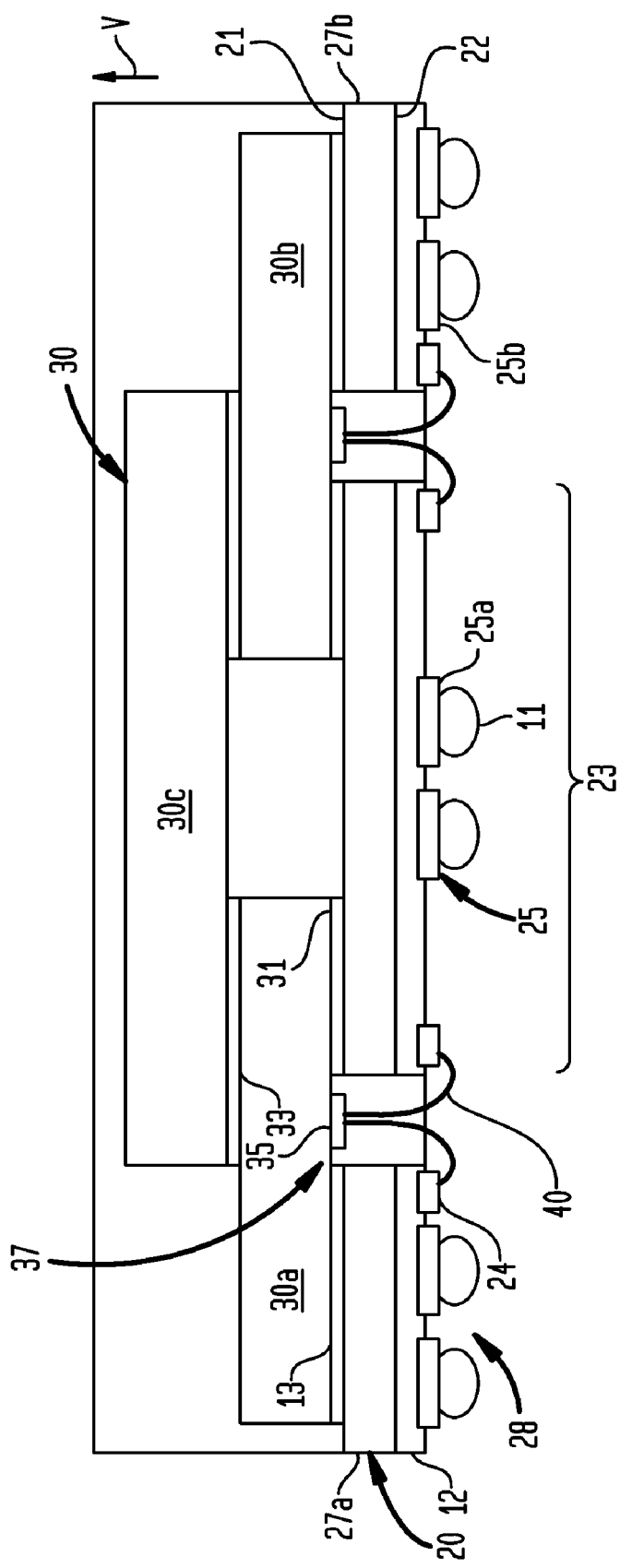
FIG. 5B is a side sectional view of the microelectronic assembly of FIG. 5A, taken along the line A-A of FIG. 5A.

FIGS. 5A and 5B illustrate a particular type of microelectronic package 10 configured so as to permit the lengths of stubs to be reduced when first and second such packages are mounted opposite one another on opposite surfaces of a circuit panel, e.g., a circuit board, module board or card, or flexible circuit panel. As seen in FIGS. 5A and 5B, the microelectronic package 10 can include packaging structure, for example, a substrate 20 having first and second opposed surfaces 21 and 22.

In FIG. 5A and in all of the other diagrammatic bottom plan views of microelectronic packages described herein, the substrate 20 and the terminal grids are shown as transparent. This is done so that the relative positions of the microelectronic elements can be seen from a bottom view more clearly, while still showing of the location of the substrate and terminal grids relative to the microelectronic elements in x-y directions parallel to a plane of the substrate.

In some cases, the substrate 20 can consist essentially of a material having a low coefficient of thermal expansion ("CTE") in a plane of the substrate (in a direction parallel to the first surface 21 of the substrate), i.e., a CTE of less than 12 parts per million per degree Celsius (hereinafter, "ppm/° C."), such as a semiconductor material e.g., silicon, or a dielectric material such as ceramic material or silicon dioxide, e.g., glass. Alternatively, the substrate 20 may include a sheet-like substrate that can consist essentially of a polymeric material such as polyimide, epoxy, thermoplastic, thermoset plastic, or other suitable polymeric material or that includes or consists essentially of composite polymeric-inorganic material such as a glass reinforced structure of BT resin (bismaleimide triazine) or epoxy-glass, such as FR-4, among others. In one example, such a substrate 20 can consist essentially of a material having a CTE of less than 30 ppm/° C. in the plane of the substrate, i.e., in a direction along its surface.

In FIGS. 5A and 5B, the directions parallel to the first surface 21 of the substrate 20 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal "up" or "down" directions in a gravitational frame of reference.

A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

At least one aperture 26 can extend between the first and second surfaces 21, 22 of the substrate 20. As can be seen in FIG. 5A, the substrate 20 can have four apertures 26 extending therethrough. The longest dimensions of first and second apertures 26a and 26b of the apertures 26 can define first and second axes 29a and 29b (collectively axes 29). In the example shown in FIG. 5A, the first and second axes 29a and 29b can be parallel to one another. The first and second axes 29a and 29b can define a central region 23 of the second surface 22 of the substrate 20 located between the axes 29a and 29b. Peripheral regions 28 of the second surface 22 of the substrate 20 can lie outside of the central region 23. Such peripheral regions 28 can extend between the central region 23 and first and second opposed edges 27a and 27b of the second surface 22 of the substrate 20.

The longest dimensions of third and fourth apertures 26c and 26d of the apertures 26 can define third and fourth axes 29c and 29d that are transverse (i.e., crosswise) to the first and second axes 29a and 29b. The third and fourth axes 29c and 29d can be parallel to one another. In one example, the third and fourth axes 29c, 29d can be orthogonal to the first and second axes 29a, 29b. In a particular embodiment, the third and fourth axes 29c and 29d can provide boundaries of the central region 23 of the second surface 22 of the substrate 20, such that peripheral regions 28' of the second surface 22 of the substrate 20 can lie between opposed edges of the substrate and the third and fourth axes.

The substrate 20 can have a plurality of terminals 25, e.g., conductive pads, lands, or conductive posts thereon. Such terminals 25 can be exposed at the second surface 22 of the substrate 20. The terminals 25 can function as endpoints for the connection of the microelectronic package 10 with corresponding electrically conductive elements of an external component such as a circuit panel, e.g., printed wiring board, flexible circuit panel, socket, other microelectronic assembly or package, interposer, or passive component assembly, among others (e.g., the circuit panel shown in FIGS. 5E and 5F). In one example, such a circuit panel can be a motherboard of DIMM module board.

The microelectronic package 10 can include joining units 11 attached to the terminals 25 for connection with an external component. The joining units 11 can be, for example, masses of a bond metal such as solder, tin, indium, a eutectic composition or combination thereof, or another joining material such as a conductive paste or a conductive adhesive. In a particular embodiment, the joints between the terminals 25 and contacts of an external component (e.g., the circuit panel 60 shown in FIG. 5E) can include an electrically conductive matrix material such as described in commonly owned U.S. patent application Ser. Nos. 13/155,719 and 13/158,797, the disclosures of which are hereby incorporated herein by reference. In a particular embodiment, the joints can have a similar structure or be formed in a manner as described therein.

As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure can project from such surface; can be flush with such surface; or can be recessed relative to such surface and exposed through a hole or depression in the structure.

The terminals 25 can include first terminals 25a exposed in the central region 23 of the second surface 22 of the substrate and second terminals 25b exposed in at least one of the peripheral regions 28 of the second surface. In certain embodiments of the invention, these first terminals 25a in the central region 23 are configured to carry all of a set of address signals of microelectronic elements 30 configured to provide dynamic memory storage function in a microelectronic package 10. For example, when the microelectronic elements 30 include or are DRAM semiconductor chips, the first terminals 25a in the central region 23 are configured to carry sufficient address information transferred to the microelectronic package 10 that is usable by circuitry within the package, e.g., row address and column address decoders, and bank selection circuitry, if present, to determine an addressable memory location from among all the available addressable memory locations of a memory storage array within a microelectronic element in the package. In a particular embodiment, the first terminals 25a can be configured to carry all the address information used by such circuitry within the microelectronic package 10 to determine an addressable memory location within such memory storage array.

In a variation of such embodiment, the first terminals 25a can be configured to carry a majority of the address information that is used by such circuitry within the microelectronic package 10 to determine an addressable memory location within such memory storage array, and then other terminals 25 such as the above-referenced second terminals 25b on the microelectronic package would then be configured to carry the remaining part of the address information. In such variation, in a particular embodiment, the first terminals 25a are configured to carry three-quarters or more of the address information that is used by such circuitry within the microelectronic package 10 to determine an addressable memory location within such memory storage array.

In a particular embodiment, the first terminals 25a may not be configured to carry chip select information, e.g., information usable to select a particular chip within the package for access to a memory storage location within the chip. In another embodiment, the first terminals may indeed carry chip select information.

Typically, when the microelectronic elements 30 in the microelectronic package 10 include DRAM chips, the address signals in one embodiment can include all address signals that are transferred to the package from a component external to the package, e.g., a circuit panel such as the circuit panel 60 described below, which are used for determining a random access addressable memory location within the microelectronic package for read access thereto, or for either read or write access thereto.

At least some of the second terminals 25b can be configured to carry signals other than the address signals that are carried by the first terminals 25a. Signals or reference potentials such as chip select, reset, power supply voltages, e.g., Vdd, Vddq, and ground, e.g., Vss and Vssq, can be carried by the second terminals 25b; none of these signals or reference potentials needs to be carried by the first terminals 25a in any of the embodiments referred to herein, unless otherwise noted.

In one embodiment, the first terminals 25a can also be configured to carry all of a particular set of command signals and clock signals transferred to the microelectronic package 10. In such an embodiment, the first terminals 25a can be configured to carry all of the command signals, address signals, bank address signals, and clock signals transferred to the microelectronic package 10 from an external component. For example, in a microelectronic element that includes a dynamic memory storage array, e.g., for a dynamic random access memory ("DRAM"), the command signals are write enable, row address strobe, and column address strobe signals used by a microelectronic element within the microelectronic package 10, when such microelectronic element is a dynamic random access memory storage device. Other signals such as ODT (on die termination), chip select, clock enable, are not part of the command signals that need to be carried by the first terminals 25a. The clock signals can be sampling clocks used for sampling the address signals.

In this embodiment, at least some of the second terminals 25b can be configured to carry signals other than the command signals, address signals, and clock signals that are carried by the first terminals 25a. Signals or reference potentials such as chip select, reset, power supply voltages, e.g., Vdd, Vddq, and ground, e.g., Vss and Vssq, can be carried by the second terminals 25b; none of these signals or reference potentials needs to be carried by the first terminals 25a in any of the embodiments referred to herein, unless otherwise noted.

In a particular example, such as the example shown in FIGS. 5A and 5B, the second terminals 25b can be disposed in at least one column in each of the peripheral regions 28. Additional second terminals 25b can be disposed in at least one column in each of the peripheral regions 28'. In one embodiment, at least some of the second terminals 25b that are configured to carry signals other than the address signals can be exposed in the central region 23 of the second surface 22 of the substrate 20. In one example, at least some of the second terminals 25b that are configured to carry signals other than the command signals, address signals, and clock signals can be exposed in the central region 23 of the second surface 22 of the substrate 20.

Although particular configurations of second terminals are shown in the figures, such as the second terminals 25b shown in FIGS. 5A and 5B, the particular configurations shown are for illustrative purposes and are not meant to be limiting. For example, the second terminals 25b can also include terminals that are configured to be connected to power or ground signals. Although the second terminals 25b are shown arranged in four grids of two columns each, the second terminals 25b in each grid can be arranged in three columns, for example, wherein the third column that is not shown contains some second terminals that are configured to be connected to power or ground.

The substrate 20 can further optionally include a dielectric layer 12 overlying the first and/or second surfaces 21, 22. As shown in FIG. 5B, a dielectric layer 12 can overlie the second surface 22 of the substrate. Such a dielectric layer 12 can electrically insulate conductive elements such as the conductive elements 24 and the terminals 25 from the substrate 20, if such electrical insulation is needed. This dielectric layer 12 can be referred to as a "passivation layer" of the substrate 20. The dielectric layer 12 can include an inorganic or organic dielectric material or both. The dielectric layer 12 may include an electrodeposited conformal coating or other dielectric material, for example, a photoimageable polymeric material, for example, a solder mask material. In a particular example, the dielectric layer 12 can be a layer of compliant material such as an elastomeric material having a structure and function similar to that described in U.S. Pat. No. 5,679,977, the disclosure of which is hereby incorporated herein by reference.

In the embodiments described herein, a dielectric layer 12 overlying the first or second surface 21 or 22 of the substrate 20 can have a thickness that is substantially less than a thickness of the substrate, such that the substrate can have an effective CTE that is approximately equal to the CTE of the material of the substrate, even if the CTE of the dielectric layer is substantially higher than the CTE of the substrate material. In one example, the substrate 20 can have an effective CTE less than 12 ppm/° C.

The microelectronic package 10 can also include a plurality of microelectronic elements 30 each having a front surface 31 facing the first surface 21 of the substrate 20. In one example, each of the microelectronic elements 30 can be bare chips or microelectronic units each incorporating a memory storage element such as a dynamic random access memory ("DRAM") storage array or that is configured to predominantly function as a DRAM storage array (e.g., a DRAM integrated circuit chip). As used herein, a "memory storage element" refers to a multiplicity of memory cells arranged in an array, together with circuitry usable to store and retrieve data therefrom, such as for transport of the data over an electrical interface. In a particular example, the microelectronic package 10 can be included in a single in-line memory module ("SIMM") or a DIMM.

In a particular example, a microelectronic element 30 that includes a memory storage element can have at least a memory storage array function, but the microelectronic element may not be a full-function memory chip. Such a microelectronic element may not have a buffering function itself, but it may be electrically connected to other microelectronic elements in a stack of microelectronic elements, wherein at least one microelectronic element in the stack has a buffering function (the buffering microelectronic element could be a buffer chip, a full-function memory chip, or a controller chip).

In other examples, one or more of the microelectronic elements in any of the packages described herein can embody a greater number of active devices to provide memory storage array function than any other function, e.g., as flash memory, DRAM or other type of memory, and can be arranged in a package together with another microelectronic element or "logic chip" that is configured to predominantly provide logic function. In a particular embodiment, the logic chip can be a programmable or processor element such as a microprocessor or other general purpose computing element. The logic chip can be a microcontroller element, graphics processor, floating point processor, co-processor, digital signal processor, etc. In a particular embodiment, the logic chip can predominantly perform hardware state machine functions, or otherwise be hard-coded to serve a particular function or purpose. Alternatively, the logic chip can be an application specific integrated circuit ("ASIC") or field programmable gate array ("FPGA") chip. In such variation, the package then may be a "system in a package" ("SIP").

In another variation, a microelectronic element in any of the packages described herein can have both logic and memory function embedded therein, such as a programmable processor having one or more associated memory storage arrays embedded therewith in the same microelectronic element. Such microelectronic element is sometimes referred to as a "system-on-a-chip" ("SOC"), in that logic such as a processor is embedded together with other circuitry such as a memory storage array or circuitry for performing some other function that may be a specialized function.

Figure 5C:
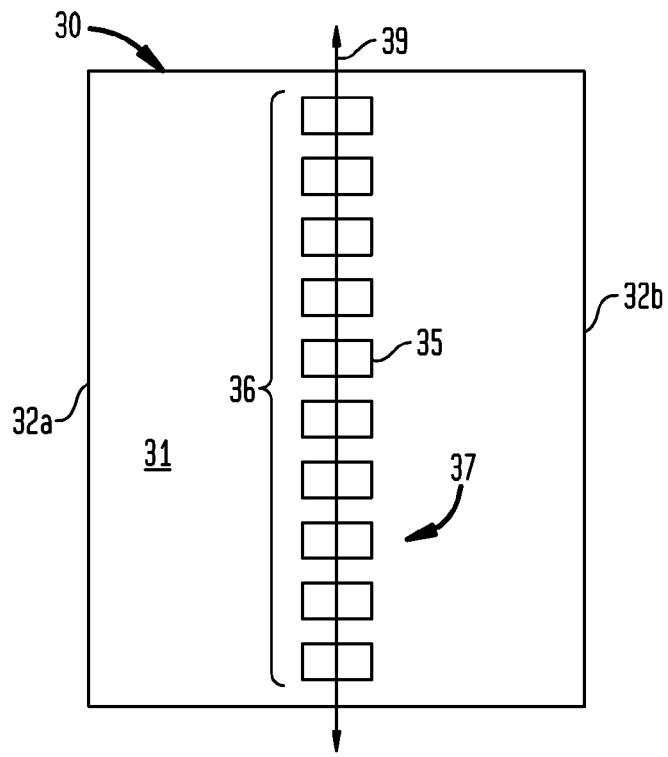
FIG. 5C is a diagrammatic bottom plan view of one of the microelectronic elements shown in FIG. 5A.
Figure 5D:
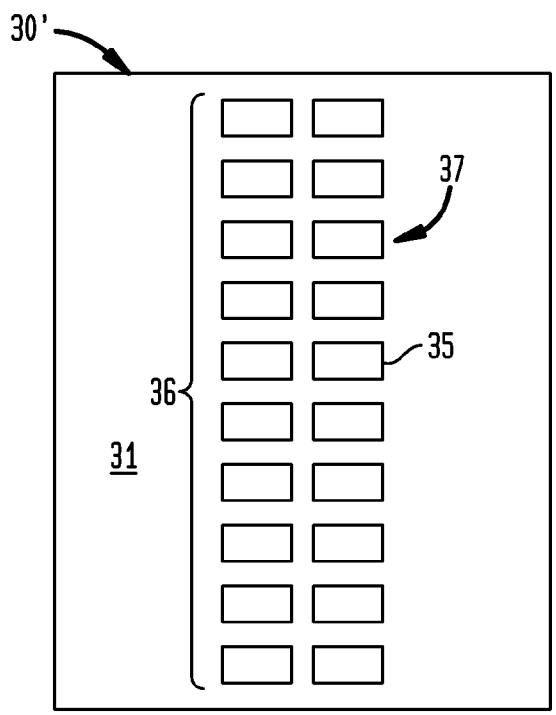
FIG. 5D is a diagrammatic bottom plan view of an alternate embodiment of one of the microelectronic elements shown in FIG. 5A.

Each microelectronic element 30 can have a plurality of electrically conductive contacts 35 exposed at the front surface 31 thereof. As shown in FIGS. 5C and 5D, the contacts 35 of each microelectronic element 30 can be arranged in one (FIG. 5C) or more (FIG. 5D) columns 36 disposed in a central region 37 of the front surface 31 that occupies a central portion of an area of the front surface. The central region 37, for example, may occupy an area of the front surface 31 that includes a middle third of the shortest distance between opposed peripheral edges 32a, 32b of the microelectronic element 30. In the particular example shown in FIG. 5C, when the contacts 35 of each microelectronic element 30 are arranged in a central region 37 of the microelectronic element, the contacts can be arranged along an axis 39 that bisects the microelectronic element. As shown in FIG. 5B, the contacts 35 of each microelectronic elements 30 can be aligned with at least one of the apertures 26.

A variety of microelectronic elements 30, e.g., semiconductor chips, are configured to predominantly provide memory storage array function, i.e., typically a microelectronic element that contains a greater number of active devices used to provide memory storage array function than any other function. In one type of such microelectronic element 30, each one of some contacts of a plurality of external contacts 35 at an exterior of the microelectronic element is dedicated to receiving a respective address signal of the plurality of address signals supplied to the microelectronic element. In this case, each of such contacts 35 is able to receive one respective address signal of the plurality of address signals supplied to the microelectronic element 30 from the outside.

In one particular example of this type of microelectronic element 30, each of the plurality of address signals present at the external contacts 35 can be sampled relative to an edge of a clock used by the microelectronic element, i.e., upon on a transition of the clock between first and second different voltage states. That is, each address signal can be sampled upon a rising transition between a lower voltage state and a higher voltage state of the clock, or upon a falling transition between a higher voltage state and a lower voltage state of the clock. Thus, the plurality of address signals may all be sampled upon the rising transition of the clock, or such address signals may all be sampled upon the falling transition of the clock, or in another example, the address signal at one of the external contacts 35 can be sampled upon the rising transition of the clock and the address signal at one other external contact can be sampled upon the falling transition of the clock.

In another type of microelectronic element 30 configured to predominantly provide memory storage array function, one or more of the address contacts thereon can be used in a multiplexed manner. In this example, a particular external contact 35 of the microelectronic element 30 can receive two or more different signals supplied to the microelectronic element from the outside. Thus, a first address signal can be sampled at the particular contact 35 upon a first transition of the clock between the first and second different voltage states (e.g., a rising transition), and a signal other than the first address signal can be sampled at the particular contact upon a second transition of the clock (e.g., a falling transition) between the first and second voltage states that is opposite the first transition.

In such a multiplexed manner, two different signals can be received within the same cycle of the clock on the same external contact 35 of the microelectronic element 30. In a particular case, multiplexing in this manner can allow a first address signal and a different signal to be received in the same clock cycle on the same external contact 35 of the microelectronic element 30. In yet another example, multiplexing in this manner can allow a first address signal and a second different address signal to be received in the same clock cycle on the same external contact 35 of the microelectronic element 30.

In a particular example, each of the microelectronic elements 30 can be functionally and mechanically equivalent to the other ones of the microelectronic elements, such that each microelectronic element can have the same pattern of electrically conductive contacts 35 at the front surface 31 with the same function, although the particular dimensions of the length, width, and height of each microelectronic element can be different than that of the other microelectronic elements.

In the specific arrangement shown in FIGS. 5A and 5B, the microelectronic package 10 can be configured to route a signal that is common to multiple microelectronic elements 30 through a common first terminal 25a of the package, rather than through two or more terminals 25 of the package each dedicated to a specific one of the microelectronic elements 30, such as the second terminals 25b. In this way, it may be possible to reduce the number of contacts on a circuit panel (e.g., the circuit panel 60 shown in FIG. 5E) to which the microelectronic package 10 can be connected. Furthermore, it may be possible to reduce the number of contacts, metalized vias, and routing layers underlying the microelectronic package 10 on a circuit panel, which may simplify the design of the circuit panel and reduce its manufacturing complexity and cost.

As shown in FIG. 5A, the first terminals 25a of the microelectronic package 10 can be arranged at positions of one or more grids 15 in the central region 23 of the second surface 22 of the substrate 20. Each grid 15 can include one or more columns 16 of the first terminals 25a. As shown in FIG. 5A, all of the positions of the grid 15 can be occupied by a corresponding one of the first terminals 25a. Alternatively (not shown), at least one of the positions of the grid 15 may not be occupied by a first terminal 25a. For example, such a position that is not occupied by a first terminal 25a can be occupied by a second terminal 25b, or such position can be unoccupied by any terminal. As shown in FIG. 5A, the microelectronic package 10 can include two parallel columns 16 of the first terminals 25a. Such columns 16 can be oriented parallel to the axes 29 of the first and second apertures 26a and 26b. Alternatively, as shown for example in FIG. 9A, the columns 16 of the first terminals 25a can be oriented perpendicular to the axes 29 of the first and second apertures 26a and 26b.

The second terminals 25b of the microelectronic package 10 can be arranged at positions of one or more grids 17 in the peripheral regions 28 and/or 28' of the second surface 22 of the substrate 20. Each grid 17 can include one or more columns 18 of the second terminals 25b. As shown in FIG. 5A, all of the positions of the grid 17 can be occupied by a corresponding one of the second terminals 25b. Alternatively (not shown), at least one of the positions of the grid 17 may not be occupied by a second terminal 25b. As shown in FIG. 5A, each grid 17 of the microelectronic package 10 can include two parallel columns 18 of the second terminals 25b. Such columns 18 can be oriented parallel to the axes 29 of the adjacent respective apertures 26, as shown in FIG. 5A. For example, the columns 18 in each of the first, second, third, and fourth grids 17a, 17b, 17c, and 17d shown in FIG. 5A can be oriented parallel to the respective first, second, third, and fourth axes 29a, 29b, 29c, and 29d.

Although the first and second terminals 25a and 25b are shown at the same relative position in a direction of the first and second axes 29a, 29b within adjacent columns 16 or 18, such terminals may in fact be disposed at positions which are somewhat offset in the direction of the first and second axes 29a, 29b.

In other embodiments, the microelectronic package 10 can include other amounts and configurations of columns 16 and columns 18, as will be shown and described below with reference to FIGS. 6A through 15C. For example, in some of the embodiments described herein, the first terminals can be arranged in no more than four columns or in no more than two columns. Although grids having one, two, and three columns of terminals are shown in the figures, the grids of in any of the embodiments described herein can have any number of columns of terminals.

Electrical connections between the contacts 35 and the terminals 25 can include optional leads, e.g., wire bonds 40, or other possible structure in which at least portions of the leads are aligned with at least one of the apertures 26. For example, as seen in FIG. 5B, at least some of the electrical connections can include a wire bond 40 that extends beyond an edge of an aperture 26 in the substrate, and is joined to the contact 35 and a conductive element 24 of the substrate. In one embodiment, at least some of the electrical connections can include lead bonds. Such connections can include leads that extend along either or both of the first and second surfaces 21, 22 of the substrate 20 between the conductive elements 24 and the terminals 25. In a particular example, such leads can be electrically connected between the contacts 35 of each microelectronic element 30 and the first terminals 25a, each lead having a portion aligned with at least one of the apertures 26.

At least some signals that pass through the first terminals 25a of the package can be common to at least two of the microelectronic elements 30. These signals can be routed through connections such as conductive traces extending on or within the substrate 20 in directions parallel to the first and second surfaces 21, 22 of the substrate from the terminals 25 to the corresponding contacts 35 of the microelectronic elements 30. For example, a first terminal 25a disposed in the central region 23 of the second surface 22 of the substrate 20 can be electrically connected with a conductive contact 35 of each microelectronic element 30 through a conductive trace, a conductive element 24, e.g., a bond pad, and a wire bond 40 joined to the conductive element 24 and the contact 35.

As shown in FIGS. 5A and 5B, the microelectronic package 10 can include four microelectronic elements 30, some of which can be stacked relative to one another. For example, in the embodiment shown in FIGS. 5A and 5B, the front surface 31 of each of first and second microelectronic elements 30a, 30b can confront the first surface 21 of the substrate 20, and the front surface 31 of each of third and fourth microelectronic elements 30c, 30d can confront a rear surface 33 of each of the first and second microelectronic elements. At least a portion of the front surface 31 of each of the third and fourth microelectronic elements 30c, 30d can overlie at least a portion of the rear surface 33 of each of the first and second microelectronic elements 30a, 30b. At least a portion of the central region 37 of the front surface 31 of each of the third and fourth microelectronic elements 30c, 30d can project beyond the respective lateral edges 32a, 32b of each of the first and second microelectronic elements 30a, 30b. Accordingly, the contacts 35 of each of the third and fourth microelectronic elements 30c, 30d can be positioned in a location projecting beyond the respective lateral edges 32a, 32b of each of the first and second microelectronic elements 30a, 30b.

One or more adhesive layers 13 can be positioned between the first and second microelectronic elements 30a, 30b and the substrate 20, between the third microelectronic element 30c and the first and second microelectronic elements 30a and 30b, and between the fourth microelectronic element 30d and the first and second microelectronic elements 30a and 30b. Such adhesive layers 13 can include adhesive for bonding the aforementioned components of the microelectronic package 10 to one another. In a particular embodiment, the one or more adhesive layers 13 can extend between the first surface 21 of the substrate 20 and the front surface 31 of each of the first and second microelectronic elements 30a, 30b. In one embodiment, the one or more adhesive layers 13 can attach at least a portion of the front surface 31 of each of the third and fourth microelectronic elements 30c, 30d to at least a portion of the rear surface 33 of each of the first and second microelectronic elements 30a, 30b.

In one example, each adhesive layer 13 can be partly or entirely made of a die attachment adhesive and can be comprised of a low elastic modulus material such as silicone elastomer. In one embodiment, the die attachment adhesive can be compliant. In another example, each adhesive layer 13 can be entirely or partly made of a thin layer of high elastic modulus adhesive or solder if the microelectronic elements 30 are each conventional semiconductor chips formed of the same material, because the microelectronic elements will tend to expand and contract in unison in response to temperature changes. Regardless of the materials employed, each of the adhesive layers 13 can include a single layer or multiple layers therein.

The microelectronic package 10 can also include an encapsulant 50 that can optionally cover, partially cover, or leave uncovered the rear surfaces 33 of the microelectronic elements 30. For example, in the microelectronic package 10 shown in FIG. 5B, an encapsulant can be flowed, stenciled, screened or dispensed onto the rear surfaces 33 of the microelectronic elements 30. In another example, the encapsulant 50 can be a mold compound which is formed thereon by overmolding.

The microelectronic package 10 can further include an encapsulant (not shown) that can optionally cover the wire bonds 40 and the conductive elements 24 of the substrate 20. Such an encapsulant can also optionally extend into the apertures 26, and it can cover the contacts 35 of the microelectronic elements 30.

In a particular embodiment, the microelectronic package can be configured to be assembled with another such microelectronic package and a circuit panel such as the circuit panel 60 described below, such that each of the microelectronic packages is assembled to an opposing surface of the circuit panel.

Figure 5E:
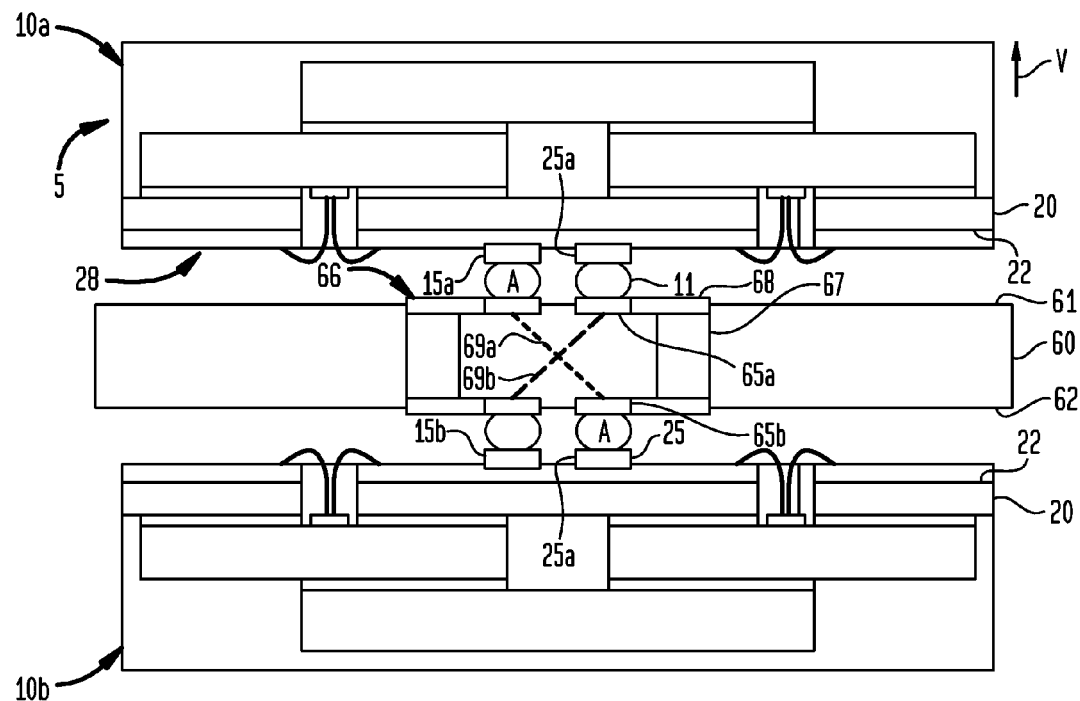
FIG. 5E is one possible side sectional view of a microelectronic assembly including two microelectronic packages as shown in FIG. 5A, taken along the line A-A of FIG. 5A.

Referring now to FIG. 5E, a microelectronic assembly 5 can include two or more microelectronic packages 10, for example, first and second microelectronic packages 10a, 10b, that can be mounted to a common circuit panel 60. The circuit panel 60 can have first and second opposing surfaces 61 and 62 and pluralities of electrically conductive first and second panel contacts 65a and 65b (collectively panel contacts 65) exposed at the respective first and second surfaces. The microelectronic packages 10 can be mounted to the panel contacts 65, for example, by the joining units 11 that can extend between the terminals 25 and the panel contacts. As shown in FIG. 5E, the second surface 22 of the substrate 20 of the first microelectronic package 10a and the second surface of the substrate of the second microelectronic package 10b can overlie at least 90% of one another. In a particular example, the circuit panel 60 can include an element having a CTE less than 30 ppm/° C. In one embodiment, such an element can consist essentially of semiconductor, glass, ceramic or liquid crystal polymer material.

The first terminals 25a of the first microelectronic package 10a can be electrically connected to the first terminals of the second microelectronic package 10b through the circuit panel 60. The first terminals 25a of the first microelectronic package 10a can be arranged at positions of a first grid 15a, and the first terminals 25b of the second microelectronic package 10b can be arranged at positions of a second grid 15b. As shown in FIG. 5A, the first terminals 25a of the first grid 15a of the first microelectronic package 10a can be aligned within one ball pitch of the corresponding first terminals 25b to which they are connected of the second grid 15b of the second microelectronic package 10b.

As used herein, alignment within a particular number of ball pitches means aligned within the particular number of ball pitches with respect to a horizontal direction perpendicular to the first surface of the substrate. In an exemplary embodiment, each pair of electrically connected terminals of the grids 15a, 15b of the respective first and second packages 10a, 10b can be aligned within one ball pitch of one another in orthogonal x and y directions parallel to the first surface 61 of the circuit panel 60. In a particular example, a majority of the positions of the grids 15a, 15b of the respective first and second packages 10a, 10b can be aligned with one another in a vertical direction orthogonal to the first and second circuit panel surfaces 61, 62.

In one embodiment, the grids 15a and 15b of the respective first and second microelectronic packages 10a and 10b can be functionally and mechanically matched, such that each of the grids 15a and 15b can have the same pattern of first terminals 25a at the second surface 22 of the substrate 20 of the respective microelectronic package 10a or 10b with the same function, although the particular dimensions of the length, width, and height of each microelectronic package 10 can be different than that of the other microelectronic packages. In such an embodiment having functionally and mechanically matched grids 15a and 15b, the first terminals 25a of each microelectronic package 10 can be oriented such that a functional top end 19 of the grid of the first microelectronic package 10a (that can be seen in FIG. 5A) can overlie the functional top end 19 of the grid of the second microelectronic package 10b.

In a particular example (not shown), a spatial distribution of the first terminals 25a along the second surface 22 of the substrate 20 of at least one of the first and second microelectronic packages 10 can be different from a spatial distribution of the corresponding panel contacts 65 to which they are electrically connected, such that at least one of the first terminals 25a does not directly overlie the corresponding panel contact 65 to which it is electrically connected.

As shown in FIG. 5E and in the other microelectronic assembly side sectional figures herein, the second terminals are omitted from the figures for clarity. In FIG. 5E, for example, although the second terminals are not shown in the figure, the second terminals can be present in the peripheral regions 28 and/or 28' of the second surface 22 of each microelectronic package 10. The second terminals of each microelectronic package 10 can be mounted to corresponding ones of the panel contacts 65, for example, by joining units such as the joining units 11 that can extend between the second terminals and the panel contacts.

As shown in FIG. 1E, the circuit panel 60 of the microelectronic assembly 5 can include one or more routing layers 66, e.g., a layer of electrically conductive traces thereon, for global routing of all of the address signals. In a particular example, the circuit panel 60 of the microelectronic assembly 5 can include one or more routing layers 66, e.g., a layer of electrically conductive traces thereon, for global routing of all of the command signals, address signals, bank address signals, and clock signals.

As shown in FIG. 5E, metalized vias 67 extending through the circuit panel 60 can be coupled to the panel contacts 65 by conductive structure 68 (e.g., traces) of the routing layer 66. In a particular example, the total combined length of the conductive elements (e.g., the vias 67 and the conductive structure 68) connecting a pair of electrically coupled first and second panel contacts 65a and 65b exposed at the respective first and second surfaces 61 and 62 of the circuit panel 60 can be less than seven times a minimum pitch of the panel contacts 65.

In one example, in a microelectronic assembly embodiment having microelectronic packages with grids 15 each having first terminals 25a arranged in two parallel columns 16, the circuit panel 60 may include no more than two routing layers 66 required for global routing of all of the address signals. In an exemplary embodiment, in a microelectronic assembly embodiment having microelectronic packages with grids 15 each having first terminals 25a arranged in two parallel columns 16, the circuit panel 60 may include no more than two routing layers 66 required for global routing of all of the command signals, address signals, bank address signals, and clock signals. However, in any of the aforementioned embodiments, the circuit panel 60 may include more than two routing layers for the routing of signals other than the particular signals carried by the first terminals 25a.

In the embodiment shown in FIG. 5E, the first panel contacts 65a can be joined to the first terminals 25a of the first microelectronic package 10a and can be arranged in first and second linearly extending columns exposed at the first surface 61 of the circuit panel 60, and the second panel contacts 65b can be joined to the first terminals 25a of the second microelectronic package 10b and can be arranged in first and second linearly extending columns exposed at the second surface 62 of the circuit panel 60. The first column of the first panel contacts 65a, shown bonded to joining units 11 labeled with an 'A', can be aligned with the second column of the second panel contacts 65b in a direction of a thickness of the circuit panel, and the second column of the first panel contacts 65a can be aligned in the direction of the circuit panel thickness with the first column of the second panel contacts 65b, also shown bonded to joining units labeled with an 'A'.

Each of the first panel contacts 65a at the first surface 61 labeled with an 'A' can be electrically coupled to a corresponding second panel contact 65b at the second surface 62 labeled with an 'A', such that each panel contact 65 in the first column at each surface 61, 62 can be coupled to a corresponding panel contact in the first column at the opposite surface. In FIG. 5E, a schematic of the electrical connections between corresponding ones of the panel contacts 65 are shown via dotted lines 69a and 69b. Also, each panel contact 65 in the second column at each surface 61, 62 can be coupled to a corresponding panel contact in the second column at the opposite surface.

In a particular example, the circuit panel 60 can further include conductive contacts configured for electrically connecting the microelectronic assembly 5 with at least one component external to the microelectronic assembly.

In the microelectronic assembly 5, each first terminal 25a of the first microelectronic package 10a can be electrically coupled through the circuit panel 60 to a corresponding first terminal of the second microelectronic package 10b having the same function, with a relatively short stub length. As used herein, "stub length" means the total length of the shortest electrical connection between a terminal 25 of a microelectronic package 10 at a first surface of the circuit panel and a corresponding terminal of a microelectronic package at the second opposed surface of the circuit panel. In one example, stub lengths of the electrical connections between the first and second microelectronic packages 10a and 10b can be less than seven times a minimum pitch of the first terminals 25a of each microelectronic package.

Figure 5F:
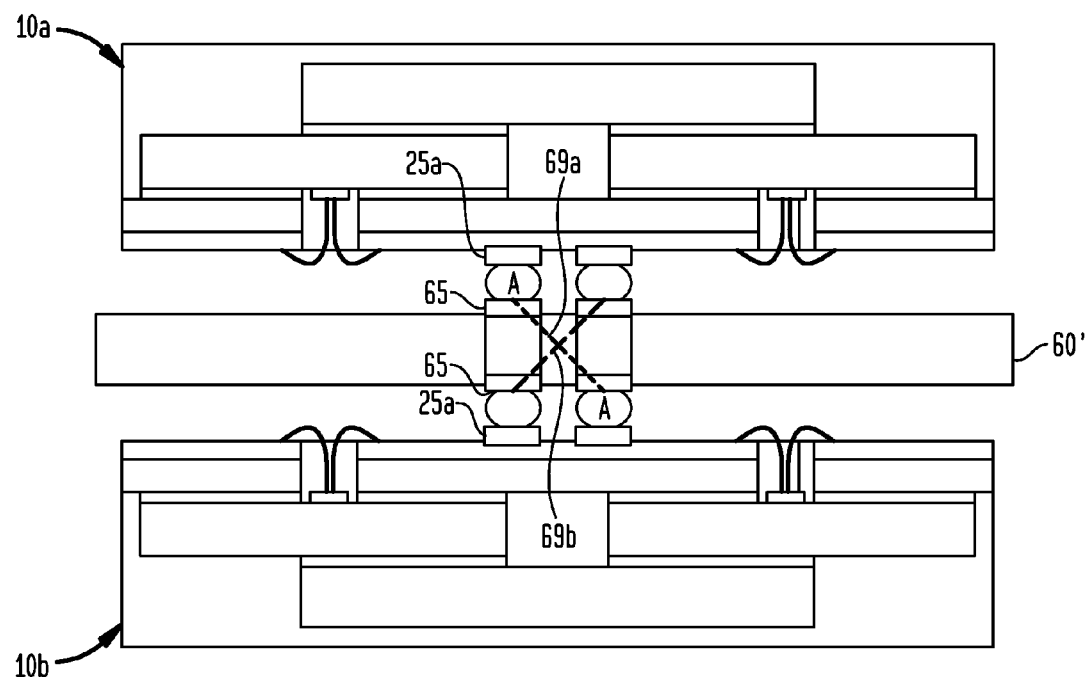
FIG. 5F is another possible side sectional view of a microelectronic assembly including two microelectronic packages as shown in FIG. 5A, taken along the line A-A of FIG. 5A.

FIG. 5F illustrates a variation of the embodiment described above relative to FIG. 5E, in which the metalized vias 67' extending through the circuit panel 60' are arranged in a common vertical plane with the first terminals 25a of each of the first and second microelectronic elements 10a, 10b. Although the vias 67' and the first terminals 25a are in a common vertical plane, corresponding first terminals 25a in each of the first and second microelectronic packages 10a and 10b can be horizontally offset from one another, so that horizontally and vertically extending conductive structure (e.g., traces and metalized vias) of the circuit panel can electrically connect the corresponding first terminals. Similar to FIG. 5E, a schematic of the electrical connections between corresponding ones of the panel contacts 65 in FIG. 5F are shown via dotted lines 69a and 69b.

Figure 5G:
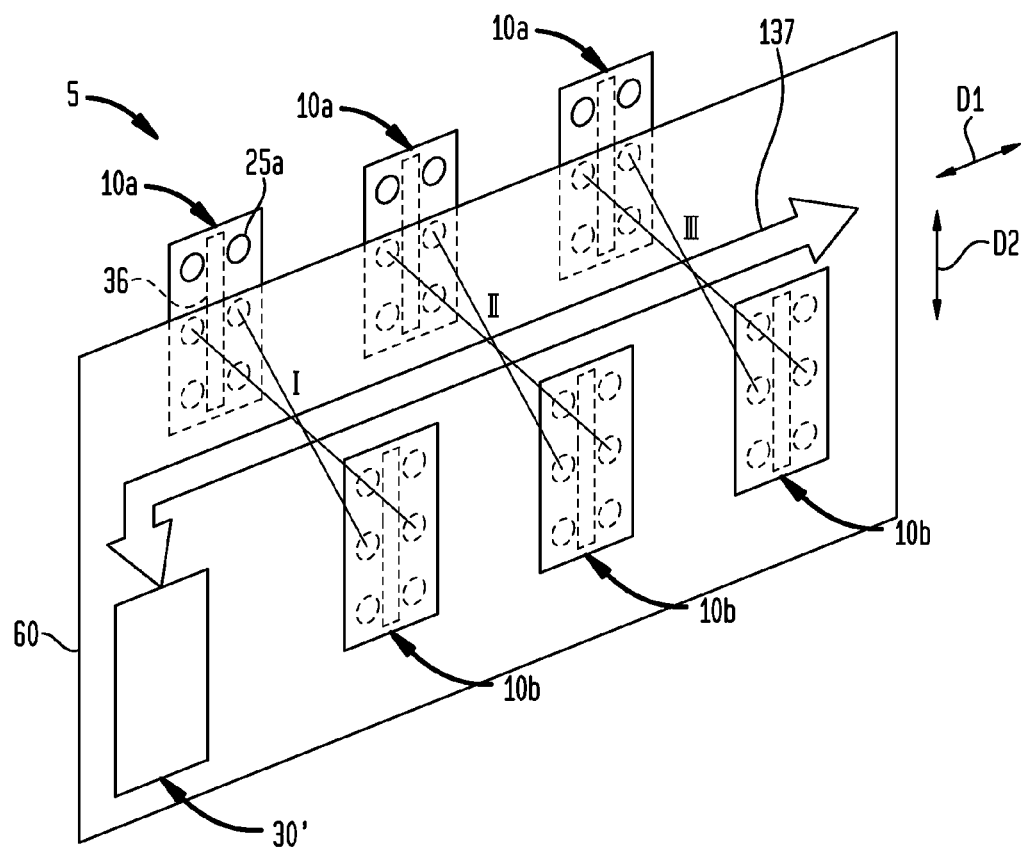
FIG. 5G is a possible diagrammatic perspective view of the microelectronic assembly of FIG. 5E showing electrical connections between terminals of the microelectronic packages.

In a particular embodiment of the microelectronic assembly 5, as shown in FIG. 5G, the command-address bus signals can be routed in at least one direction D1 between connection sites on a circuit panel such as the circuit panel 60 at which a plurality of microelectronic packages 10a, 10b are connected, such that signals of the command-address bus 137 reach each pair of packages 10a and 10b at respective connection sites I, II or III at slightly different times. As seen in FIG. 5G, the at least one direction D1 can be transverse or orthogonal to a direction D2 in which at least one column 36 of a plurality of contacts 35 on at least one microelectronic element 30 extends. In such a way, the signal conductors of the command-address bus 137 on (i.e., on or within) the circuit panel 60 can in some cases be spaced apart from one another in the direction D2 that is parallel to the at least one column 36 of contacts 35 on a microelectronic element 30 within a package 10a or 10b connected to, or to be connected to the circuit panel 60.

Such a configuration, particularly when the first terminals 25a of each microelectronic package 10a, 10b are arranged in one or more columns extending in such direction D2, may help simplify the routing of signal conductors of one or more global routing layers on the circuit panel 60 used to route command-address bus signals. For example, it may be possible to simplify routing of the command-address bus signals on a circuit panel when relatively few first terminals are disposed at the same vertical layout position on each package. Thus, in the example shown in FIG. 5A, only two first terminals 25a are disposed at the same vertical layout position on each package, such as the first terminals configured to receive address signals A3 and A1.

In an exemplary embodiment, the microelectronic assembly 5 can have a microelectronic element 30' that can include a semiconductor chip configured predominantly to perform a logic function, such as a solid state drive controller, and one or more of the microelectronic elements 30 in the microelectronic packages 10a and 10b can each include memory storage elements such as nonvolatile flash memory. The microelectronic element 30' can include a special purpose processor that is configured to relieve a central processing unit of a system such as the system 1600 (FIG. 16) from supervision of transfers of data to and from the memory storage elements included in the microelectronic elements 30. Such a microelectronic element 30' including a solid state drive controller can provide direct memory access to and from a data bus on a motherboard (e.g., the circuit panel 1602 shown in FIG. 16) of a system such as the system 1600. In a particular embodiment, the microelectronic element 30' can have a buffering function. Such a microelectronic element 30' can be configured to help provide impedance isolation for each of the microelectronic elements 30 with respect to components external to the microelectronic assembly 5.

In such an embodiment of the microelectronic assembly 5 having a microelectronic element 30' that includes a controller function and/or a buffering function, the command-address bus signals can be routed between the microelectronic element 30' and each pair of packages 10a and 10b at respective connection sites I, II or III. In the particular example shown in FIG. 5G, a portion of the command-address bus 137 that extends past the connection sites I, II or III can extend in the direction D2 or in another direction transverse to the direction D1 to reach contacts of the microelectronic element 30'. In one embodiment, the command-address bus 137 can extend in the direction D1 to reach contacts of the microelectronic element 30'.

Figure 6A:
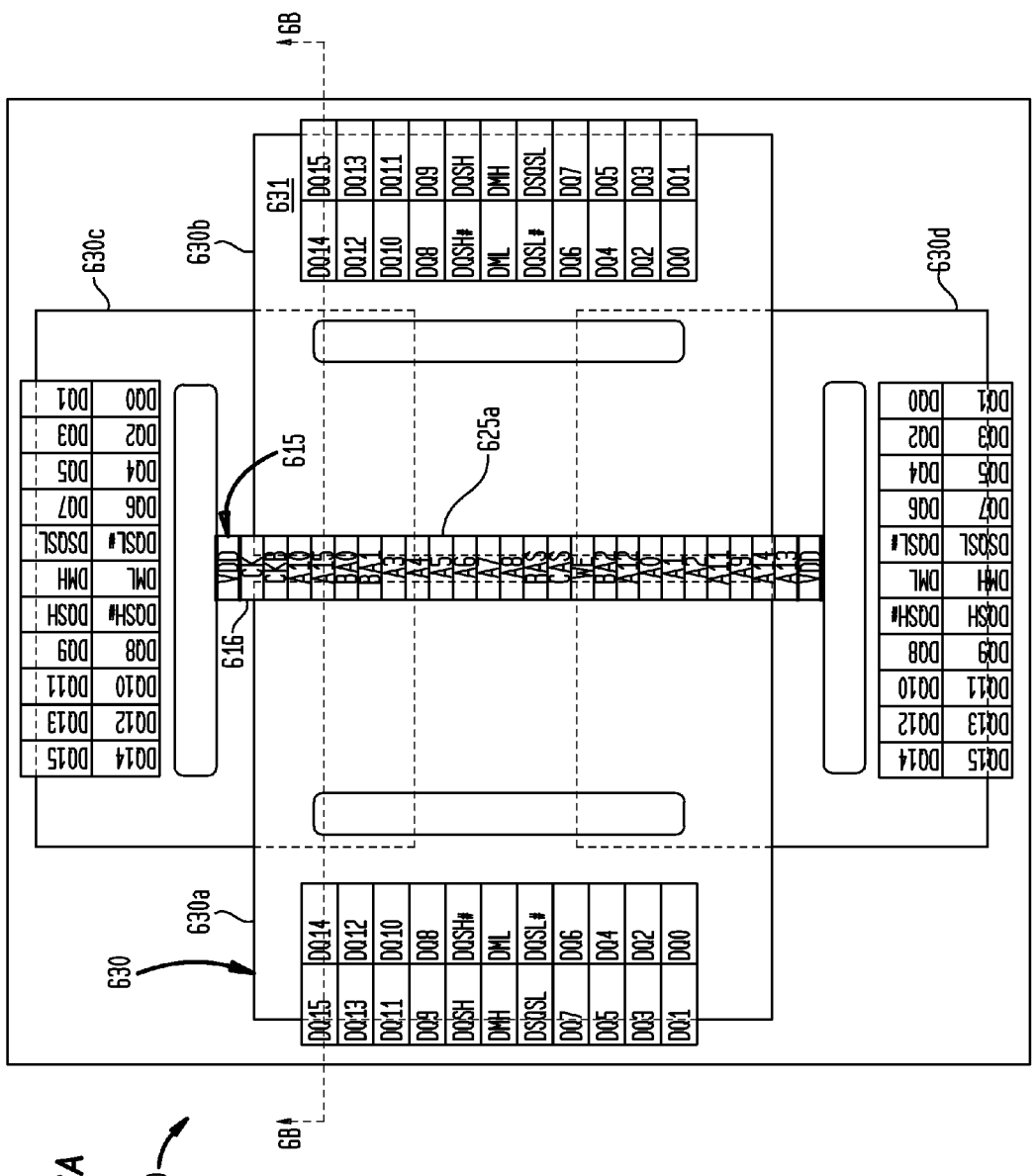
FIG. 6A is a diagrammatic bottom plan view of a microelectronic package according to another embodiment having a single grid of first terminals arranged in a single column.
Figure 6B:
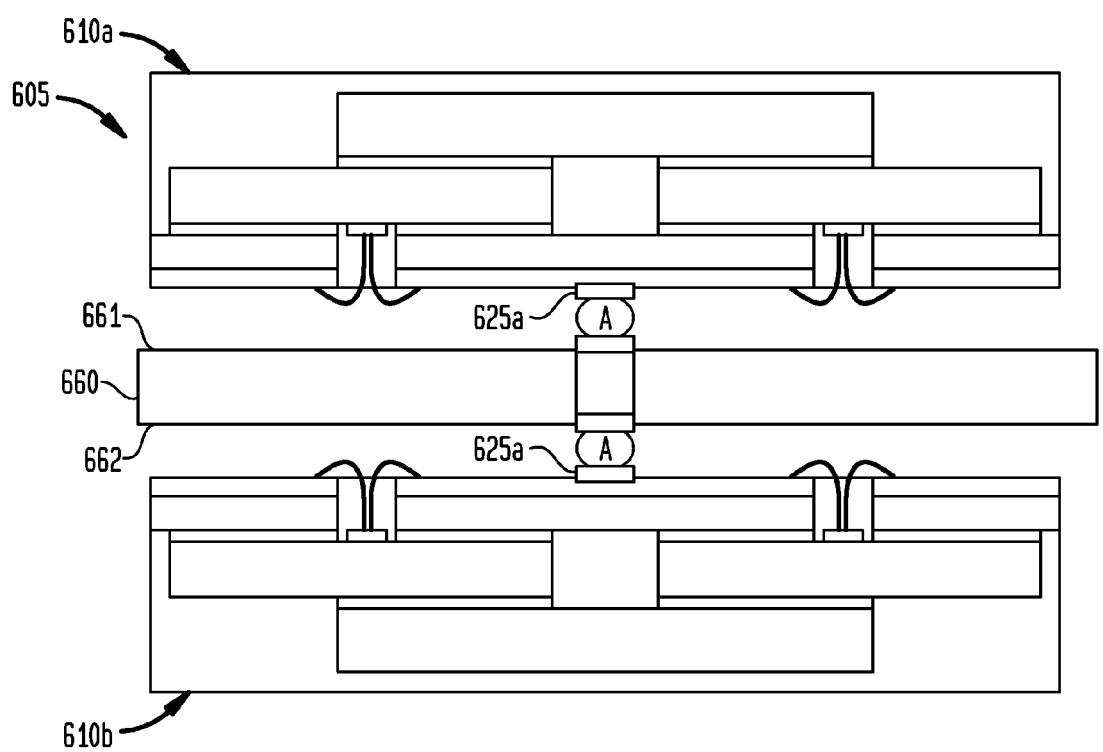
FIG. 6B is a possible side sectional view of a microelectronic assembly including two microelectronic packages as shown in FIG. 6A, taken along the line 6B-6B of FIG. 6A.

FIG. 6A illustrates a variation of the embodiment described above relative to FIG. 5A, in which the first terminals 625a of the microelectronic package 610 are arranged in a grid 615 having a single column 616. Although the grid 615 is shown extending beyond the outer boundaries of the front surface 631 of the microelectronic elements 630, that need not be the case. A potential advantage of such an embodiment can be seen in FIG. 6B, which shows a microelectronic assembly 605 that can include two or more microelectronic packages 610 that can be mounted to a common circuit panel 660. As shown in FIG. 6B, corresponding first terminals 625a in each of the first and second microelectronic packages 610a and 610b can be arranged in a common vertical plane. The circuit panel construction may also be simplified in a microelectronic assembly 605 having this construction, because the routing between each electrically connected pair of first terminals 625a can be mostly in a vertical direction, i.e., in a direction through the thickness of the circuit panel. That is, via connections on the circuit panel 660 may be all that is needed to electrically connect each pair of corresponding first terminals 625a of the microelectronic packages 610 mounted to the opposite surfaces 661, 662 of the circuit panel.

In such an embodiment, the corresponding first terminals 625a in each of the first and second microelectronic packages 610a and 610b may not be horizontally offset from one another (or can be minimally horizontally offset due to manufacturing tolerance, for example), so at least some of the electrical connections carrying the address signals (in one example) or the command signals, address signals, bank address signals, and clock signals (in a particular example) through the circuit panel 660 between the first terminals 625a of the first and second microelectronic packages 610a and 610b can have an electrical length of approximately a thickness of the circuit panel. As used herein, "signals of fixed potential" include power and ground (reference potential) signals.

Moreover, the number of global routing layers of wiring on the circuit panel 660 required to route the address signals (in one example) or the command-address bus signals (in a particular example) along the circuit panel between connection sites where respective pairs of microelectronic packages 610 are connected can be reduced. Specifically, the number of global routing layers required to route such signals along the circuit panel 660 may in some cases be reduced to two or fewer routing layers. In a particular example, there may be no more than one global routing layer required to route such signals along the circuit panel 660. However, on and within the circuit panel 660, there may be a greater number of routing layers used for carrying other signals than the number of routing layers that are used for carrying the above-noted address signals or command-address bus signals.

FIG. 7A illustrates a variation of the embodiment described above relative to FIG. 5A, in which the first terminals 725a of the microelectronic package 710 are arranged in first and second parallel grids 715a and 715b, each grid having two adjacent columns 716 of the first terminals. In this embodiment, each of the first and second grids 715a and 715b can be configured to carry all of the same signals, and the positions of corresponding ones of the terminals 725a in the first and second grids are shown mirrored about an intermediate axis 729e between the first and second grids, the intermediate axis being parallel to the first and second axes 729a and 729b of the apertures 726a and 726b. In this embodiment, each first terminal 725a that is configured to carry a particular signal in the first grid 715a can be symmetric about the intermediate axis 729e with respect to a corresponding first terminal that is configured to carry the same signal in the second grid 715b.

In one example, the intermediate axis 729e can be located within one ball pitch of the first terminals 725a of a centerline of the second surface 722 of the substrate 720 located equidistant between first and second opposed edges 727a and 727b of the second surface. In such an embodiment having four microelectronic elements 730 and two grids 715 of first terminals 725a mirrored with respect to one another about an intermediate axis 729e therebetween, the first terminals of each of the first and second grids 715a and 715b can be electrically connected to two corresponding ones of the microelectronic elements. For example, the first terminals 725a of the first grid 715a can be connected to contacts of the first and second microelectronic elements 730a, 730b, and the first terminals of the second grid 715b can be connected to contacts of the third and fourth microelectronic elements 730c, 730d.

As shown in FIG. 7A, the second terminals 725b can be in first and second parallel grids 717a and 717b and third and fourth parallel grids 717c and 717d, and the positions of corresponding ones of the second terminals 725b in such first and second grids can be mirrored about the intermediate axis 729e, and the positions of corresponding ones of the second terminals in such third and fourth grids can be mirrored about a second intermediate axis 729f transverse to the intermediate axis 729e. In a particular example, the second intermediate axis 729f can be orthogonal to the intermediate axis 729e.

Figure 7B:
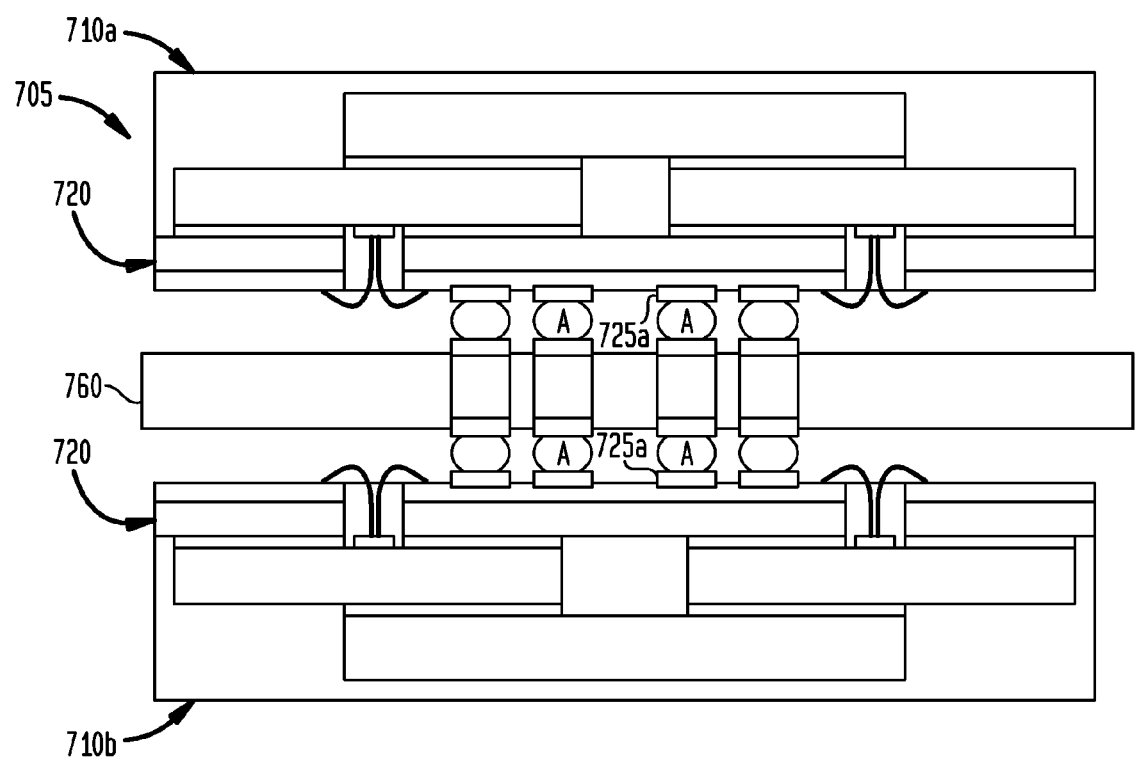
FIG. 7B is a possible side sectional view of a microelectronic assembly including two microelectronic packages as shown in FIG. 7A, taken along the line 7B-7B of FIG. 7A.

Similar to the embodiment of FIG. 6A, a potential advantage of the embodiment of FIG. 7A can be seen in FIG. 7B, which shows a microelectronic assembly 705 that can include two or more microelectronic packages 710 that can be mounted to a common circuit panel 760. As shown in FIG. 7B, corresponding first terminals 725a in each of the first and second microelectronic packages 710a and 710b can be arranged in a common vertical plane, which can allow at least some of the electrical connections carrying the address signals (in one example) or the command signals, address signals, bank address signals, and clock signals (in a particular example) through the circuit panel 760 between the first terminals 725a of the first and second microelectronic packages 710a and 710b to have an electrical length of approximately a thickness of the circuit panel.

Figure 8:
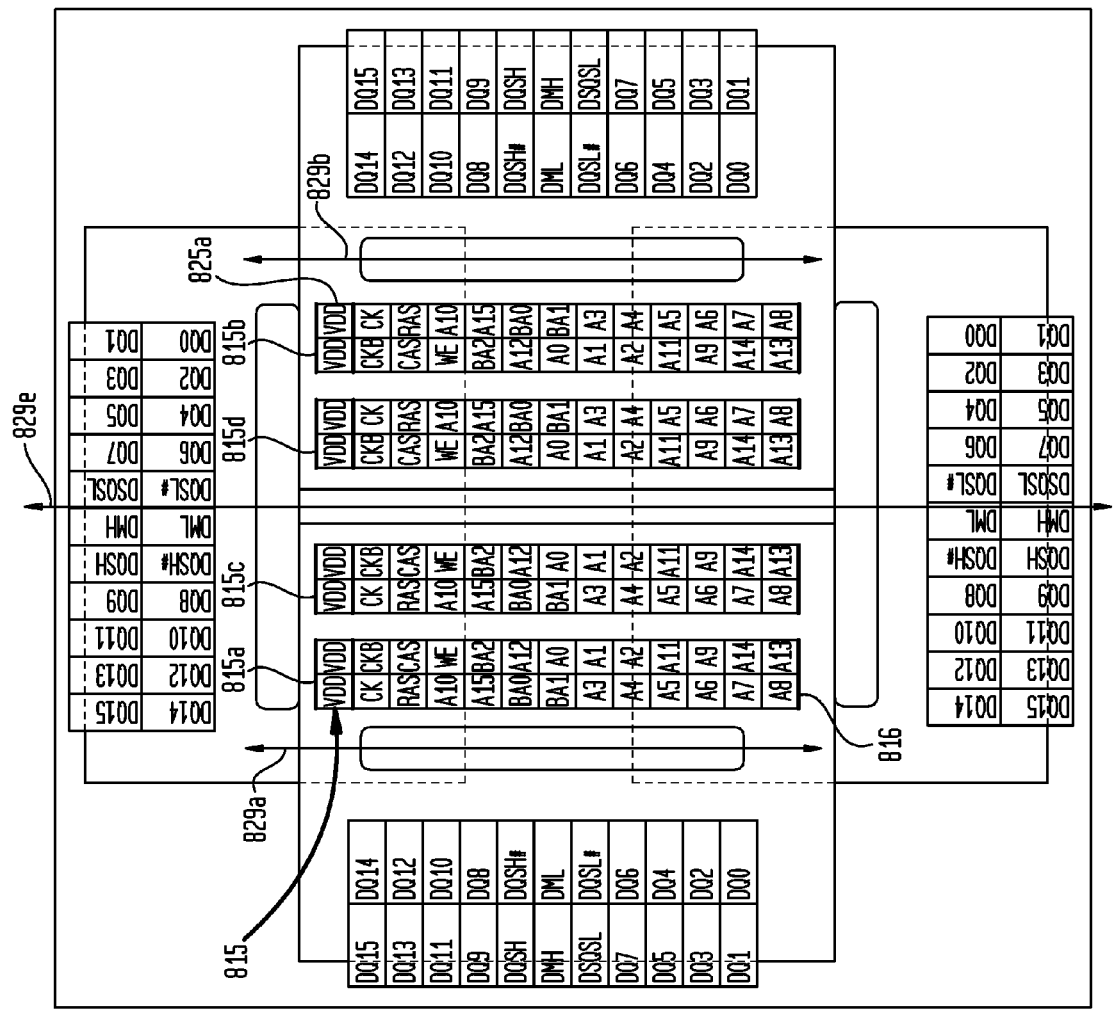
FIG. 8 is a diagrammatic bottom plan view of a microelectronic package according to another embodiment having four grids of first terminals, each grid arranged in two columns.

FIG. 8 illustrates a variation of the embodiment described above relative to FIG. 7A that shows a microelectronic package 810 having first terminals 825a arranged in four parallel grids 815 each having two columns 816. As shown in FIG. 8, the two outer grids 815a and 815b can be mirrored with respect to one another about an intermediate axis 829e between the outer grids, the intermediate axis being parallel to the first and second axes 829a, 829b, and the two inner grids 815c and 815d can be mirrored with respect to one another about the intermediate axis. In a variant of FIG. 8 (not shown), each outer grid 815a and 815b can also be mirrored with respect to an adjacent one of the inner grids 815c and 815d.

Figure 9A:
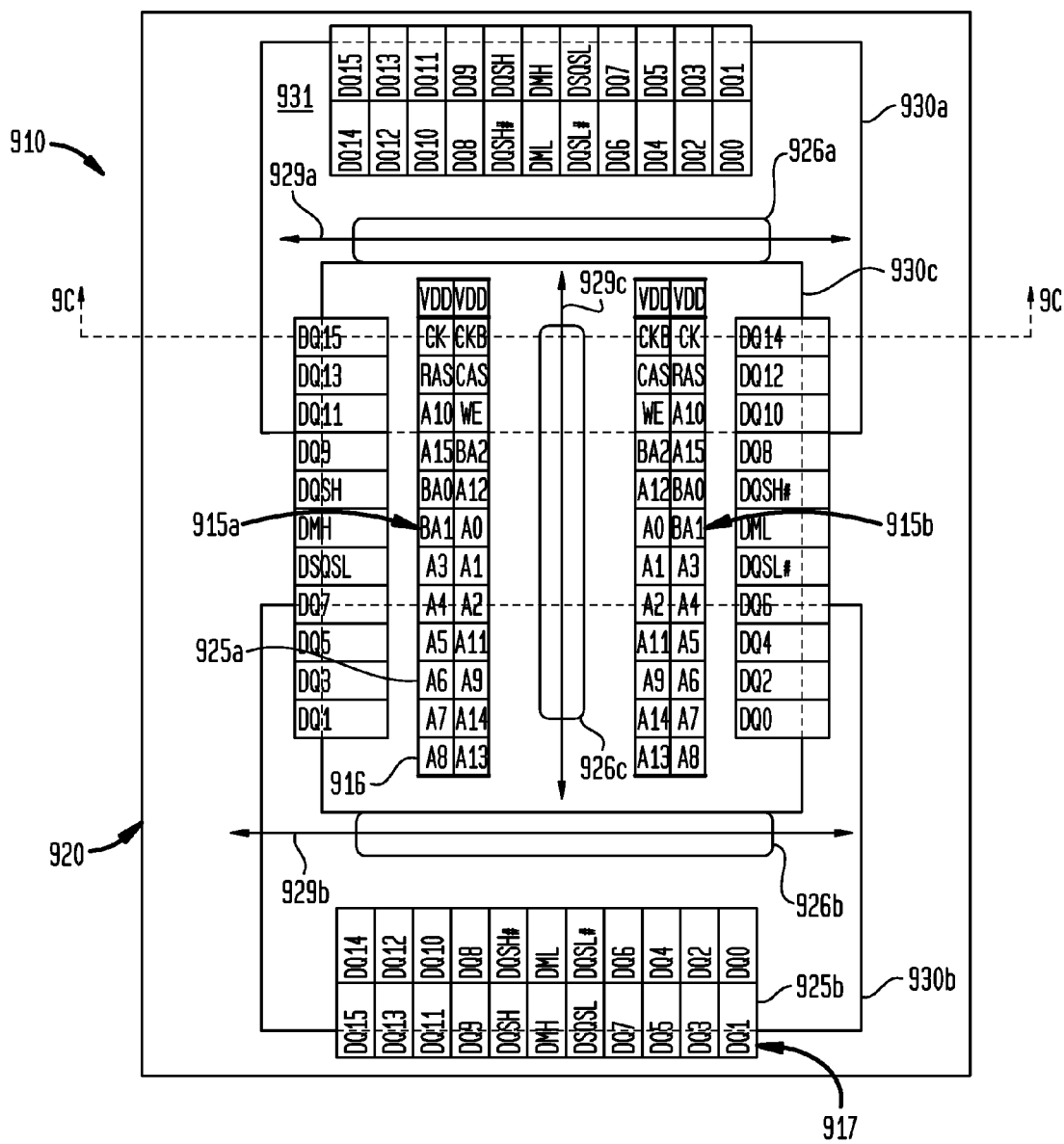
FIG. 9A is a diagrammatic bottom plan view of a microelectronic package according to still another embodiment having three microelectronic elements.

FIG. 9A illustrates a variation of the embodiment described above relative to FIG. 7A, in which the microelectronic package 910 includes three microelectronic elements 930. In this embodiment, the microelectronic package 910 includes first and second microelectronic elements 930a and 930b each having a front surface 931 arranged in a single plane parallel to the first surface 921 of the substrate 920, and a third microelectronic element 930c disposed between the substrate and the first and second microelectronic elements. The first and second microelectronic elements 930a, 930b each have a front surface 931 at least partially overlying the rear surface 933 of the third microelectronic element 930c. In one example, in such a microelectronic package having three microelectronic elements 930, the third microelectronic element 930c can be a NAND flash element.

The substrate 920 can have a third aperture 926c having a third axis 929c extending in a direction of the length of the third aperture, the third axis being transverse to the first and second axes 929a and 929b of the respective first and second apertures 926a and 926b. In a particular example, the third axis 929c can be orthogonal to the first and second axes 929a, 929b. The third microelectronic element 930c can have a plurality of contacts 935 at the first surface 936 thereof aligned with at least one of the apertures 926.

Similar to the embodiment shown in FIG. 7A, the first terminals 925a of the microelectronic package 910 can be arranged in first and second parallel grids 915a and 915b, each grid having two adjacent columns 916 of the first terminals, and the positions of corresponding ones of the terminals 925a in the first and second grids are shown mirrored about an intermediate axis 929e (that may be coincident with the third axis 929c) between the first and second grids that is transverse to the first and second axes 929a and 929b. In one example, the intermediate axis 929e can be orthogonal to the first and second axes 929a, 929b. In this embodiment, some of the second terminals 925b can be located in grids 917 adjacent to the grids 915 of the first terminals 925a.

Figure 9B:
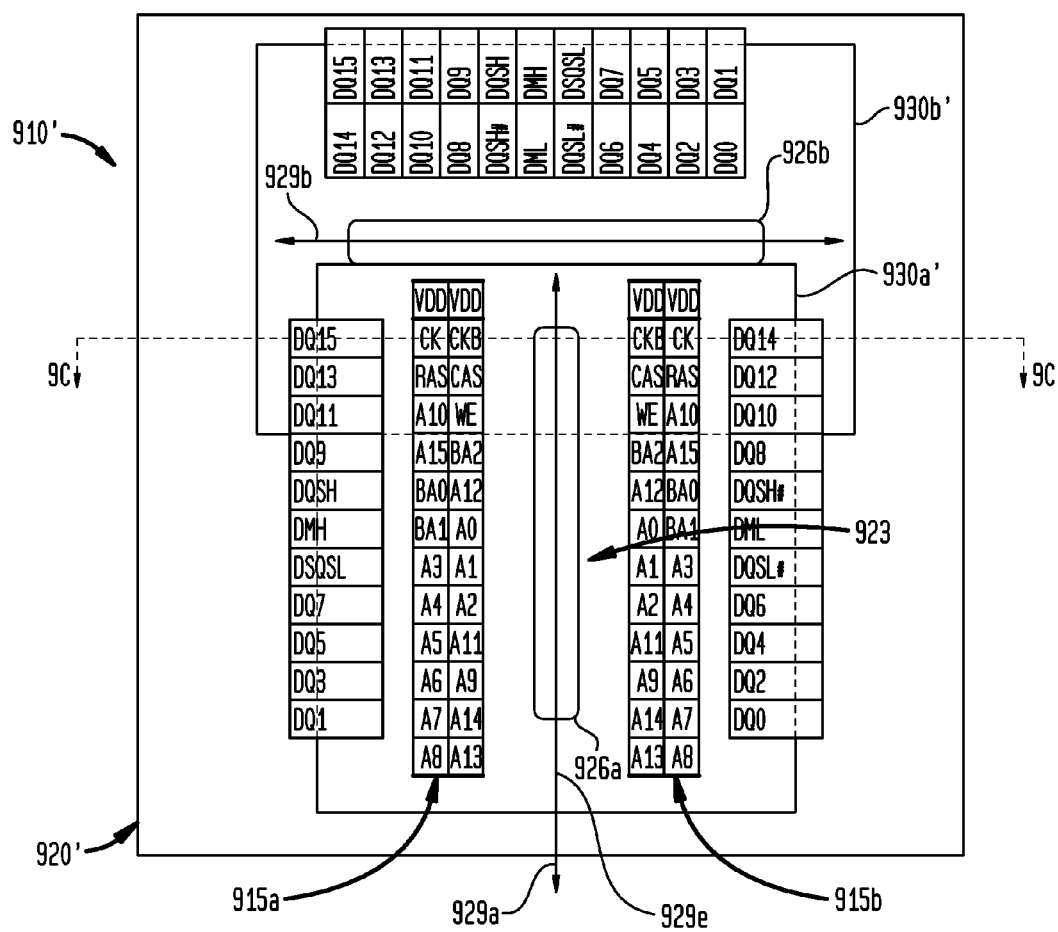
FIG. 9B is a diagrammatic bottom plan view of a microelectronic package according to another embodiment having two microelectronic elements.

FIG. 9B illustrates a variation of the embodiment described above relative to FIG. 9A, in which the microelectronic package 910' includes two microelectronic elements 930. In this embodiment, the microelectronic package 910 includes a first microelectronic element 930a' having a front surface 931 confronting the second surface 922 of the substrate 920', and a second microelectronic element 930b' having a front surface at least partially overlying a rear surface 932 of the first microelectronic element.

The substrate 920' can have first and second apertures 926a, 926b having respective first and second axes 929a, 929b extending in a direction of the length of the respective first and second apertures, the second axis being transverse to the first axis. In a particular example, the second axis 929b can be orthogonal to the first axis 929a.

Similar to the embodiment shown in FIG. 9A, the first terminals 925a of the microelectronic package 910' can be arranged in first and second parallel grids 915a and 915b, each grid having two adjacent columns 916 of the first terminals, and the positions of corresponding ones of the terminals 925a in the first and second grids are shown mirrored about an intermediate axis 929e (that may be coincident with the first axis 929a) between the first and second grids that is parallel to the first axis 929a.

A central region 923 of the first surface 921 of the substrate 920' in which the first terminals 925a are exposed can be located adjacent the first aperture 926a. In a particular embodiment, the first aperture 926a can be at least partially disposed between the first and second grids 915a and 915b.

A spacer (not shown) can be positioned between the front surface 931 of the second microelectronic element 930b' and a portion of the second surface 922 of the substrate 920, to increase the mechanical stability of the second microelectronic element with respect to the substrate. Such a spacer can be made, for example, from a dielectric material such as silicon dioxide, a semiconductor material such as silicon, or one or more layers of adhesive. If the spacer includes adhesives, the adhesives can connect the second microelectronic element 930b to the substrate 920. In one embodiment, the spacer can have substantially the same thickness in a vertical direction substantially perpendicular to the first surface 921 of the substrate 920 as the thickness of the first microelectronic element 930a' between the front and rear surfaces 931, 933 thereof. In a particular embodiment where the spacer is made from an adhesive, the adhesive layers positioned between the spacer and the second microelectronic element 930b' and the substrate 920 can be omitted.

A potential advantage of the embodiments shown in FIGS. 9A and 9B can be seen in FIG. 9C, which shows a microelectronic assembly 905 that can include two or more microelectronic packages 910 or 910' that can be mounted to a common circuit panel 960. As shown in FIG. 9B, corresponding first terminals 925a in each of the first and second microelectronic packages 910a, 910b or 910a', 910b' can be arranged in a common vertical plane.

In such an embodiment, the corresponding first terminals 925a in each of the first and second microelectronic packages 910a or 910a' and 910b or 910b' may not be horizontally offset from one another (or can be minimally horizontally offset due to manufacturing tolerance, for example), so at least some of the electrical connections carrying the address signals (in one example) or the command signals, address signals, bank address signals, and clock signals (in a particular example) through the circuit panel 960 between the first terminals 925a of the first and second microelectronic packages 910a or 910a' and 910b or 910b' can have an electrical length of approximately a thickness of the circuit panel.

In a variation of the embodiment shown in FIG. 9B (not shown), a microelectronic package can include two adjacent overlapping pairs of microelectronic elements, which would have the appearance of two pairs of microelectronic elements 930a', 930b' (FIG. 9B) disposed adjacent one another overlying the same substrate.

Figure 10A:
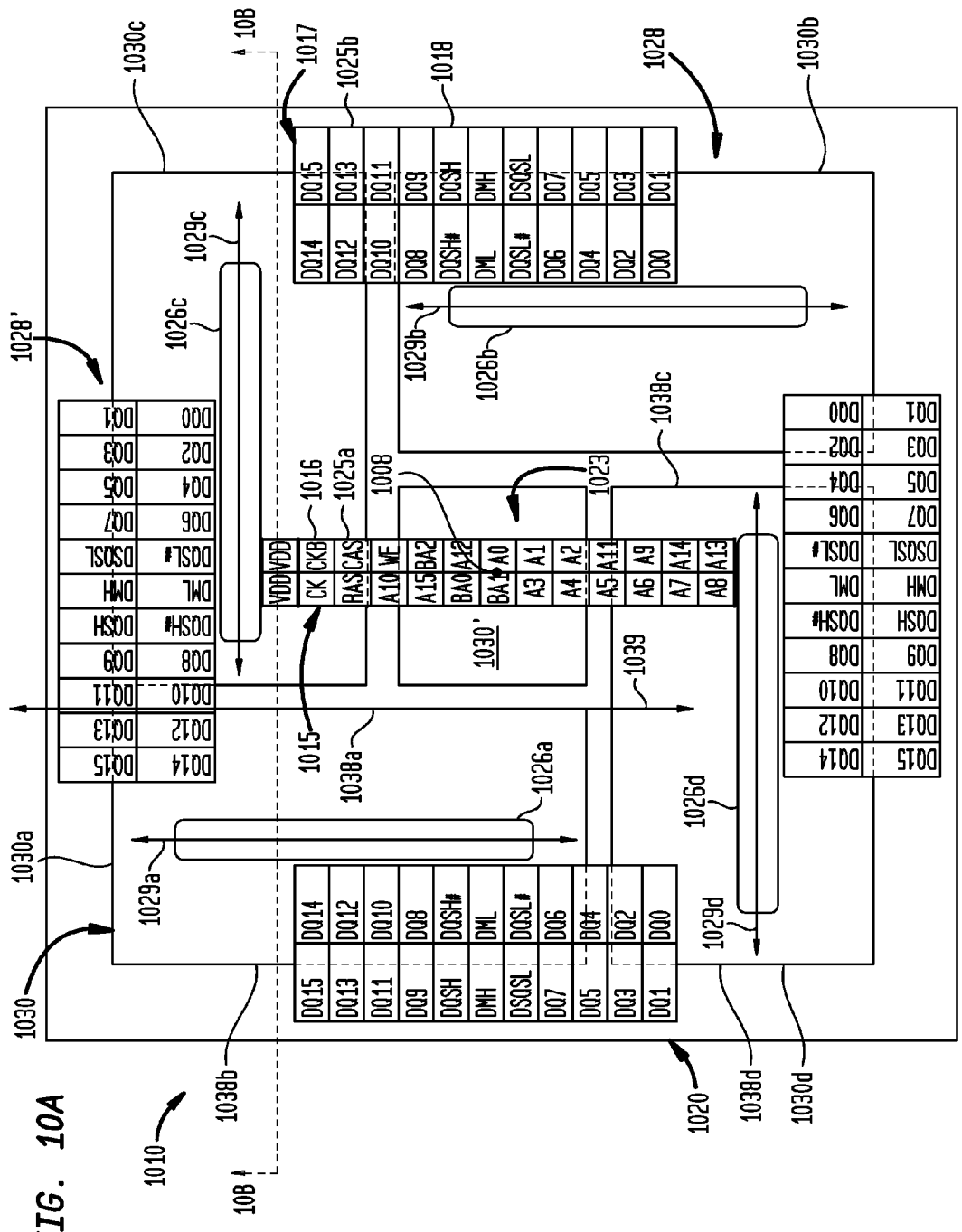
FIG. 10A is a diagrammatic bottom plan view of a microelectronic package according to another embodiment having four microelectronic elements in a pinwheel configuration.

FIG. 10A illustrates a variation of the embodiment described above relative to FIG. 5A, in which the microelectronic package 1010 includes four microelectronic elements 1030 each having a surface 1031 arranged in a single plane parallel to the first surface 1021 of the substrate 1020.

FIG. 10A illustrates a particular arrangement of microelectronic elements 1030 similar to the shape of a pinwheel. In this embodiment, the longest dimensions of the first and second apertures 1026a and 1026b define first and second parallel axes 1029a and 1029b, and the longest dimensions of the third and fourth apertures 1026c and 1026d define third and fourth parallel axes 1029c and 1029d. The third and fourth axes 1029c, 1029d can be transverse to the first and second axes 1029a, 1029b. In an exemplary embodiment, the third and fourth axes 1029c, 1029d can be orthogonal to the first and second axes 1029a, 1029b.

In one example, each of the microelectronic elements 1030 can have first and second opposed edges 1038a, 1038b extending in a direction of the length of the respective microelectronic element, each of the first edges having portions adjacent to a centroid 1008 of the package, each of the first edges defining a plane 1039 that extends through exactly one of the other ones of the microelectronic elements. In a particular embodiment, as shown for example in FIG. 10A, the axis 1029 of each of the apertures 1026 can extend through exactly one of the other ones of the apertures.

Each of the microelectronic elements 1030 can have third and fourth opposed edges 1038c, 1038d extending in a direction of the width of the respective microelectronic element between the first and second opposed edges 1038a, 1038b, each of the third edges facing at least a portion of a first edge of an adjacent microelectronic element. As shown in FIG. 10A, the second edge 1038b of each of the microelectronic elements 1030 can be coplanar with the fourth edge 1038d of exactly one adjacent microelectronic element.

Similar to the embodiment shown in FIG. 5A, the first terminals 1025a of the microelectronic package 1010 can be arranged in a single grid 1015 having two adjacent columns 1016 of the first terminals. A central region 1023 of the second surface 1022 of the substrate 1020 in which the first terminals 1025a are exposed can be located between the first and second axes 1029a, 1029b, such that peripheral regions 1028 of the second surface of the substrate can lie between opposed edges of the substrate and the first and second axes. In a particular embodiment, the third and fourth axes 1029c and 1029d can provide boundaries of the central region 1023 of the second surface 1022 of the substrate 1020, such that peripheral regions 1028' of the second surface 1022 of the substrate 1020 can lie between opposed edges of the substrate and the third and fourth axes.

In one example, one or more buffering chips 1030' can be mounted to the substrate 1020 having a surface 1031' facing the first surface 1021 (FIG. 10A) or the second surface 1022 of the substrate 1020. Such a buffering chip 1030' can be flip-chip bonded to electrically conductive contacts exposed at the first surface 1021 of the substrate 1020. Such a buffering chip 1030' can be configured to help provide signal isolation for each of the microelectronic elements 1030 with respect to components external to the microelectronic package 1010. In one example, such a buffering chip 1030' or buffer element can be electrically connected to at least some of the terminals 1025 and one or more of the microelectronic elements 1030 in the microelectronic package 1010, the buffer element configured to regenerate at least one signal received at one or more of the terminals of the microelectronic package 1010. In a particular embodiment, one or more of the chips 1030' can be a decoupling capacitor. One or more decoupling capacitors 1030' can be disposed between the microelectronic elements 1030 instead of or in addition to the aforementioned buffering chips. Such decoupling capacitors can be electrically connected to internal power and ground buses inside the microelectronic package 1010.

Figure 10B:
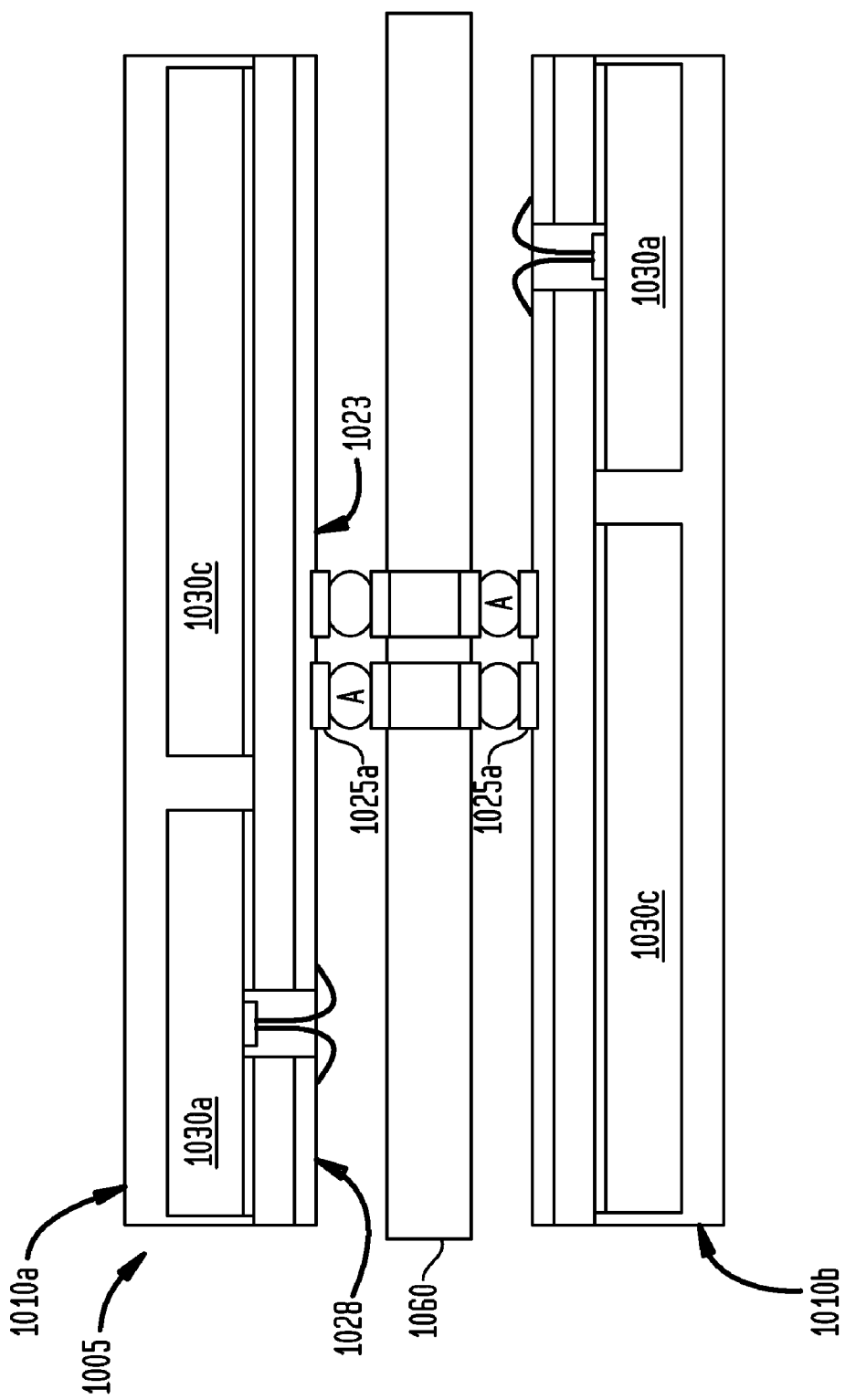
FIG. 10B is a possible side sectional view of a microelectronic assembly including two microelectronic packages as shown in FIG. 10A, taken along the line 10B-10B of FIG. 10A.

A potential advantage of such an embodiment can be seen in FIG. 10B, which shows a microelectronic assembly 1005 that can include two or more microelectronic packages 1010 that can be mounted to a common circuit panel 1060. As shown in FIG. 10B, corresponding first terminals 1025a in each of the first and second microelectronic packages 1010a and 1010b can be arranged in a common vertical plane.

Figure 10C:
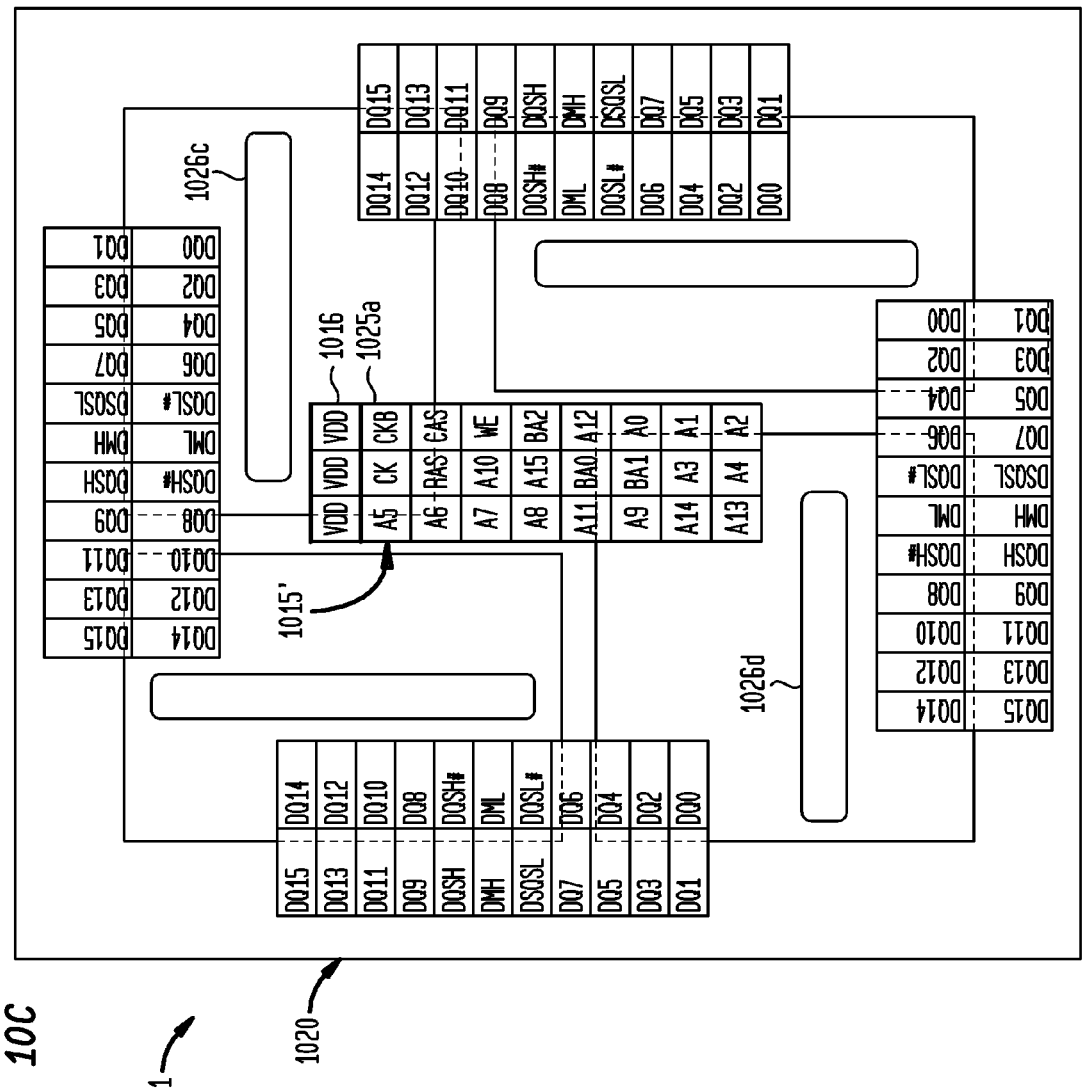
FIG. 10C is a variation of the microelectronic package of FIG. 10A having a single grid of first terminals arranged in three columns.
Figure 10D:
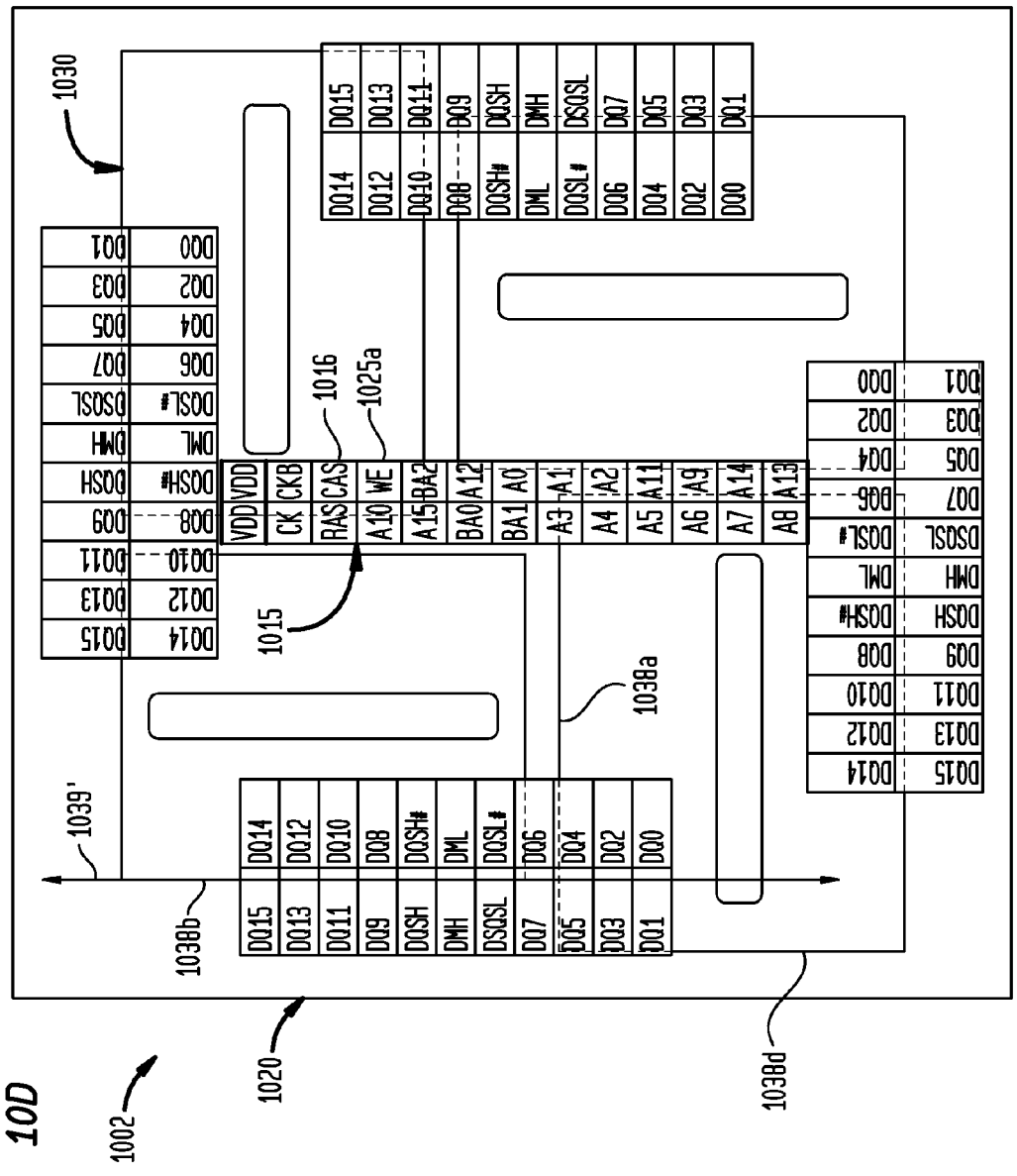
FIG. 10D is another variation of the microelectronic package of FIG. 10A having an alternate layout of the microelectronic elements.

FIGS. 10C and 10D show variations of the embodiment of the microelectronic package shown in FIG. 10A. FIG. 10C shows a microelectronic package 1001 having first terminals 1025a arranged in a single grid 1015' having three parallel columns 1016. Such a configuration of the grid 1015' having three columns 1016 can be advantageous when the third and fourth apertures 1026c and 1026d are relatively close together, thereby limiting the potential length of the grid that can fit between the third and fourth apertures.

FIG. 10D shows a microelectronic package 1002 having first terminals 1025a arranged in a single grid 1015 having two parallel columns 1016, where the microelectronic elements 1030 are relatively non-elongated, thereby limiting the potential height of the grid that can fit between the third and fourth apertures. To accommodate the length of the grid 1015, the pinwheel shape can be adjusted as shown in FIG. 10D so that the second edge 1038b of each of the microelectronic elements 1030 is not coplanar with the fourth edge 1038d of an adjacent microelectronic element. In the example shown in FIG. 10D, a plane 1039' containing the second edge 1038b of each of the microelectronic elements 1030 intersects the first edge 1038a of exactly one adjacent microelectronic element.

Figure 11A:
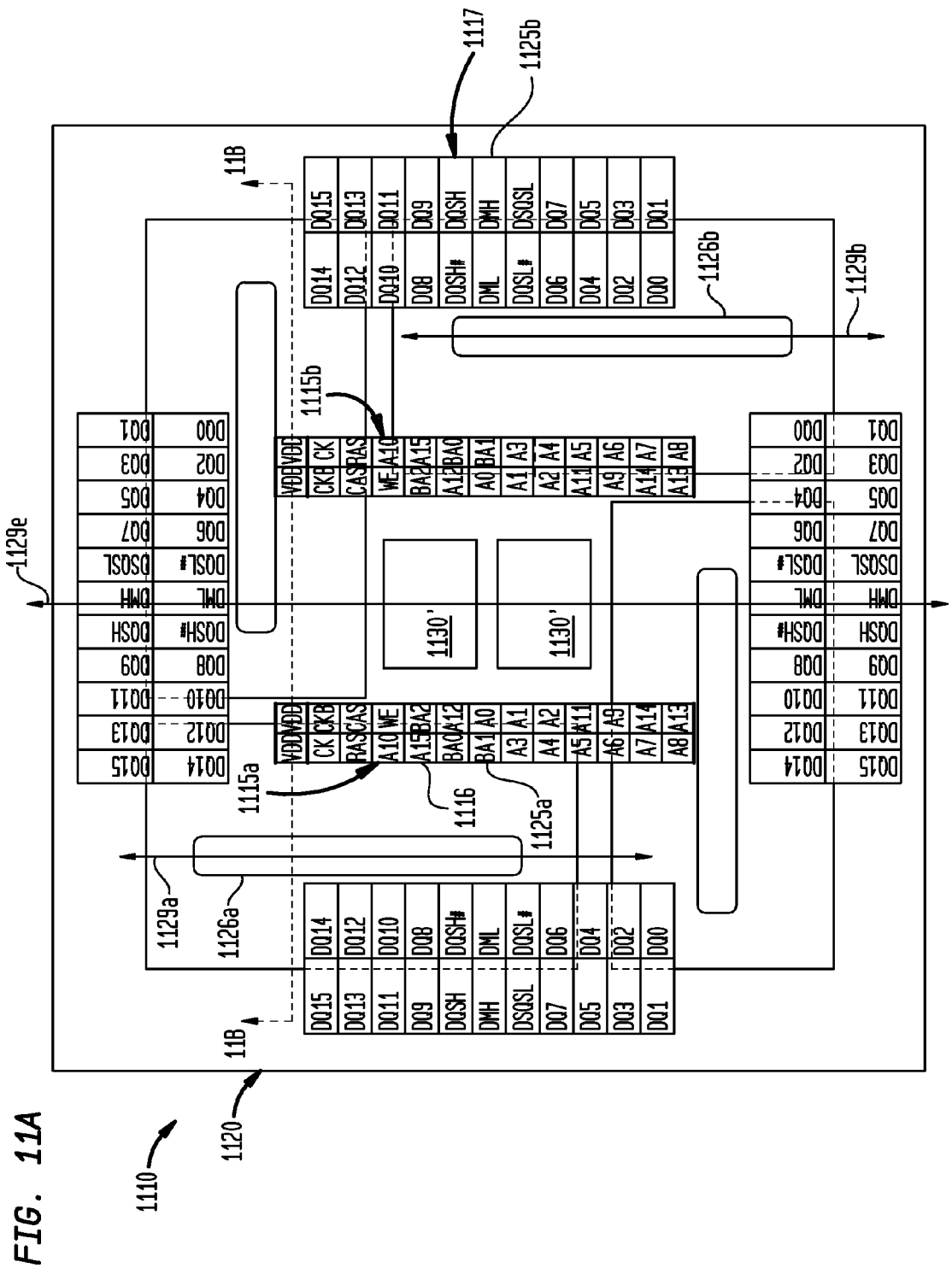
FIG. 11A is yet another variation of the microelectronic package of FIG. 10A having two grids of first terminals, each grid arranged in two columns.

FIG. 11A illustrates a variation of the embodiment described above relative to FIG. 10A, in which the first terminals 1125a of the microelectronic package 1110 are arranged in first and second parallel grids 1115a and 1115b, each grid having two adjacent columns 1116 of the first terminals. In this embodiment, each of the first and second grids 1115a and 1115b can be configured to carry all of the same signals, and the positions of corresponding ones of the terminals 1125a in the first and second grids are shown mirrored about an intermediate axis 1129e between the first and second grids, the intermediate axis being parallel to the first and second axes 1129a and 1129b of the apertures 1126a and 1126b.

In one example, one or more buffering chips 1130' can be mounted to the substrate 1120 adjacent to one another, each buffering chip having a surface 1131' facing the first surface 1121 (FIG. 11A) or the second surface 1122 of the substrate 1120. Such buffering chips 1130' can be flip-chip bonded to electrically conductive contacts exposed at the first surface 1121 of the substrate 1120. In such an embodiment having four microelectronic elements 1130, each of the one or more buffering chips 1130' can be electrically connected to two respective ones of the microelectronic elements. In a particular embodiment, one or more of the chips 1130' can be a decoupling capacitor. One or more decoupling capacitors 1130' can be disposed between the microelectronic elements 1130 instead of or in addition to the aforementioned buffering chips. Such decoupling capacitors can be electrically connected to internal power and ground buses inside the microelectronic package 1110.

Figure 11B:
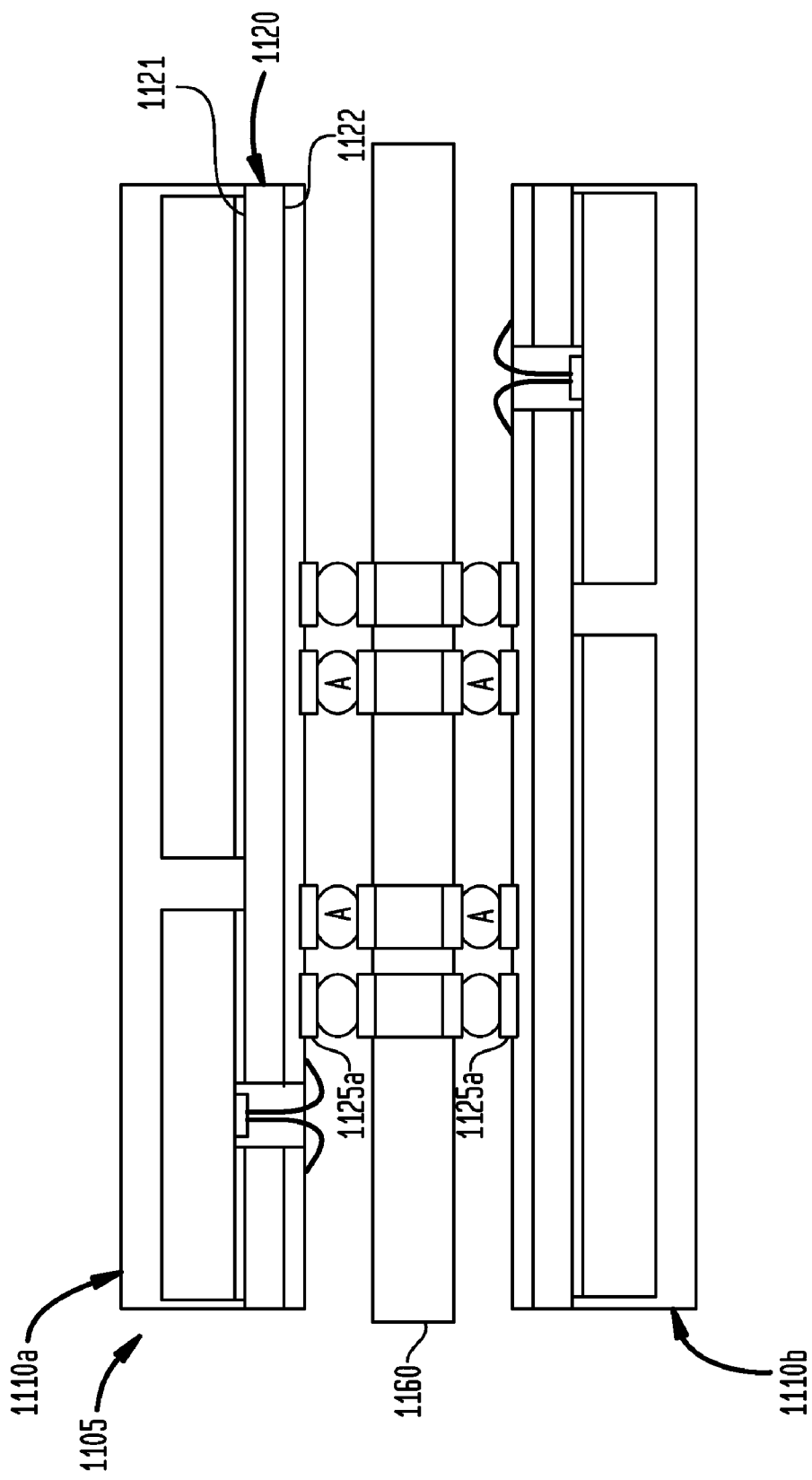
FIG. 11B is a possible side sectional view of a microelectronic assembly including two microelectronic packages as shown in FIG. 11A, taken along the line 11B-11B of FIG. 11A.

A potential advantage of the embodiment of FIG. 11A can be seen in FIG. 11B, which shows a microelectronic assembly 1105 that can include two or more microelectronic packages 1110 that can be mounted to a common circuit panel 1160. As shown in FIG. 11B, corresponding first terminals 1125a in each of the first and second microelectronic packages 1110a and 1110b can be arranged in a common vertical plane, which can allow at least some of the electrical connections through the circuit panel 1160 between the first terminals 1125a of the first and second microelectronic packages 1110a and 1110b to have an electrical length of approximately a thickness of the circuit panel.

Figure 11C:
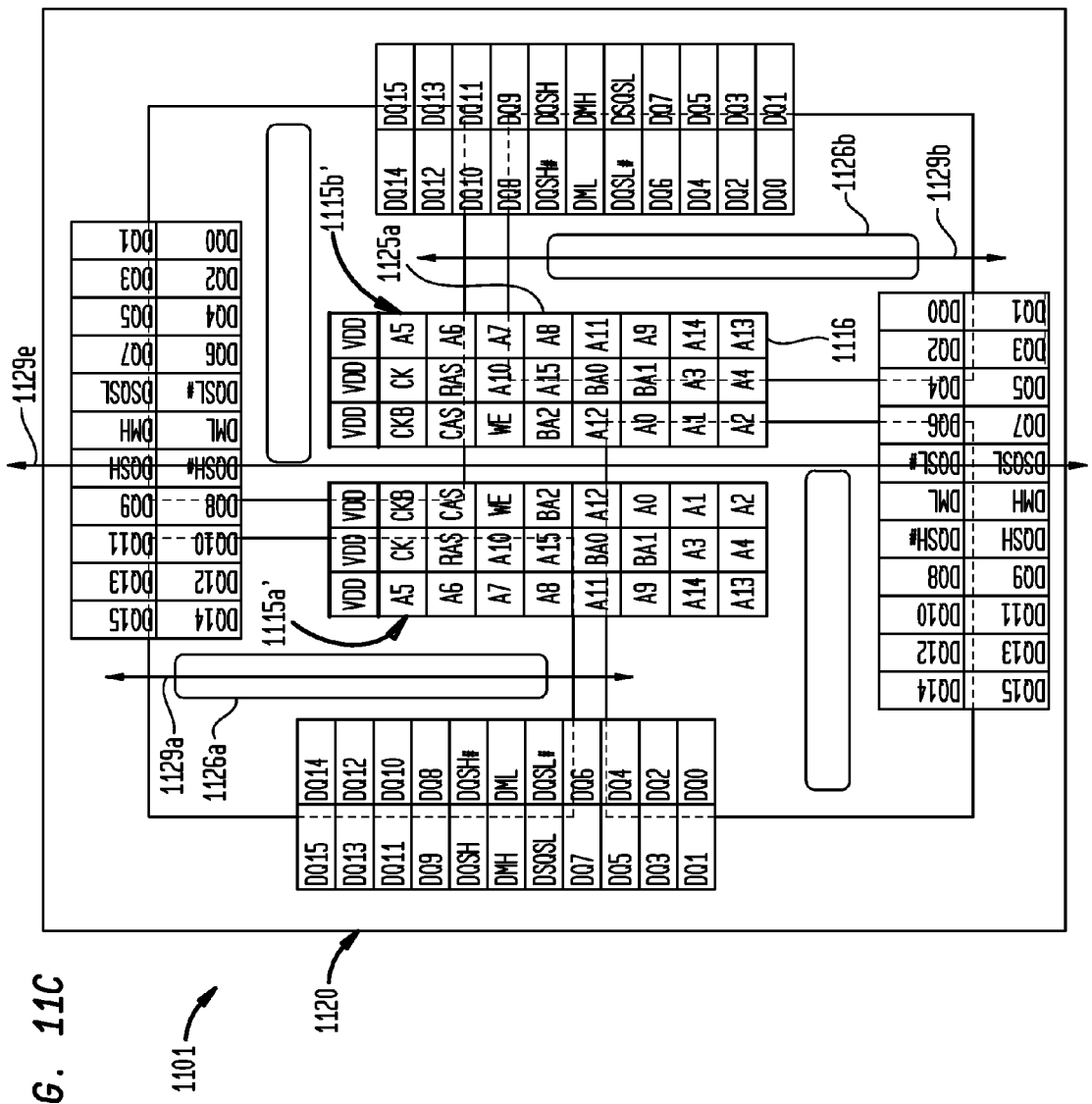
FIG. 11C is a variation of the microelectronic package of FIG. 11A having two grids of first terminals, each grid arranged in three columns.
Figure 11D:
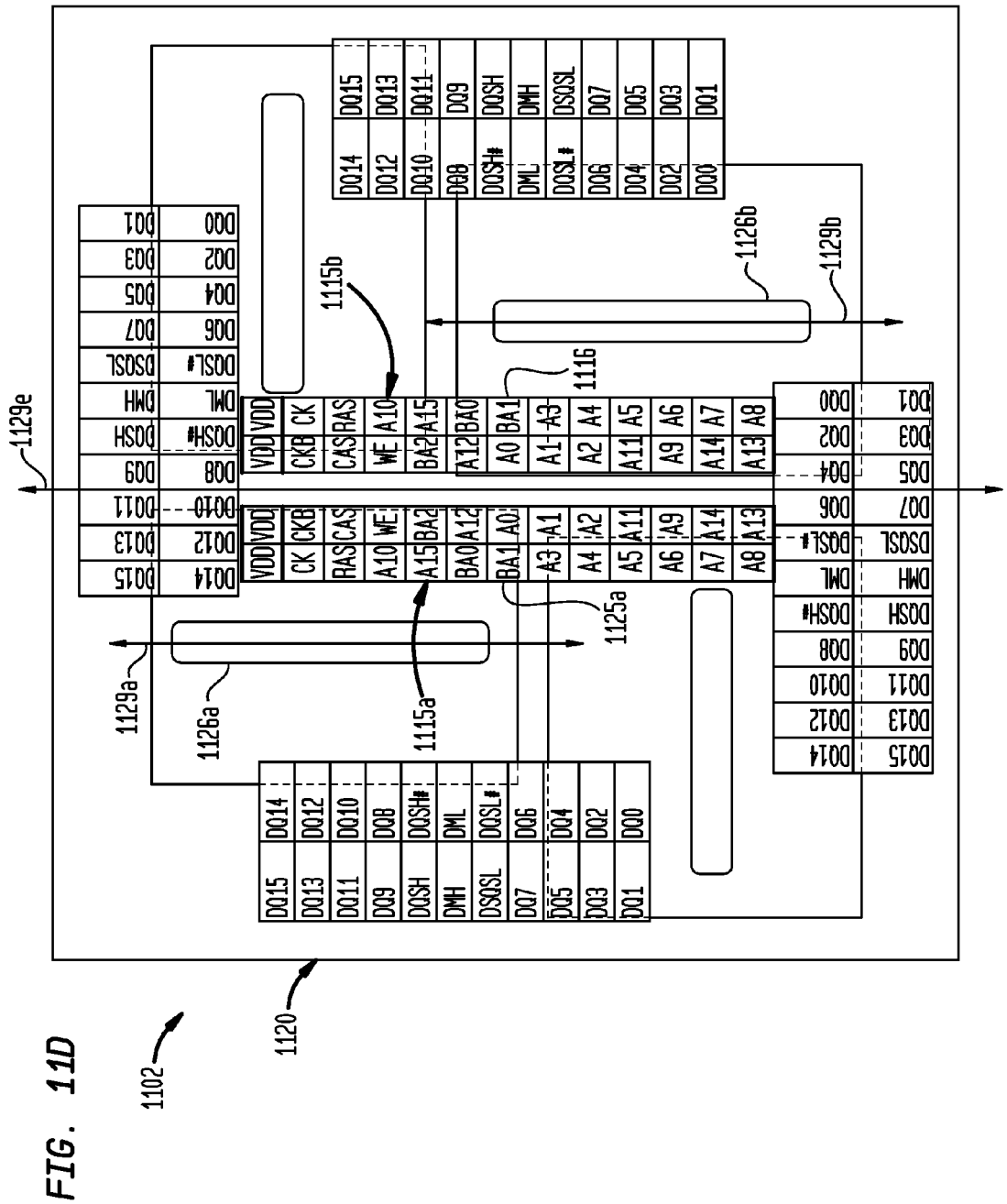
FIG. 11D is another variation of the microelectronic package of FIG. 11A having an alternate layout of the microelectronic elements.

FIGS. 11C and 11D show variations of the embodiments of the microelectronic packages shown in FIGS. 10C and 10D, respectively. The microelectronic package 1101 shown in FIG. 11C is the same as the microelectronic package 1001 shown in FIG. 10C, except that the microelectronic package 1101 has two parallel grids 1115a' and 1115b' each having three parallel columns 1116. The first and second grids 1115a' and 1115b' can be mirrored about an intermediate axis 1129e between the first and second grids, the intermediate axis being parallel to the first and second axes 1129a and 1129b of the first and second apertures 1126a and 1126b.

The microelectronic package 1102 shown in FIG. 11D is the same as the microelectronic package 1002 shown in FIG. 10D, except that the microelectronic package 1102 has two parallel grids 1115a and 1115b each having two parallel columns 1116. The first and second grids 1115a and 1115b can be mirrored about an intermediate axis 1129e between the first and second grids, the intermediate axis being parallel to the first and second axes 1129a and 1129b of the first and second apertures 1126a and 1126b.

Figure 12:
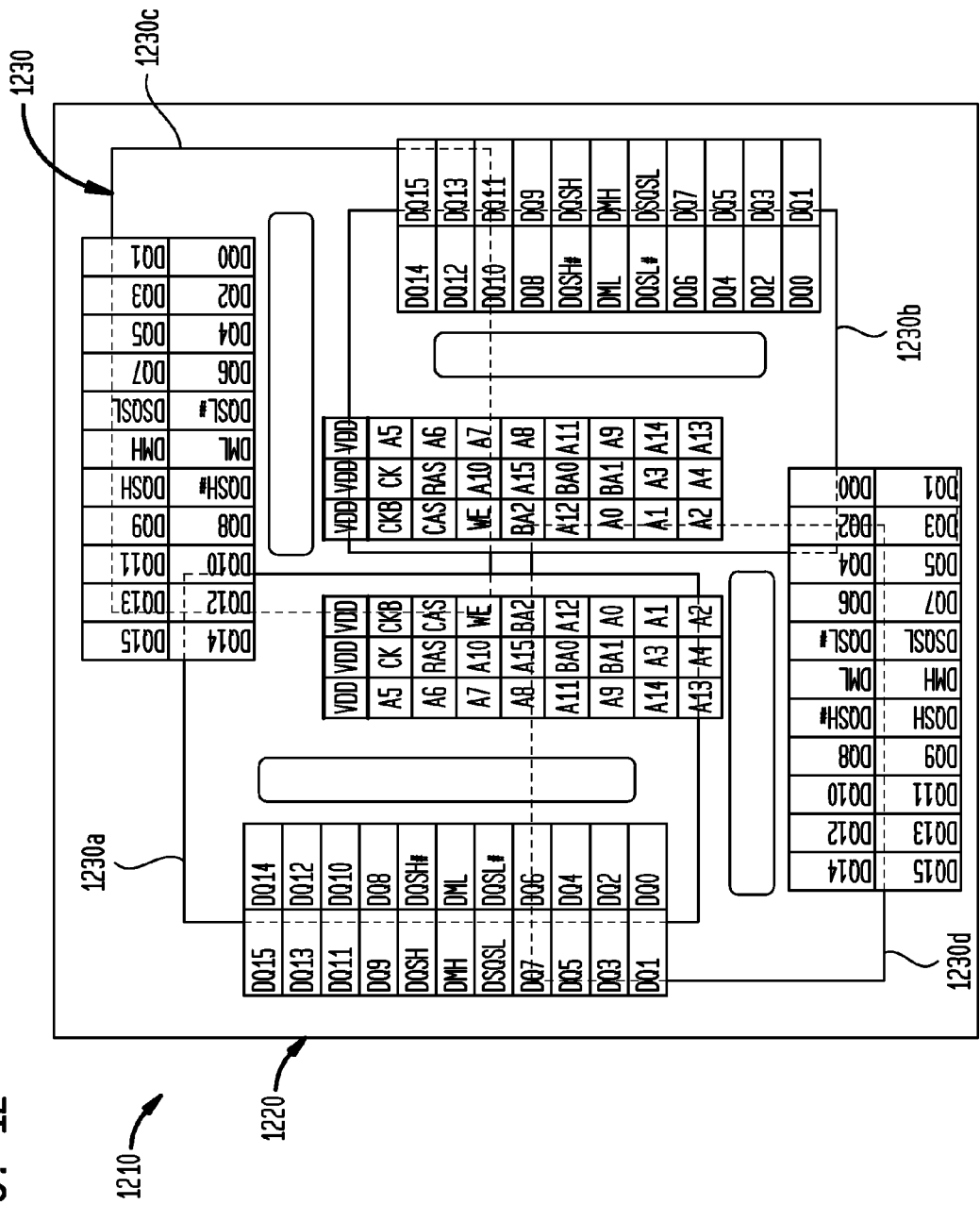
FIG. 12 is another variation of the microelectronic package of FIG. 10A having an alternate layout of the microelectronic elements.

FIG. 12 shows a variation of the embodiment of the microelectronic package shown in FIG. 11C. The microelectronic package 1210 shown in FIG. 12 is the same as the microelectronic package 1101 shown in FIG. 11C, except that the microelectronic package 1210 has microelectronic elements 1230, some of which can be stacked relative to one another. For example, in the embodiment shown in FIG. 12, the front surface 1231 of each of first and second microelectronic elements 1230a, 1230b can confront the first surface 1221 of the substrate 1220, and at least a portion of the front surface 1231 of each of third and fourth microelectronic elements 1230c, 1230d can overlie a rear surface 1233 of each of the first and second microelectronic elements.

Figure 13A:
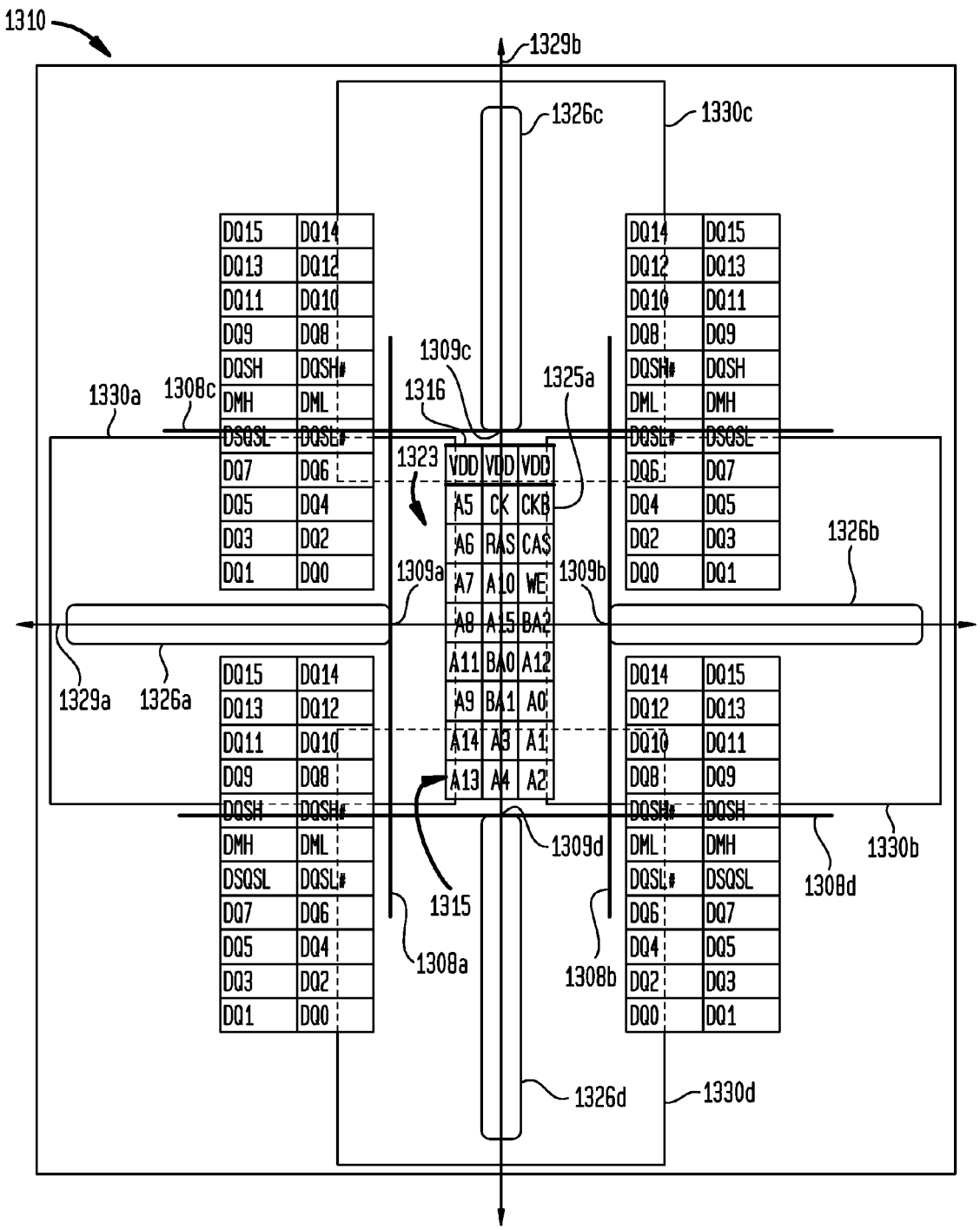
FIG. 13A is a diagrammatic bottom plan view of a microelectronic package according to another embodiment having four microelectronic elements in another configuration.

FIG. 13A illustrates a variation of the embodiment described above relative to FIG. 5A, in which the microelectronic elements and apertures are rotated ninety degrees. The microelectronic package 1310 is the same as the microelectronic package 10 shown in FIG. 5A, except that the first and second apertures 1326a, 1326b have a first axis 1329a extending in a direction of the lengths of the first and second apertures, and the third and fourth apertures 1329c, 1329d have a second axis 1329b extending in a direction of the lengths of the third and fourth apertures. Also, first terminals 1325a are disposed in a single grid 1315 having three parallel columns 1316, rather than two columns as shown in FIG. 5A. Each of the microelectronic elements 1330 are oriented such that a plurality of contacts at the surface of each microelectronic element is aligned with at least one of the apertures 1326.

The first terminals 1325a are disposed in a central region 1323 of the second surface 1322 of the substrate 1320, the central region being disposed between parallel lines 1308a and 1308b that are tangent to adjacent ends 1309a, 1309b of the respective first and second apertures 1326a, 1326b. In one example, the parallel lines 1308a, 1308b can be transverse to the respective first and second axes 1329a, 1329b. In a particular example, the parallel lines 1308a, 1308b can be orthogonal to the respective first and second axes 1329a, 1329b.

In the embodiment shown in FIG. 13A, the central region 1323 of the second surface 1322 of the substrate 1320 can also be bounded by parallel lines 1308c and 1308d that are tangent to adjacent ends 1309c, 1309d of the respective third and fourth apertures 1326c, 1326d. In one example, the central region 1323 can be disposed within a rectangular area of the second surface 1322 of the substrate 1320 not extending beyond any of the adjacent ends of the apertures 1309a, 1309b, 1309c, and 1309d.

FIG. 13B illustrates a variation of the embodiment described above relative to FIG. 13B, in which the first terminals 1325a of the microelectronic package 1310' are arranged in first and second parallel grids 1315a and 1315b, each grid having two adjacent columns 1316 of the first terminals. In this embodiment, each of the first and second grids 1315a and 1315b can be configured to carry all of the same signals, and the positions of corresponding ones of the terminals 1325a in the first and second grids are shown mirrored about the second axis 1329b, such that one of the grids is disposed on each side of the second axis. In a particular embodiment (not shown), the positions of corresponding ones of the terminals 1325a in the first and second grids 1315a, 1315b can be mirrored about an intermediate axis that is not coincident with the first axis 1329a.

Figure 13B:
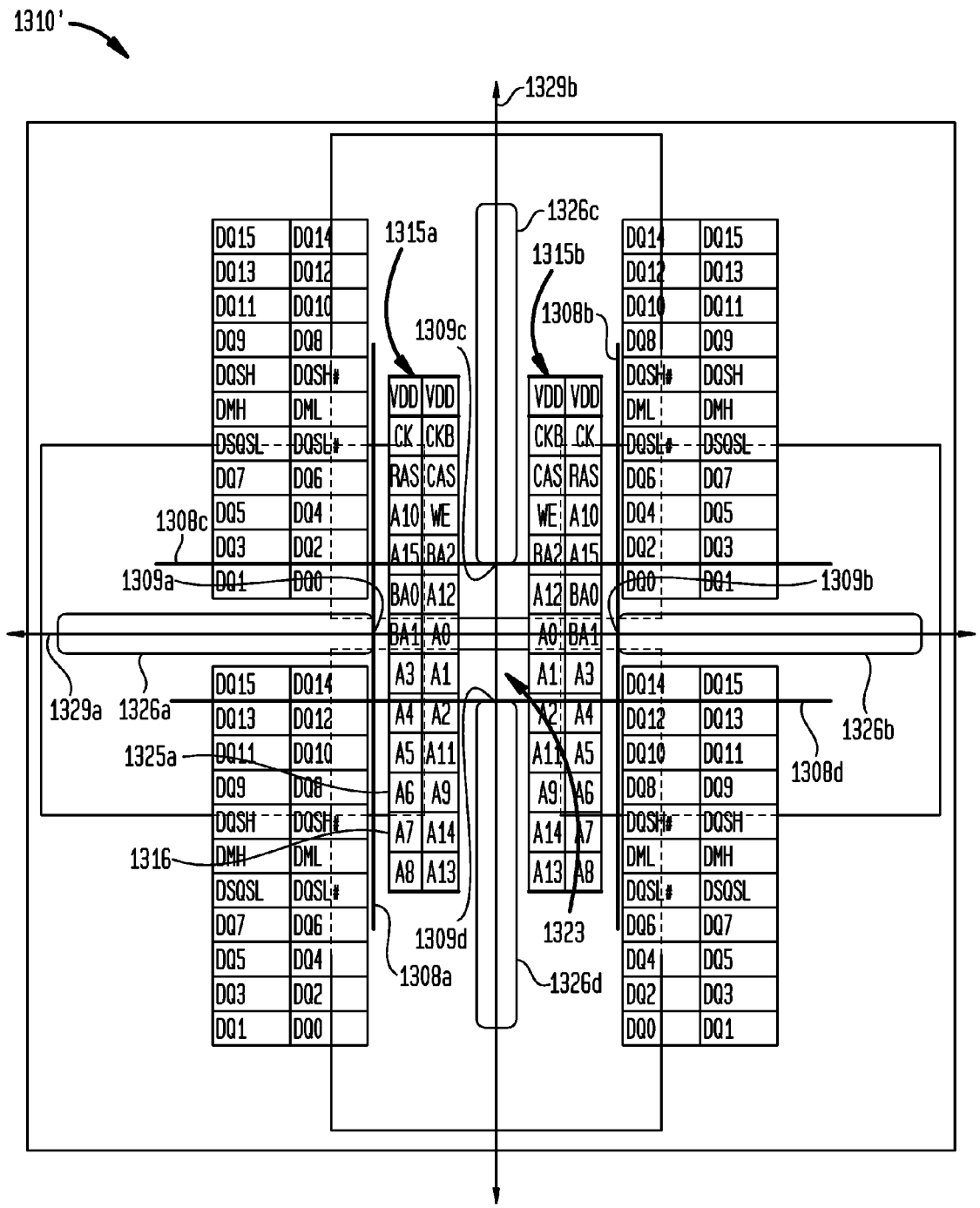
FIG. 13B is a variation of the microelectronic package of FIG. 13A having two grids of first terminals, each grid arranged in two columns.

In the embodiment shown in FIG. 13B, the first terminals 1325a are disposed in a central region 1323 of the second surface 1322 of the substrate 1320, the central region being disposed between parallel lines 1308a and 1308b that are tangent to adjacent ends 1309a, 1309b of the respective first and second apertures 1326a, 1326b. The grids 1315a and 1315b (and also the central region 1323) can extend beyond the parallel lines 1308c and 1308d that are tangent to adjacent ends 1309c, 1309d of the respective third and fourth apertures 1326c, 1326d.

Figure 14A:
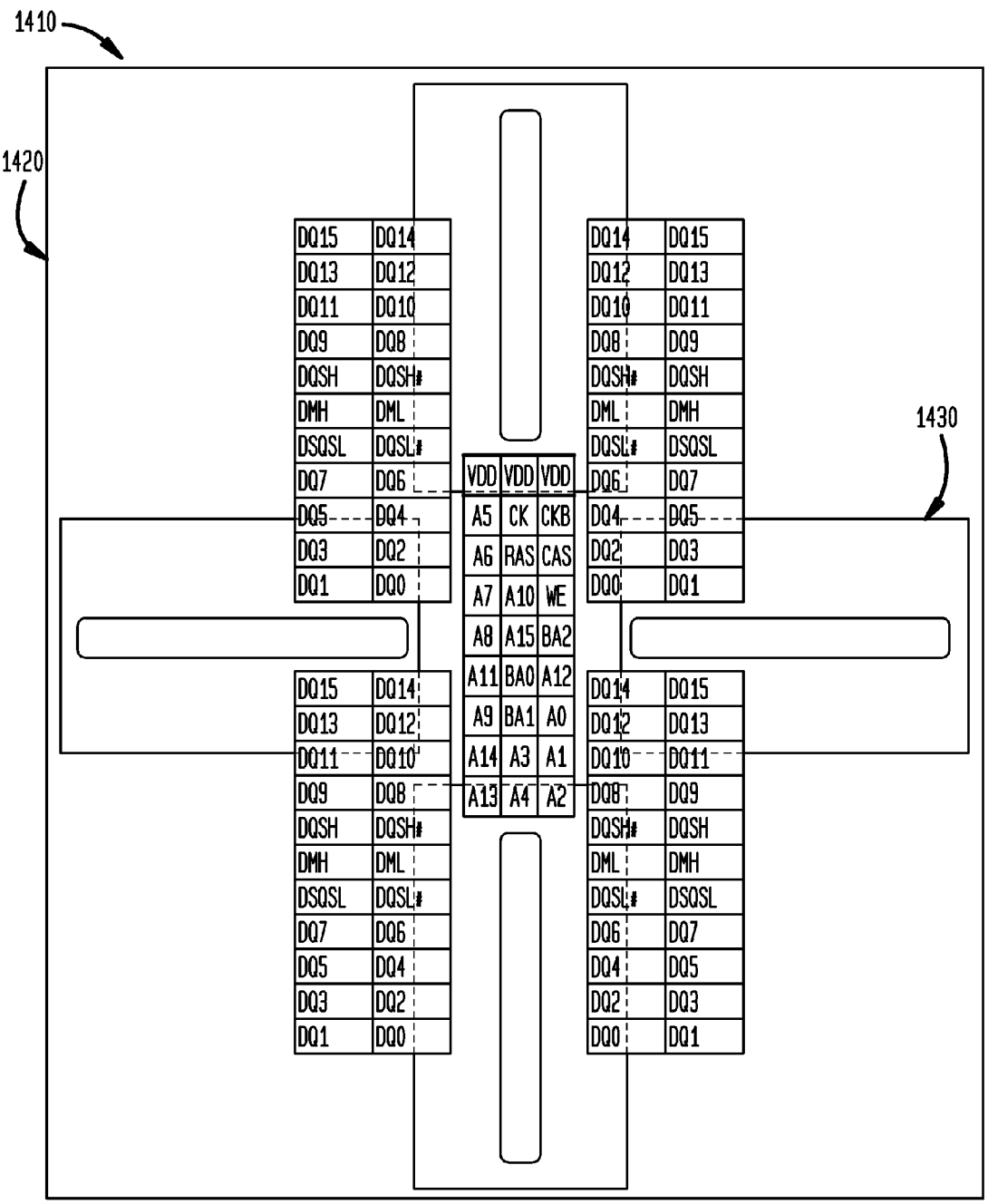
FIG. 14A is a diagrammatic bottom plan view of a microelectronic package according to yet another embodiment having four microelectronic elements in another configuration.
Figure 14B:
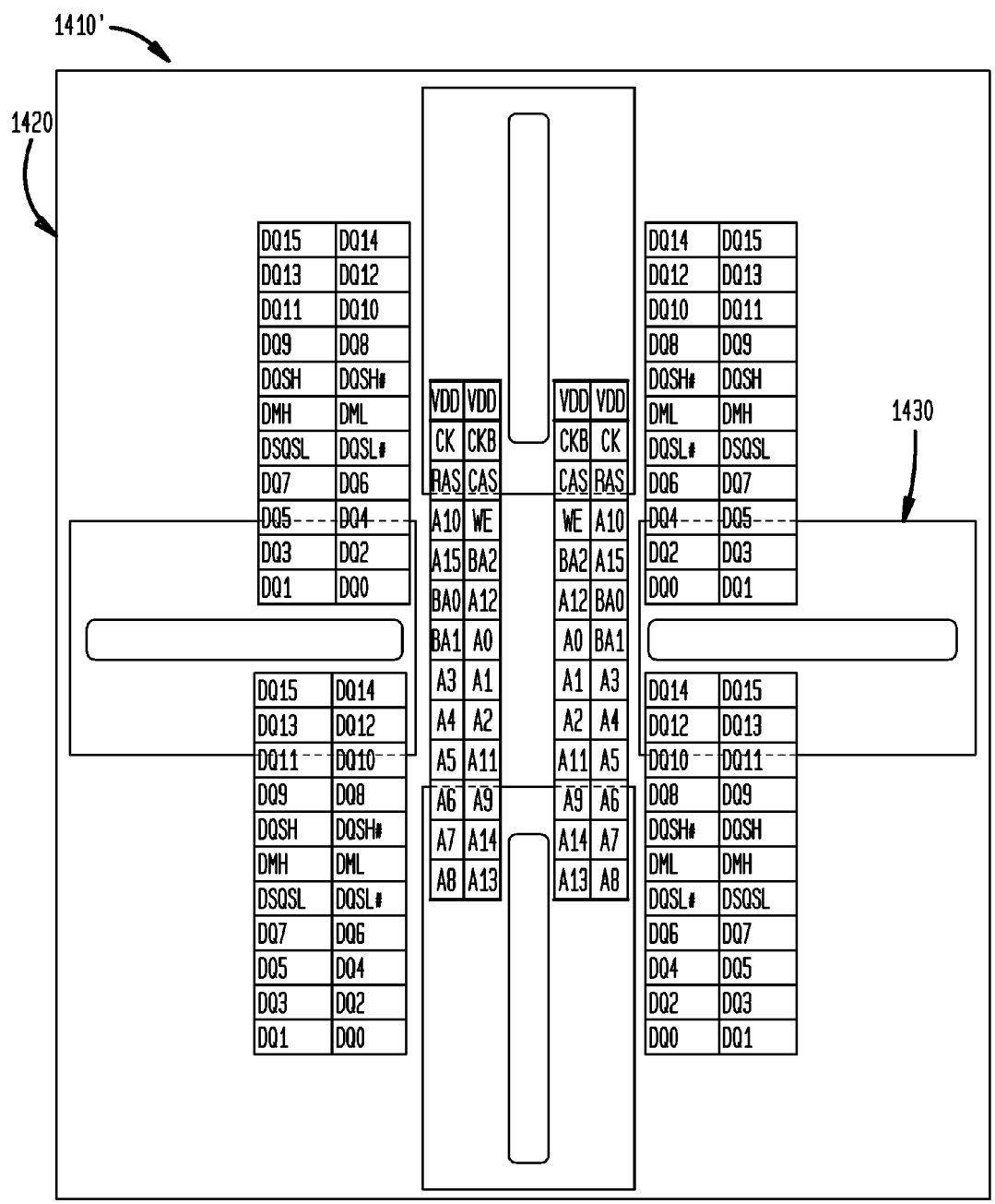
FIG. 14B is a variation of the microelectronic package of FIG. 14A having two grids of first terminals, each grid arranged in two columns.

FIGS. 14A and 14B show variations of the embodiments of the microelectronic packages shown in FIGS. 13A and 13B, respectively. The microelectronic package 1410 shown in FIG. 14A is the same as the microelectronic package 1310 shown in FIG. 14A, except that the microelectronic elements 1430 of the microelectronic package 1410 each have front surfaces arranged in a single plane parallel to the first surface of the substrate 1420. The microelectronic package 1410' shown in FIG. 14B is the same as the microelectronic package 1310' shown in FIG. 14A, except that the microelectronic elements 1430 of the microelectronic package 1410' each have front surfaces arranged in a single plane parallel to the first surface of the substrate 1420.

FIG. 14C shows a variation of the embodiment of the microelectronic packages shown in FIG. 14B. The microelectronic package 1401 shown in FIG. 14C has first terminals 1425a arranged in four parallel grids 1415, each grid having two parallel columns 1416, each grid 1415 mirrored with respect to at least one additional grid 1415 about the first axis 1429a and/or about the second axis 1429b. In one example (not shown), each grid 1415 can be mirrored with respect to one or more of the other grids 1415 about any other intermediate axes extending between pairs of the grids 1415. Each of the grids 1417 of second terminals 1425b can also be mirrored with respect to another one of the grids 1417 about the first axis 1429a and/or the second axis 1429b, or each grid 1417 can be mirrored with respect to one or more of the other grids 1417 about any other intermediate axes extending between pairs of the grids 1417. In one example, the particular arrangement of four mirrored grids of first terminals 1425a and/or second terminals 1425b shown in FIG. 14C can be used with the arrangement of overlying microelectronic elements shown in FIG. 13B.

Figure 15A:
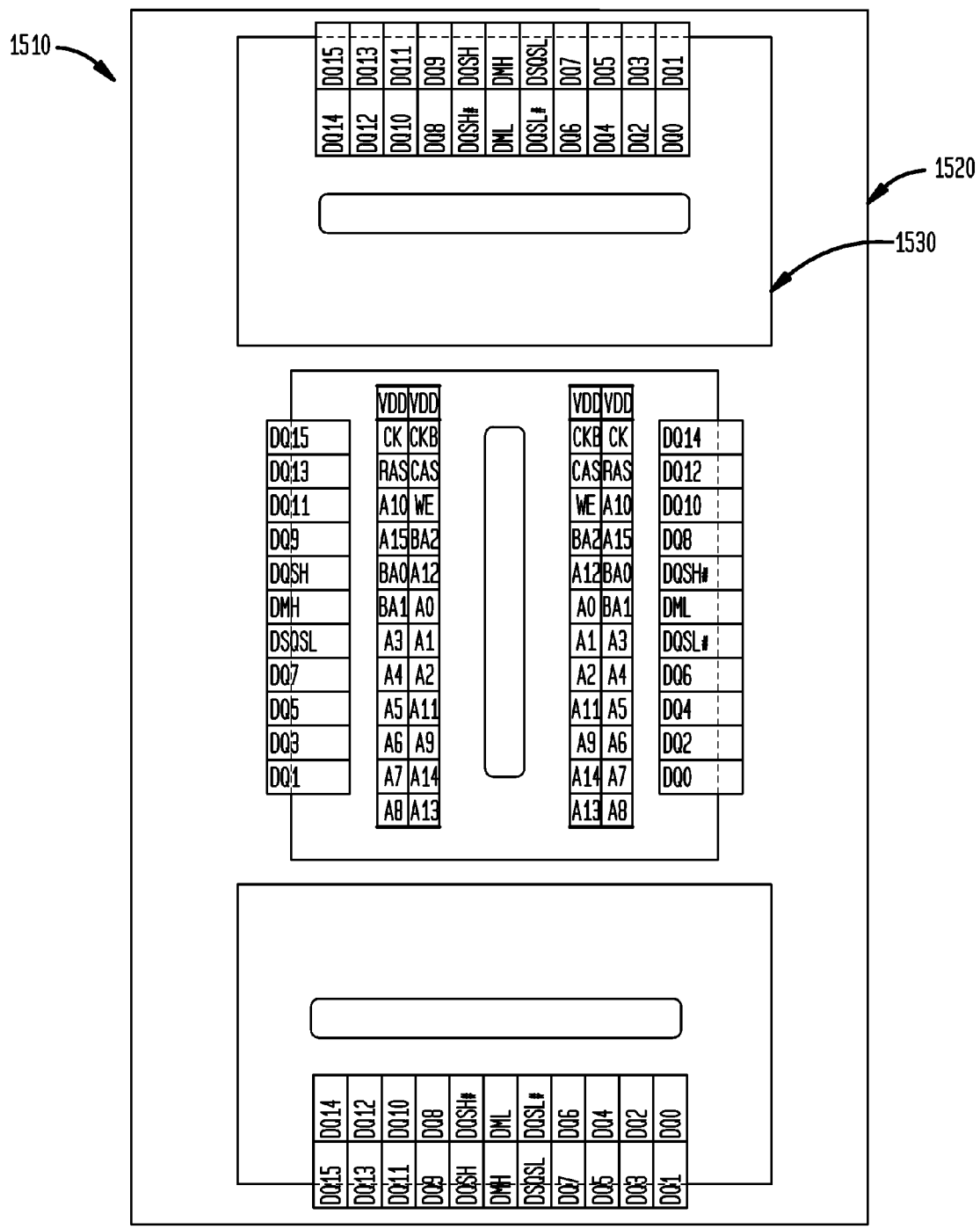
FIG. 15A is a diagrammatic bottom plan view of a microelectronic package according to still another embodiment having three microelectronic elements oriented in a single plane.

FIG. 15A shows a variation of the embodiment of the microelectronic package shown in FIG. 9A. The microelectronic package 1510 shown in FIG. 15A is the same as the microelectronic package 910 shown in FIG. 9A, except that the microelectronic elements 1530 of the microelectronic package 1510 each have front surfaces 1531 arranged in a single plane parallel to the first surface 1521 of the substrate 1520.

Figure 15B:
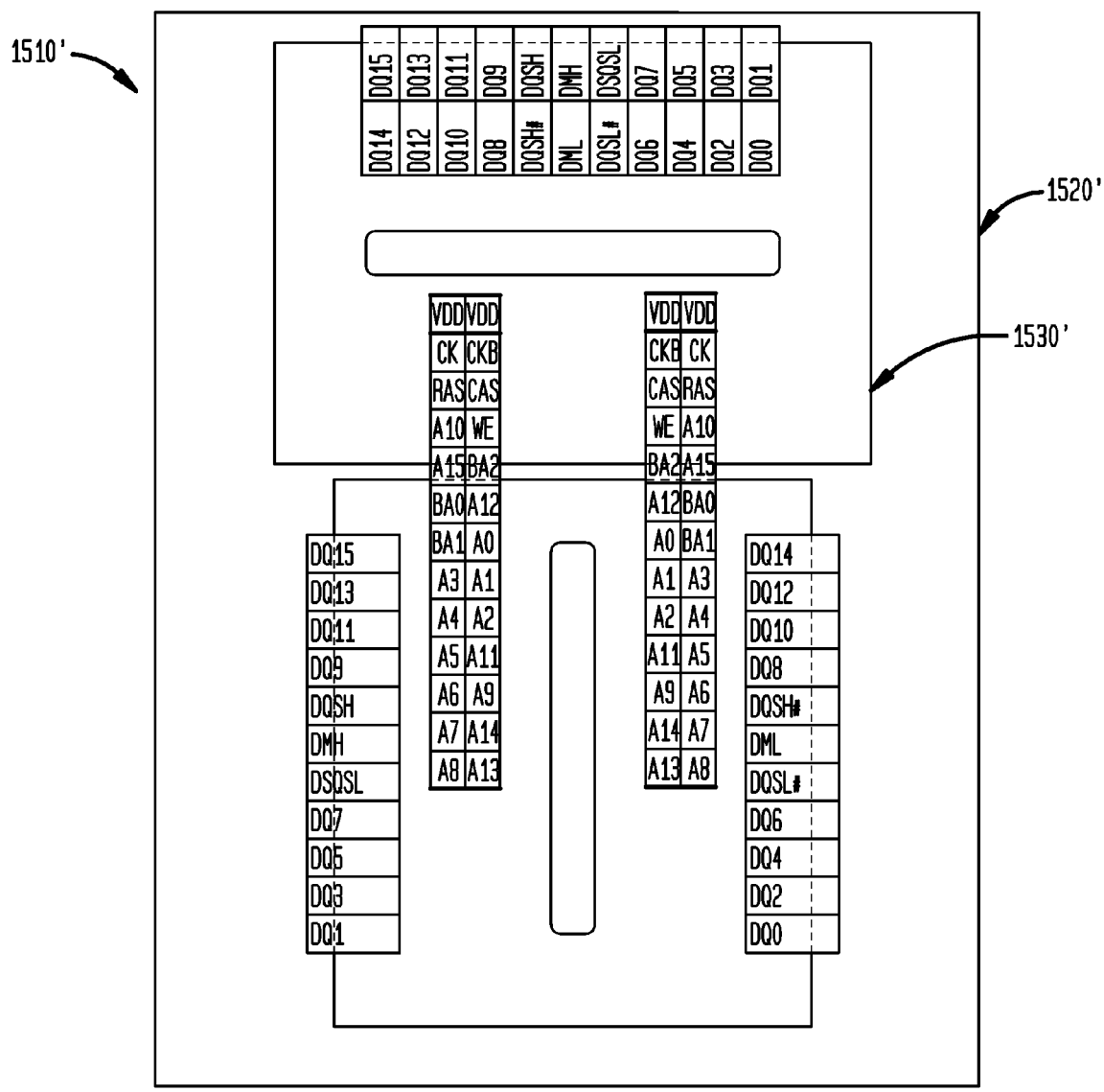
FIG. 15B is a diagrammatic bottom plan view of a microelectronic package according to another embodiment having two microelectronic elements oriented in a single plane.

FIG. 15B shows a variation of the embodiment of the microelectronic package shown in FIG. 9B. The microelectronic package 1510' shown in FIG. 15B is the same as the microelectronic package 910' shown in FIG. 9A, except that the microelectronic elements 1530' of the microelectronic package 1510' each have front surfaces 1531 arranged in a single plane parallel to the first surface 1521 of the substrate 1520'.

Figure 15C:
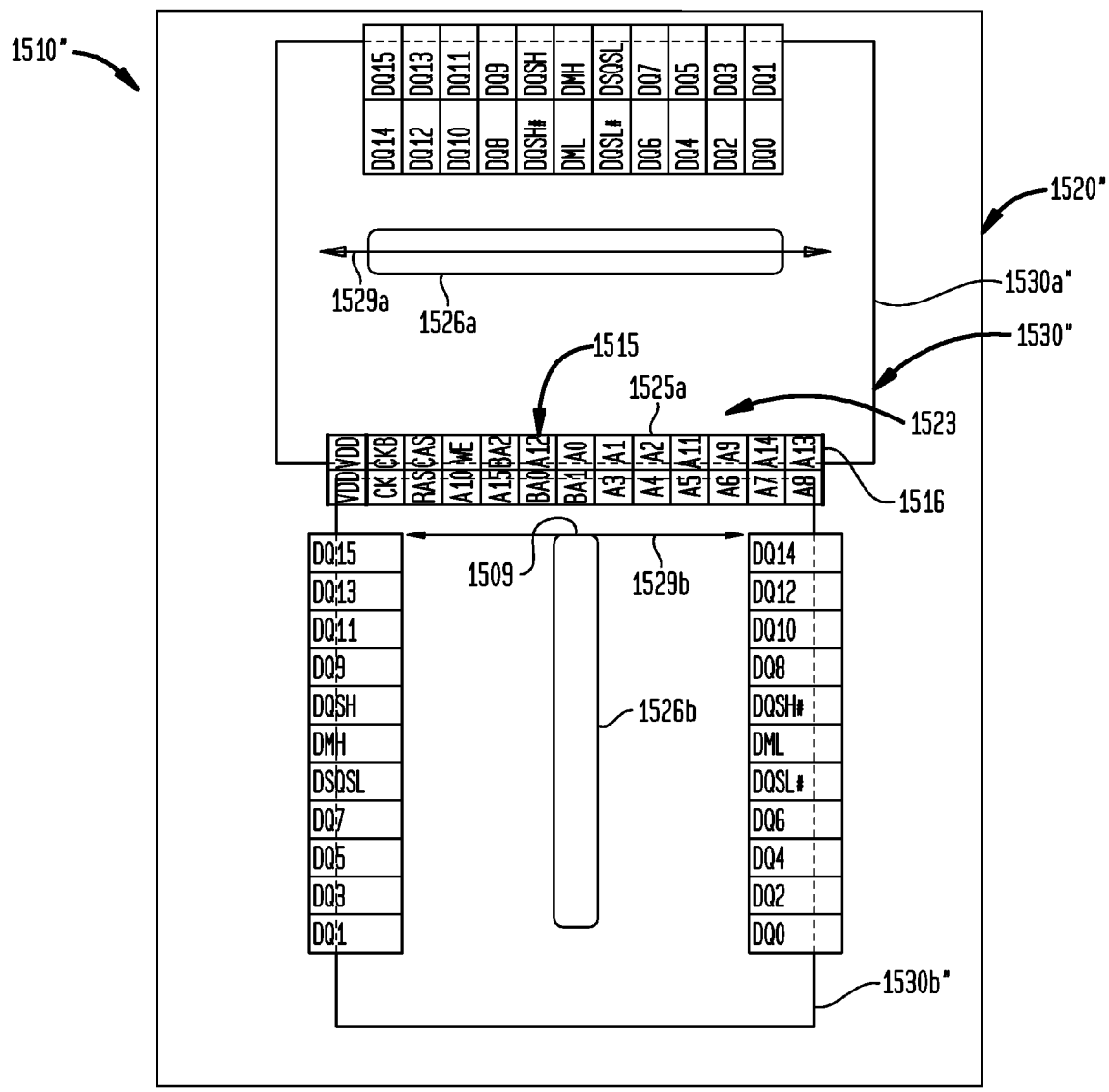
FIG. 15C is a variation of the microelectronic package of FIG. 15B having a single grid of first terminals arranged in two columns.

FIG. 15C shows a variation of the embodiment of the microelectronic package shown in FIG. 15B. The microelectronic package 1510" shown in FIG. 15C is the same as the microelectronic package 1510' shown in FIG. 15B, except that the first terminals 1525a of the microelectronic package 1510" are arranged in a single grid 1515 having two adjacent columns 1516 of the first terminals.

As can be seen in FIG. 15C, the substrate 1520" can have two apertures 1526 extending between the first and second opposed surfaces thereof. The longest dimension of a first aperture 1526a of the apertures 1526 can define a first axis 1529a. A second aperture 1526b of the apertures 1526 can have a long dimension extending in a direction transverse to the first axis 1529a, and the second aperture can have an end 1509 adjacent the first aperture. The end 1509 of the second aperture 1526b can define a second axis 1529b parallel to the first axis 1529a. In one example, the second axis 1529b can be tangent to the end 1509 of the second aperture 1526b. The first and second axes 1529a and 1529b can define a central region 1523 of the second surface of the substrate 1520 located between the first and second axes. In this embodiment, the grid 1515 that includes the first terminals 1525*a* can be exposed at the second surface of the substrate 1520 in the central region 1523 thereof.

Figure 16:
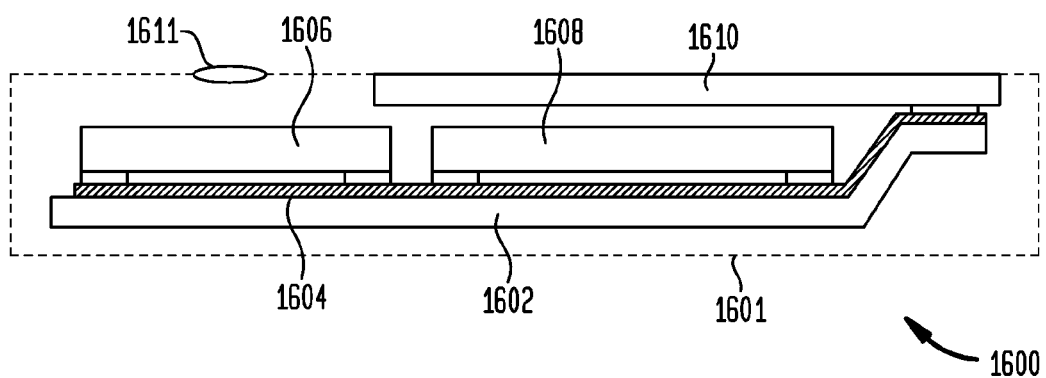
FIG. 16 is a schematic depiction of a system according to one embodiment including a plurality of modules.

The microelectronic packages and microelectronic assemblies described above with reference to FIGS. 5A through 15C can be utilized in construction of diverse electronic systems, such as the system 1600 shown in FIG. 16. For example, the system 1600 in accordance with a further embodiment of the invention includes a plurality of modules or components 1606 such as the microelectronic packages and/or microelectronic assemblies as described above in conjunction with other electronic components 1608 and 1610.

In the exemplary system 1600 shown, the system can include a circuit panel, motherboard, or riser panel 1602 such as a flexible printed circuit board, and the circuit panel can include numerous conductors 1604, of which only one is depicted in FIG. 16, interconnecting the modules or components 1606 with one another. Such a circuit panel 1602 can transport signals to and from each of the microelectronic packages and/or microelectronic assemblies included in the system 1600. However, this is merely exemplary; any suitable structure for making electrical connections between the modules or components 1606 can be used.

In a particular embodiment, the system 1600 can also include a processor such as the semiconductor chip 1608, such that each module or component 1606 can be configured to transfer a number N of data bits in parallel in a clock cycle, and the processor can be configured to transfer a number M of data bits in parallel in a clock cycle, M being greater than or equal to N.

In one example, the system 1600 can include a processor chip 1608 that is configured to transfer thirty-two data bits in parallel in a clock cycle, and the system can also include four modules 1606 such as the microelectronic package 10 described with reference to FIG. 9B, each module 1606 configured to transfer eight data bits in parallel in a clock cycle (i.e., each module 1606 can include first and second microelectronic elements, each of the two microelectronic elements being configured to transfer four data bits in parallel in a clock cycle).

In another example, the system 1600 can include a processor chip 1608 that is configured to transfer sixty-four data bits in parallel in a clock cycle, and the system can also include four modules 1606 such as the microelectronic package described with reference to FIG. 5A, each module 1606 configured to transfer sixteen data bits in parallel in a clock cycle (i.e., each module 1606 can include four microelectronic elements, each of the four microelectronic elements being configured to transfer four data bits in parallel in a clock cycle).

In the example depicted in FIG. 16, the component 1608 is a semiconductor chip and component 1610 is a display screen, but any other components can be used in the system 1600. Of course, although only two additional components 1608 and 1610 are depicted in FIG. 16 for clarity of illustration, the system 1600 can include any number of such components.

Modules or components 1606 and components 1608 and 1610 can be mounted in a common housing 1601, schematically depicted in broken lines, and can be electrically interconnected with one another as necessary to form the desired circuit. The housing 1601 is depicted as a portable housing of the type usable, for example, in a cellular telephone or personal digital assistant, and screen 1610 can be exposed at the surface of the housing. In embodiments where a structure 1606 includes a light-sensitive element such as an imaging chip, a lens 1611 or other optical device also can be provided for routing light to the structure. Again, the simplified system shown in FIG. 16 is merely exemplary; other systems, including systems commonly regarded as fixed structures, such as desktop computers, routers and the like can be made using the structures discussed above.

In any or all of the microelectronic packages described in the foregoing, the rear surface of one or more of the microelectronic elements can be at least partially exposed at an exterior surface of the microelectronic package after completing fabrication. Thus, in the microelectronic package 10 described above with respect to FIG. 5A, the rear surface of one or more of the microelectronic elements can be partially or fully exposed at an exterior surface of an encapsulant in the completed microelectronic package 10.

In any of the embodiments described above, the microelectronic packages and microelectronic assemblies may include a heat spreader partly or entirely made of any suitable thermally conductive material. Examples of suitable thermally conductive material include, but are not limited to, metal, graphite, thermally conductive adhesives, e.g., thermally-conductive epoxy, a solder, or the like, or a combination of such materials. In one example, the heat spreader can be a substantially continuous sheet of metal.

In one embodiment, the heat spreader can include a metallic layer disposed adjacent to one or more of the microelectronic elements. The metallic layer may be exposed at a rear surface of the microelectronic package. Alternatively, the heat spreader can include an overmold or an encapsulant covering at least the rear surface of one or more of the microelectronic elements. In one example, the heat spreader can be in thermal communication with at least one of the front surface and rear surface of one or more of the microelectronic elements such as the microelectronic elements 30*a*, 30*b*, 30*c*, and 30*d* shown in FIG. 5A. In some embodiments, the heat spreader can extend between adjacent edges of adjacent ones of the microelectronic elements. The heat spreader can improve heat dissipation to the surrounding environment.

In a particular embodiment, a pre-formed heat spreader made of metal or other thermally conductive material may be attached to or disposed on the rear surface of one or more of the microelectronic elements with a thermally conductive material such as thermally conductive adhesive or thermally conductive grease. The adhesive, if present, can be a compliant material that permits relative movement between the heat spreader and the microelectronic element to which it is attached, for example, to accommodate differential thermal expansion between the compliantly attached elements. The heat spreader may be a monolithic structure. Alternatively, the heat spreader may include multiple spreader portions spaced apart from one another. In a particular embodiment, the heat spreader may be or include a layer of solder joined directly to at least a portion of a rear surface of one or more of microelectronic elements such as the microelectronic elements 30*a*, 30*b*, 30*c*, and 30*d* shown in FIG. 5A.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic assembly, comprising:
   first and second microelectronic packages, each of the first and second microelectronic packages including:
      a substrate having first and second opposed surfaces and first, second, and third apertures extending between the first and second surfaces, the apertures having first, second, and third axes extending in directions of the lengths of the respective apertures, the first and second axes being parallel to one another, the third axis being transverse to the first and second axes, the second surface having a central region disposed between the first and second axes;
      first, second, and third microelectronic elements each having a surface facing the first surface of the substrate and a plurality of contacts at the surface of the respective microelectronic element aligned with at least one of the apertures, each microelectronic element embodying a greater number of active devices to provide memory storage array function than any other function;
      a plurality of terminals exposed at the second surface in the central region thereof, the terminals configured for connecting the microelectronic package to at least one component external to the microelectronic package; and
      leads electrically connected between the contacts of each microelectronic element and the terminals, each lead having a portion aligned with at least one of the apertures,
      wherein the terminals are configured to carry sufficient address information usable by circuitry within the microelectronic package to determine an addressable memory location from among all the available addressable memory locations of a memory storage array within at least one of the first, second or third microelectronic elements; and
   a circuit panel having first and second opposed surfaces and panel contacts exposed at each of the first and second opposed surfaces,
   wherein at least some of the terminals of the first and second microelectronic packages are mounted to the panel contacts of the respective first and second surfaces and are electrically connected therethrough.

2. A microelectronic assembly as claimed in claim 1, wherein the terminals of each microelectronic package are configured to carry all of the address information usable by the circuitry within the respective microelectronic package to determine the addressable memory location.

3. A microelectronic assembly as claimed in claim 1, wherein the terminals of each microelectronic package are configured to carry all of the command signals transferred to the respective microelectronic package, the command signals being write enable, row address strobe, and column address strobe signals.

4. A microelectronic assembly as claimed in claim 1, wherein the terminals of each microelectronic package are configured to carry all of the clock signals transferred to the respective microelectronic package, the clock signals being sampling clocks used for sampling the address signals.

5. A microelectronic assembly as claimed in claim 1, wherein the terminals of each microelectronic package are configured to carry all of the bank address signals transferred to the respective microelectronic package.

6. A microelectronic assembly as claimed in claim 1, wherein the circuit panel includes a bus having a plurality of parallel conductors configured to carry all of the address signals transferred to each of the microelectronic packages, the parallel conductors extending in a first direction parallel to the first and second surfaces.

7. A microelectronic assembly as claimed in claim 1, wherein the terminals of each microelectronic package are first terminals and the second surface of each microelectronic package has peripheral regions between the central region and first and second opposed edges extending between the first and second surfaces of the respective substrate, each microelectronic package further comprising a plurality of second terminals exposed at the second surface thereof in at least one of the peripheral regions, the second terminals configured for connecting the respective microelectronic package to at least one external component, at least some of the second terminals being configured to carry signals other than the address signals.

8. A microelectronic assembly as claimed in claim 1, wherein at least some of the leads include wire bonds extending through at least one of the apertures.

9. A microelectronic assembly as claimed in claim 1, wherein the surfaces of the first and second microelectronic elements of each microelectronic package are arranged in a single plane parallel to the first surface of the respective substrate, and wherein the surface of the third microelectronic element of each microelectronic package at least partially overlies a rear surface of at least one of the first and second microelectronic elements of the respective microelectronic package.

10. A microelectronic assembly as claimed in claim 1, wherein the surfaces of all of the microelectronic elements of each microelectronic package are arranged in a single plane parallel to the first surface of the respective substrate.

11. A microelectronic assembly as claimed in claim 1, wherein each of the microelectronic elements includes a dynamic random access memory ("DRAM") integrated circuit chip.

12. A microelectronic assembly as claimed in claim 1, wherein each of the microelectronic elements is functionally and mechanically equivalent to the other ones of the microelectronic elements.

13. A microelectronic assembly as claimed in claim 1, wherein the substrate of each microelectronic package has a fourth aperture having a fourth axis transverse to the first and second axes of the respective microelectronic package and extending in a direction of the length of the fourth aperture, each microelectronic package further comprising:
   a fourth microelectronic element having a surface facing the first surface of the respective substrate, the fourth microelectronic element embodying a greater number of active devices to provide memory storage array function than any other function, the fourth microelectronic element having a plurality of contacts at the surface thereof aligned with at least one of the apertures of the respective substrate; and
   second leads electrically connected between the contacts of the respective fourth microelectronic element and the respective terminals, each of the second leads having a portion aligned with at least one of the apertures.

14. A microelectronic assembly as claimed in claim 1, wherein the terminals of the first and second microelectronic packages are arranged at positions of first and second grids, and wherein the first and second grids are aligned with one another in x and y orthogonal directions parallel to the first and second circuit panel surfaces, the alignment being within a distance equal to a minimum pitch between adjacent terminals of the grids.

15. The microelectronic assembly as claimed in claim 14, wherein the terminals of each grid are arranged in no more than four columns.

16. A microelectronic assembly as claimed in claim 14, wherein the grids of the first and second packages are functionally and mechanically matched.

17. The microelectronic assembly as claimed in claim 14, wherein the grids of the first and second packages overlie at least 90% of one another.

18. A microelectronic assembly as claimed in claim 1, wherein the terminals of each of the first and second microelectronic packages are arranged at positions of first and second grids, and wherein the first grid of the first package and the second grid of the second package are aligned with one another, and wherein the second grid of the first package and the first grid of the second package are aligned with one another, the alignments being in x and y orthogonal directions parallel to the first and second circuit panel surfaces, the alignments being within a distance equal to a minimum pitch between adjacent terminals of the grids.

19. A microelectronic assembly as claimed in claim 1, wherein stub lengths of the electrical connections through the circuit panel between one of the terminals of the first microelectronic package and a corresponding one of the terminals of the second microelectronic package connected thereto is less than seven times a minimum pitch of the terminals of the first microelectronic package.

20. A microelectronic assembly as claimed in claim 1, wherein at least some of the electrical connections through the circuit panel between the terminals of the first and second microelectronic packages have an electrical length of approximately a thickness of the circuit panel.

21. A microelectronic assembly as claimed in claim 1, wherein the panel contacts include first panel contacts arranged in first and second linearly extending columns exposed at the first surface of the circuit panel, the first panel contacts joined to the terminals of the first microelectronic package, and second panel contacts arranged in first and second linearly extending columns exposed at the second surface of the circuit panel, the second panel contacts joined to the terminals of the second microelectronic package, the first column of the first panel contacts being aligned with the second column of the second panel contacts in x and y orthogonal directions parallel to the first and second circuit panel surfaces, and the second column of the first panel contacts being aligned with the first column of the second panel contacts in the x and y orthogonal directions, and wherein each contact in the first column of the first panel contacts is coupled to a corresponding contact of the first column of the second panel contacts, and each contact in the second column of the first panel contacts is coupled to a corresponding contact in the second column of the second panel contacts.

22. A microelectronic assembly as claimed in claim 1, wherein the terminals of each microelectronic package are arranged in a single column, and wherein the circuit panel includes no more than one routing layer for global routing of all of the address signals.

23. A microelectronic assembly as claimed in claim 1, wherein the terminals of each microelectronic package are arranged in two parallel columns, and wherein the circuit panel includes no more than two routing layers for global routing of all of the address signals.

24. A microelectronic assembly as claimed in claim 1, wherein each microelectronic package includes a buffer element electrically connected to at least some of the respective terminals and one or more of the microelectronic elements in the respective microelectronic package, each buffer element configured to regenerate at least one signal received at one or more of the terminals of the respective microelectronic package.

25. A module including a plurality of microelectronic assemblies according to claim 1, each microelectronic assembly electrically coupled to a second circuit panel for transport of signals to and from each of the microelectronic assemblies.

26. A system comprising a microelectronic assembly according to claim 1 and one or more other electronic components electrically connected to the microelectronic assembly.

27. A system as claimed in claim 26, further comprising a housing, the microelectronic assembly and the one or more other electronic components being assembled with the housing.

28. A microelectronic assembly, comprising:

first and second microelectronic packages, each of the first and second microelectronic packages including:
 a substrate having first and second opposed surfaces and first, second, and third apertures extending between the first and second surfaces, the apertures having first, second, and third axes extending in directions of the lengths of the respective apertures, the first and second axes being parallel to one another, the third axis being transverse to the first and second axes, the second surface having a central region disposed between the first and second axes;
 first, second, and third microelectronic elements each having a surface facing the first surface of the substrate and a plurality of contacts at the surface of the respective microelectronic element aligned with at least one of the apertures, each microelectronic element embodying a greater number of active devices to provide memory storage array function than any other function;
 a plurality of terminals exposed at the second surface in the central region thereof, the terminals configured for connecting the microelectronic package to at least one component external to the microelectronic package; and
 leads electrically connected between the contacts of each microelectronic element and the terminals, each lead having a portion aligned with at least one of the apertures,
 wherein the terminals are configured to carry a majority of address information usable by circuitry within the microelectronic package to determine an addressable memory location from among all the available addressable memory locations of a memory storage array within at least one of the first, second or third microelectronic elements; and
a circuit panel having first and second opposed surfaces and panel contacts exposed at each of the first and second opposed surfaces,
wherein at least some of the terminals of the first and second microelectronic packages are mounted to the panel contacts of the respective first and second surfaces and are electrically connected therethrough.

29. A microelectronic assembly as claimed in claim 28, wherein the terminals of each microelectronic package are configured to carry at least three-quarters of the address information usable by the circuitry within the respective microelectronic package to determine the addressable memory location.

30. A microelectronic assembly, comprising:
  first and second microelectronic packages, each of the first and second microelectronic packages including:
    a substrate having first and second opposed surfaces and first, second, and third apertures extending between the first and second surfaces, a first axis extending in a direction of the lengths of the first and second apertures, the third aperture having a second axis transverse to the first axis and extending in a direction of the length of the third aperture, the second surface having a central region disposed between first and second parallel lines disposed at adjacent ends of the respective first and second apertures;
    first, second, and third microelectronic elements each having a surface facing the first surface of the substrate and a plurality of contacts at the surface of the respective microelectronic element aligned with at least one of the apertures, each microelectronic element embodying a greater number of active devices to provide memory storage array function than any other function;
    a plurality of terminals exposed at the second surface in the central region thereof, the terminals configured for connecting the microelectronic package to at least one component external to the microelectronic package; and
    leads electrically connected between the contacts of each microelectronic element and the terminals, each lead having a portion aligned with at least one of the apertures,
    wherein the terminals are configured to carry sufficient address information usable by circuitry within the microelectronic package to determine an addressable memory location from among all the available addressable memory locations of a memory storage array within at least one of the first, second or third microelectronic elements; and
  a circuit panel having first and second opposed surfaces and panel contacts exposed at each of the first and second opposed surfaces,
  wherein at least some of the terminals of the first and second microelectronic packages are mounted to the panel contacts of the respective first and second surfaces and are electrically connected therethrough.

* * * * *